United States Patent
Ueda

(10) Patent No.: US 10,920,034 B2
(45) Date of Patent: Feb. 16, 2021

(54) RESIN COMPOSITION AND USE THEREOF

(71) Applicant: Sumitomo Chemical Company, Limited, Tokyo (JP)

(72) Inventor: Kohei Ueda, Ichihara (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 16/309,682

(22) PCT Filed: Jun. 13, 2017

(86) PCT No.: PCT/JP2017/021844
§ 371 (c)(1),
(2) Date: Dec. 13, 2018

(87) PCT Pub. No.: WO2017/217418
PCT Pub. Date: Dec. 21, 2017

(65) Prior Publication Data
US 2019/0211178 A1    Jul. 11, 2019

(30) Foreign Application Priority Data

Jun. 15, 2016 (JP) .............................. JP2016-119206

(51) Int. Cl.
| | | |
|---|---|---|
| *C08K 3/00* | (2018.01) | |
| *C08K 3/04* | (2006.01) | |
| *C08F 210/02* | (2006.01) | |
| *C08J 3/24* | (2006.01) | |
| *C08L 23/08* | (2006.01) | |
| *C08L 23/12* | (2006.01) | |
| *C08L 101/12* | (2006.01) | |
| *B32B 27/20* | (2006.01) | |
| *B32B 27/08* | (2006.01) | |

(52) U.S. Cl.
CPC .............. *C08K 3/042* (2017.05); *B32B 27/08* (2013.01); *B32B 27/20* (2013.01); *C08F 210/02* (2013.01); *C08J 3/24* (2013.01); *C08K 3/00* (2013.01); *C08K 3/04* (2013.01); *C08L 23/08* (2013.01); *C08L 23/12* (2013.01); *C08L 101/12* (2013.01); *B32B 2307/302* (2013.01); *B32B 2457/00* (2013.01); *C08J 2323/12* (2013.01); *C08K 2201/001* (2013.01)

(58) Field of Classification Search
CPC .. C08K 3/042; C08K 3/00; C08K 3/04; C08F 210/02; C08J 3/24; C08L 23/08; C08L 23/12; C08L 101/12
USPC ........................................................ 524/847
See application file for complete search history.

(56) References Cited

U.S. PATENT DOCUMENTS

| | | | | |
|---|---|---|---|---|
| 8,587,945 B1 * | 11/2013 | Hartmann | .............. | H05K 3/284 361/708 |
| 2007/0197731 A1 | 8/2007 | Kondo | | |
| 2014/0043754 A1 * | 2/2014 | Hartmann | ............... | H01L 23/42 361/679.54 |
| 2016/0326331 A1 | 11/2016 | Hamajima et al. | | |
| 2017/0088761 A1 * | 3/2017 | Miura | ...................... | C09K 5/14 |
| 2017/0121516 A1 * | 5/2017 | Kawashima | ............ | C08L 23/24 |
| 2018/0030175 A1 | 2/2018 | Miura et al. | | |

FOREIGN PATENT DOCUMENTS

| | | | | | |
|---|---|---|---|---|---|
| CN | 1551826 | A | | 12/2004 | |
| CN | 101024710 | A | | 8/2007 | |
| CN | 105050805 | A | | 11/2015 | |
| JP | 2008214535 | A | * | 9/2008 | |
| JP | 2008214535 | A | | 9/2008 | |
| JP | 2010070412 | A | | 4/2010 | |
| JP | 2015091903 | A | * | 5/2015 | |
| JP | 2015091903 | A | | 5/2015 | |
| WO | 2015099086 | A1 | | 7/2015 | |
| WO | 2015141866 | A1 | | 9/2015 | |
| WO | WO-2015141866 | A1 | * | 9/2015 | ............. C08L 29/04 |
| WO | 2015156416 | A1 | | 10/2015 | |
| WO | WO-2015156416 | A1 | * | 10/2015 | ............... C08J 9/04 |
| WO | 2016098674 | A1 | | 6/2016 | |

* cited by examiner

*Primary Examiner* — Kelechi C Egwim
(74) *Attorney, Agent, or Firm* — Panitch Schwarze Belisario & Nadel LLP

(57) ABSTRACT

Provided is a resin composition from which a heat dissipation sheet having high effect to suppress temperature elevation due to heat generated by electronic parts (elements) can be obtained. Specifically provided is a resin composition containing: a polymer (1) whose enthalpy of fusion observed within a temperature range of 10° C. or higher and lower than 60° C. in differential scanning calorimetry is 30 J/g or more; and a thermally conductive material (3) whose thermal conductivity is 1 W/(m·K) or higher, wherein the content of the thermally conductive material (3) is 1 part by weight or more and 80 parts by weight or less, with respect to 100 parts by weight of the total amount of polymer components contained in the resin composition.

10 Claims, 1 Drawing Sheet

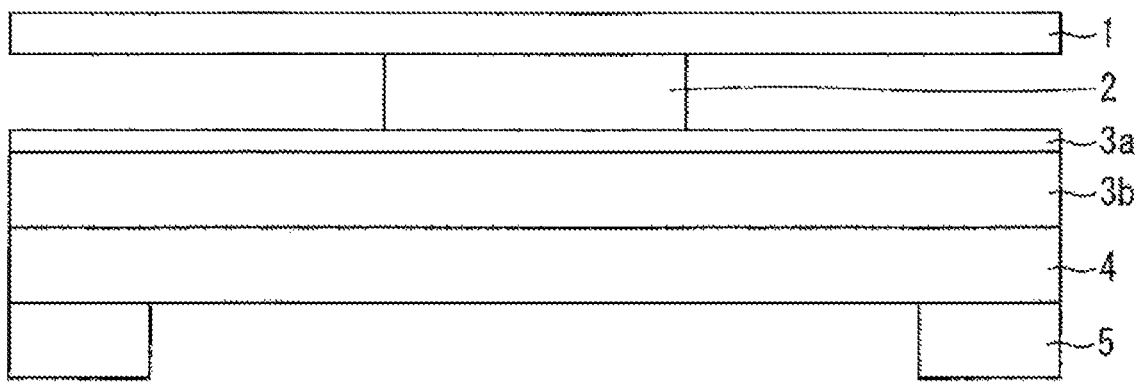

RESIN COMPOSITION AND USE THEREOF

CROSS-REFERENCE TO RELATED APPLICATION

This application is a Section 371 of International Application No. PCT/JP2017/021844, filed Jun. 13, 2017, which was published in the Japanese language on Dec. 21, 2017 under International Publication No. WO 2017/217418 A1, and claims priority under 35 U.S.C. § 119(b) to Japanese Application No. 2016-119206, filed Jun. 15, 2016, the disclosures of which are incorporated herein by reference in their entirety.

TECHNICAL FIELD

The present invention relates to a novel resin composition containing a thermally conductive material, and use thereof.

BACKGROUND ART

The emergence of electronic parts with high performance and high density due to recent requirements of higher performance, downsizing, and thinning for electronic devices typified by smartphones and personal computers has led to significant increase of heat generation, and suppression of temperature elevation in electronic devices or electronic parts has become an important issue.

To release heat generated in electronic parts (elements) in such electronic devices to the outside, heat dissipation sheets such as graphite sheets are used (e.g., Patent Literature 1).

CITATION LIST

Patent Literature

Patent Literature 1: Japanese Unexamined Patent Publication No. 2010-70412

SUMMARY OF INVENTION

Technical Problem

However, conventional heat dissipation sheets have insufficient effect to suppress temperature elevation due to heat generated by electronic parts (elements).

The present invention was made in view of the problem, and an object of the present invention is to provide a resin composition from which a heat dissipation sheet having high effect to suppress temperature elevation due to heat generated by electronic parts (elements) can be obtained.

Solution to Problem

To solve the above problem, the present invention provides any of the followings.

1) A resin composition comprising:
a polymer (1) whose enthalpy of fusion observed within a temperature range of 10° C. or higher and lower than 60° C. in differential scanning calorimetry is 30 J/g or more; and
a thermally conductive material (3) whose thermal conductivity is 1 W/(m·K) or higher, wherein
a content of the thermally conductive material (3) is 1 part by weight or more and 80 parts by weight or less, with respect to 100 parts by weight of the total amount of polymer components contained in the resin composition.

2) The resin composition according to 1), wherein
the resin composition further comprises a polymer (2) whose melting peak temperature or glass transition temperature observed in differential scanning calorimetry is 50° C. or higher and 180° C. or lower, provided that the polymer (2) is different from the polymer (1), and
a content of the polymer (1) is 30 wt % or more and 99 wt % or less and a content of the polymer (2) is 1 wt % or more and 70 wt % or less, with respect to 100 wt % of the total amount of the polymer (1) and the polymer (2).

3) The resin composition according to 1) or 2), wherein the polymer (1) is a polymer comprising a constitutional unit (B) represented by the following formula (1):

[Chemical Formula 1]

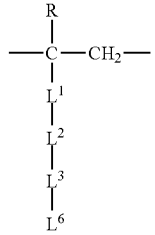

formula (1)

wherein
R represents a hydrogen atom or a methyl group;
$L^1$ represents a single bond, —CO—O—, —O—CO—, or —O—;
$L^2$ represents a single bond, —$CH_2$—, —$CH_2$—$CH_2$—, —$CH_2$—$CH_2$—$CH_2$—, —$CH_2$—CH(OH)$CH_2$—, or —$CH_2$—, or —CH—CH($CH_2$OH)—;
$L^3$ represents a single bond, —CO—O—, —O—CO—, —O—, —CO—NH—, —NH—CO—, —CO—NH—CO—, —NH—CO—NH—, —NH—, or —N($CH_3$)—;
$L^6$ represents an alkyl group having 14 or more and 30 or less carbon atoms; and
a left side and a right side of each of the horizontal chemical formulas for describing chemical structures of $L^1$, $L^2$, and $L^3$ correspond to an upper side of the formula (1) and a lower side of the formula (1), respectively.

4) The resin composition according to any one of 1) to 3), wherein
the polymer (1) comprises a constitutional unit (A) derived from ethylene and a constitutional unit (B) represented by the following formula (1), and optionally comprises at least one constitutional unit (C) selected from the group consisting of a constitutional unit represented by the following formula (2) and a constitutional unit represented by the following formula (3);
a proportion of the number of the constitutional unit (A) is 70% or more and 99% or less and a proportion of the number of the constitutional unit (B) and the constitutional unit (C) in total is 1% or more and 30% or less, with respect to 100% of the total number of the constitutional unit (A), the constitutional unit (B) and the constitutional unit (C); and
a proportion of the number of the constitutional unit (B) is 1% or more and 100% or less and a proportion of the number of the constitutional unit (C) is 0% or more and 99% or less, with respect to 100% of the total number of the constitutional unit (B) and the constitutional unit (C):

[Chemical Formula 2]

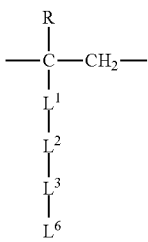

formula (1)

wherein

R represents a hydrogen atom or a methyl group;

$L^1$ represents a single bond, —CO—O—, —O—CO—, or —O—;

$L^2$ represents a single bond, —$CH_2$—, —$CH_2$—$CH_2$—, —$CH_2$—$CH_2$—$CH_2$—, —$CH_2$—CH(OH)—$CH_2$—, or —$CH_2$—CH($CH_2$OH)—;

$L^3$ represents a single bond, —CO—O—, —O—CO—, —O—, —CO—NH—, —NH—CO—, —CO—NH—CO—, —NH—CO—NH—, —NH—, or —N($CH_3$)—;

$L^6$ represents an alkyl group having 14 or more and 30 or less carbon atoms; and a left side and a right side of each of the horizontal chemical formulas for describing chemical structures of $L^1$, $L^2$, and $L^3$ correspond to an upper side of the formula (1) and a lower side of the formula (1), respectively,

[Chemical Formula 3]

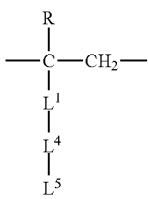

formula (2)

wherein

R represents a hydrogen atom or a methyl group;

$L^1$ represents a single bond, —CO—O—, —O—CO—, or —O—;

$L^4$ represents an alkylene group having one or more and eight or less carbon atoms;

$L^5$ represents a hydrogen atom, an epoxy group, —CH(OH)—$CH_2$OH, a carboxy group, a hydroxy group, an amino group, or an alkylamino group having one or more and four or less carbon atoms; and a left side and a right side of each of the horizontal chemical formulas for describing a chemical structure of $L^1$ correspond to an upper side of the formula (2) and a lower side of the formula (2), respectively,

[Chemical Formula 4]

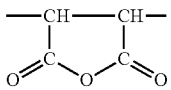

formula (3)

5) The resin composition according to 4), wherein a proportion of the number of the constitutional unit (A), the constitutional unit (B) and the constitutional unit (C) in total in the polymer is 90% or more, with respect to 100% of the total number of all constitutional units contained in the polymer (1).

6) The resin composition according to any one of 1) to 5), wherein a ratio defined for the polymer (1) as the following formula (I), A, is 0.95 or lower:

$$A = \alpha_1/\alpha_0 \quad (1)$$

wherein $\alpha_1$ represents a value obtained by using a method comprising: measuring an absolute molecular weight and an intrinsic viscosity of a polymer by using gel permeation chromatography with an apparatus equipped with a light scattering detector and a viscosity detector, plotting measurements in such a manner that logarithms of the absolute molecular weight are plotted on an abscissa and logarithms of the intrinsic viscosity are plotted on an ordinate; and performing least squares approximation for the logarithms of the absolute molecular weight and the logarithms of the intrinsic viscosity by using the formula (I-I) within a range of not less than a logarithm of a weight-average molecular weight of the polymer and not more than a logarithm of a z-average molecular weight of the polymer along the abscissa to derive a slope of a line representing the formula (I-I) as $\alpha_1$:

$$\log[\eta_1] = \alpha_1 \log M_1 + \log K_1 \quad (I\text{-}I)$$

wherein $[\eta_1]$ represents an intrinsic viscosity (unit: dl/g) of the polymer, $M_1$ represents an absolute molecular weight of the polymer, and $K_1$ represents a constant.

In the formula (I), $\alpha_0$ represents a value obtained by using a method comprising: measuring an absolute molecular weight and an intrinsic viscosity of Polyethylene Standard Reference Material 1475a produced by National Institute of Standards and Technology by using gel permeation chromatography with an apparatus equipped with a light scattering detector and a viscosity detector, plotting measurements in such a manner that logarithms of the absolute molecular weight are plotted on an abscissa and logarithms of the intrinsic viscosity are plotted on an ordinate; and performing least squares approximation for the logarithms of the absolute molecular weight and the logarithms of the intrinsic viscosity by using the formula (1-II) within a range of not less than a logarithm of a weight-average molecular weight of the Polyethylene Standard Reference Material 1475a and not more than a logarithm of a z-average molecular weight of the Polyethylene Standard Reference Material 1475a along the abscissa to derive a slope of a line representing the formula (I-I) as to:

$$\log[\eta_0] = \alpha_0 \log M_0 + \log K_0 \quad (I\text{-}II)$$

wherein $[\eta_0]$ represents an intrinsic viscosity (unit: dl/g) of the Polyethylene Standard Reference Material 1475a, $M_0$ represents an absolute molecular weight of the Polyethylene Standard Reference Material 1475a, and $K_0$ represents a constant, provided that in the measurement of the absolute molecular weight and the intrinsic viscosity of each of the polymer and the Polyethylene Standard Reference Material 1475a by using gel permeation chromatography, a mobile phase is ortho-dichlorobenzene and the measurement temperature is 155° C.

7) The resin composition according to any one of 1) to 6), wherein the polymer (1) is a crosslinked polymer.
8) The resin composition according to any one of 1) to 7), wherein a gel fraction is 20 wt % or more, with respect to 100 wt % of a weight of the resin composition.
9) The resin composition according to any one of 1) to 8), wherein the thermally conductive material (3) is graphite.
10) A molded article comprising the resin composition according to any one of 1) to 9).
11) A laminate comprising:
a heat storage layer (1) comprising the resin composition according to any one of 1) to 9); and
a thermally conductive layer (2) containing a thermally conductive material (3) whose thermal conductivity is 1 W/(m·K) or higher in an amount of 90 wt % or more, with respect to 100 wt % of the total weight of the thermally conductive layer (2).

Advantageous Effects of Invention

The present invention can provide a resin composition from which a heat dissipation sheet having high effect to suppress temperature elevation due to heat generated by electronic parts (elements) can be obtained.

BRIEF DESCRIPTION OF DRAWING

FIG. 1 shows a schematic diagram of the system of an experiment in Examples.

DESCRIPTION OF EMBODIMENTS

[Resin Composition]
The resin composition according to one mode of the present invention is a resin composition comprising: a polymer (1) having an enthalpy of fusion of 30 J/g or more observed in a temperature range of 10° C. or higher and lower than 60° C. in differential scanning calorimetry; and a thermally conductive material (3) having a thermal conductivity of 1 W/(m·K) or higher, wherein the content of the thermally conductive material (3) is 1 part by weight or more and 80 parts by weight or less with respect to 100 parts by weight of the total amount of polymer components contained in the resin composition. Hereinafter, enthalpy of fusion is occasionally expressed as ΔH.

<Polymer (1)>
The polymer (1) comprised in the resin composition according to the present invention is a polymer having an enthalpy of fusion of 30 J/g or more observed in a temperature range of 10° C. or higher and lower than 60° C. in differential scanning calorimetry. The ΔH observed in a temperature range of 10° C. or higher and lower than 60° C. is preferably 50 J/g or more, and more preferably 70 J/g or more. The ΔH is typically 200 J/g or less.

The term "enthalpy of fusion" as used herein refers to heat of fusion obtained through analysis of a part in a temperature range of 10° C. or higher and lower than 60° C. in a melting curve acquired in differential scanning calorimetry as in the following by using a method in accordance with JIS K7122-1987. The ΔH can be controlled in the above range through adjustment of the proportion of the number of a constitutional unit (B) described later in the polymer (1) and the number of carbon atoms of $L^6$ in a formula (1) described later for a constitutional unit (B) described later.

[Method of Differential Scanning Calorimetry]
In a differential scanning calorimeter under nitrogen atmosphere, an aluminum pan encapsulating approximately 5 mg of a sample therein is (1) retained at 150° C. for 5 minutes, and then (2) cooled from 150° C. to −50° C. at a rate of 5° C./min, and then (3) retained at −50° C. for 5 minutes, and then (4) warmed from −50° C. to 150° C. at a rate of 5° C./min. A differential scanning calorimetry curve acquired in the calorimetry of the process (4) is defined as a melting curve.

The melting peak temperature of the polymer (1) is preferably 10° C. or higher and 60° C. or lower.

Herein, the melting peak temperature of a polymer is a temperature at a melting peak top determined through analysis of a melting curve acquired in the above differential scanning calorimetry by using a method in accordance with JIS K7121-1987, and a temperature at which heat of fusion absorbed is maximized. In the case that a plurality of melting peaks as defined in JIS K7121-1987 is present in the melting curve, a temperature at a melting peak top with the maximum heat of fusion absorbed is defined as melting peak temperature.

The melting peak temperature of the polymer (1) can be adjusted through adjustment of the proportion of the number of a constitutional unit (B) described later in the polymer (1) and the number of carbon atoms of $L^6$ in a formula (1) described later for a constitutional unit (B) described later. Thereby, the heat storage performance and so forth of the resin composition containing the polymer (1) can be adjusted.

Examples of the polymer (1) include, as one mode, a polymer including a constitutional unit including an alkyl group having 14 or more and 30 or less carbon atoms.

It is preferable that the polymer (1) be a polymer including a constitutional unit (B) represented by the following formula (1).

[Chemical Formula 5]

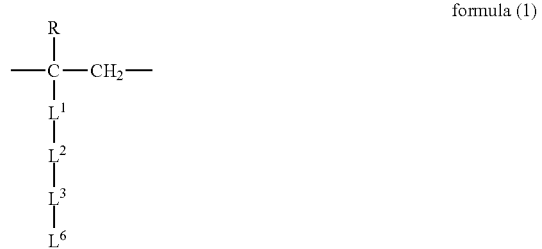

formula (1)

In the formula (1),
R represents a hydrogen atom or a methyl group;
$L^1$ represents a single bond, —CO—O—, —O—CO—, or —O—;
$L^2$ represents a single bond, —CH$_2$—, —CH$_2$—CH$_2$—, —CH$_2$—CH$_2$—CH$_2$—, —CH$_2$—CH(OH)—CH$_2$—, or —CH$_2$—CH(CH$_2$OH)—;
$L^3$ represents a single bond, —CO—O—, —O—CO—, —O—, —CO—NH—, —NH—CO—, —CO—NH—CO—, —NH—CO—NH—, —NH—, or —N(CH$_3$)—;
$L^6$ represents an alkyl group having 14 or more and 30 or less carbon atoms; and
the left side and right side of each of the horizontal chemical formulas for describing the chemical structures of $L^1$, $L^2$, and $L^3$ correspond to the upper side of the formula (1) and the lower side of the formula (1), respectively.

R is preferably a hydrogen atom.
$L^1$ is preferably —CO—O—, —O—CO—, or —O—, more preferably —CO—O— or —O—CO—, and even more preferably —CO—O—.

$L^2$ is preferably a single bond, —CH$_2$—, —CH$_2$—CH$_2$—, or —CH$_2$—CH$_2$—CH$_2$—, and more preferably a single bond.

$L^3$ is preferably a single bond, —O—CO—, —O—, —NH—, or —N(CH$_3$)—, and more preferably a single bond.

$L^6$ in the formula (1) is an alkyl group having 14 or more and 30 or less carbon atoms for imparting good formability to the polymer (1) and resin composition comprising the polymer (1). Examples of the alkyl group having 14 or more and 30 or less carbon atoms include linear alkyl groups having 14 or more and 30 or less carbon atoms and branched alkyl groups having 14 or more and 30 or less carbon atoms. $L^6$ is preferably a linear alkyl group having 14 or more and 30 or less carbon atoms, more preferably a linear alkyl group having 14 or more and 24 or less carbon atoms, and even more preferably a linear alkyl group having 16 or more and 22 or less carbon atoms.

Examples of the linear alkyl group having 14 or more and 30 or less carbon atoms include an n-tetradecyl group, an n-pentadecyl group, an n-hexadecyl group, an n-heptadecyl group, an n-octadecyl group, an n-nonadecyl group, an n-eicosyl group, an n-heneicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, and an n-triacontyl group.

Examples of the branched alkyl group having 14 or more and 30 or less carbon atoms include an isotetradecyl group, an isopentadecyl group, an isohexadecyl group, an isoheptadecyl group, an isooctadecyl group, an isononadecyl group, an isoeicosyl group, an isoheneicosyl group, an isodocosyl group, an isotricosyl group, an isotetracosyl group, an isopentacosyl group, an isohexacosyl group, an isoheptacosyl group, an isooctacosyl group, an isononacosyl group, and an isotriacontyl group.

Examples of combination of R, $L^1$, $L^2$, and $L^3$ in the formula (1) include the followings.

[Chemical Formula 6]

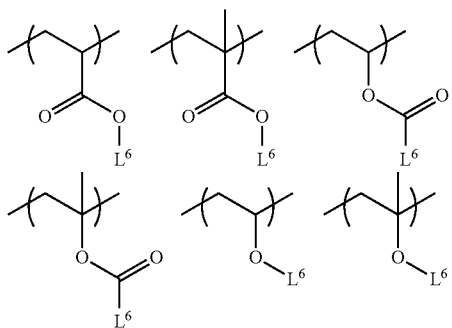

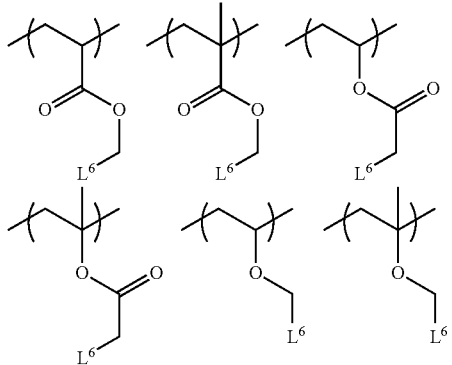

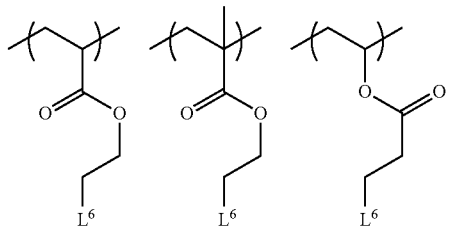

-continued

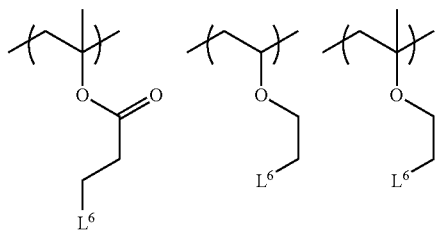

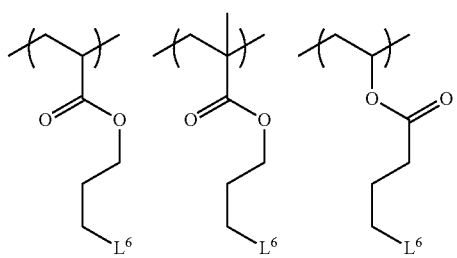

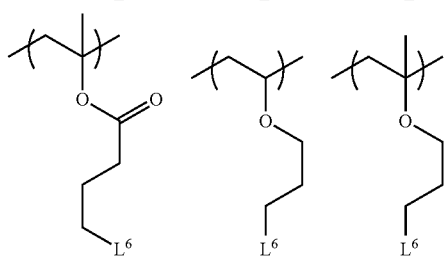

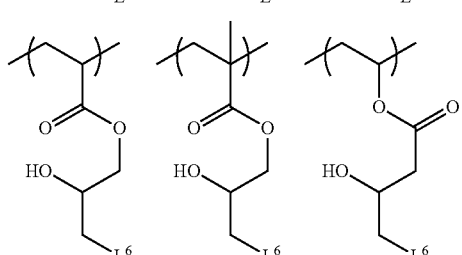

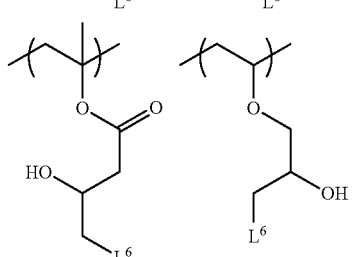

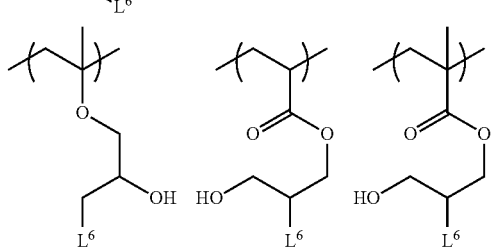

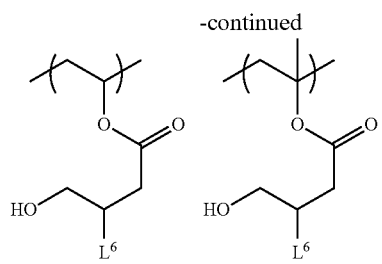
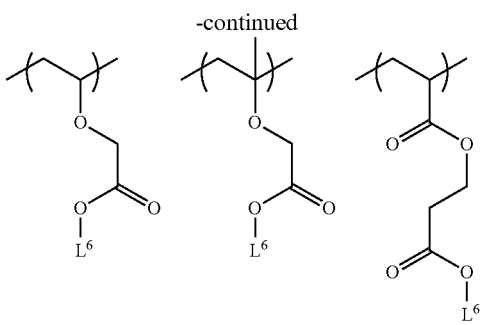
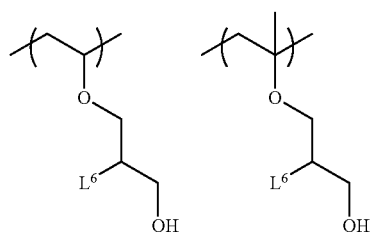
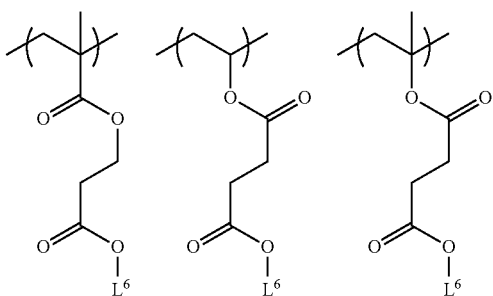
[Chemical Formula 7]
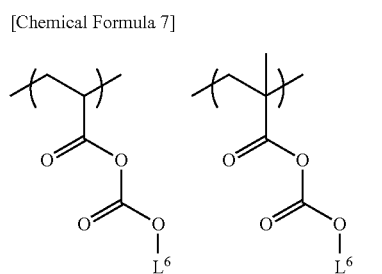
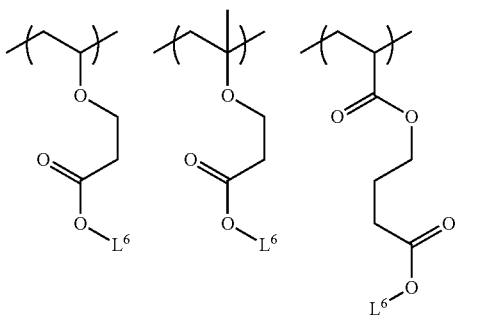
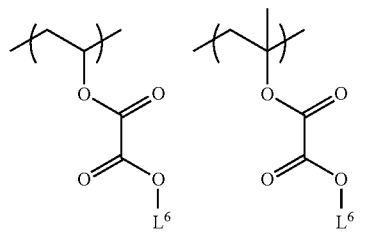
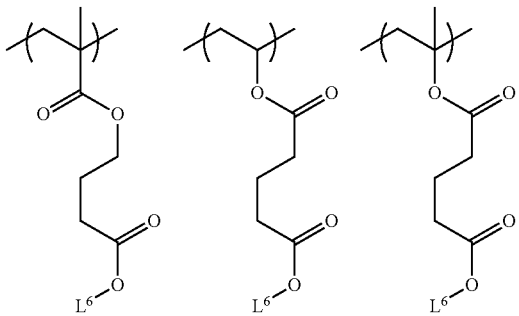
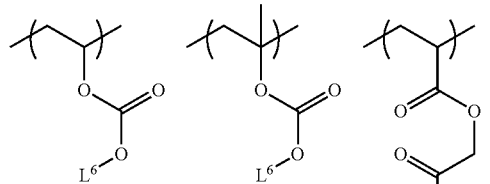
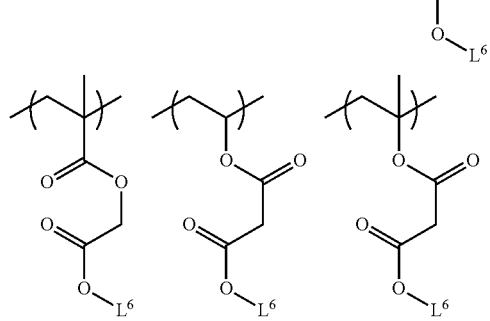
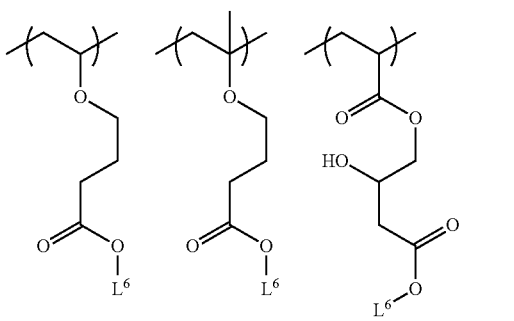

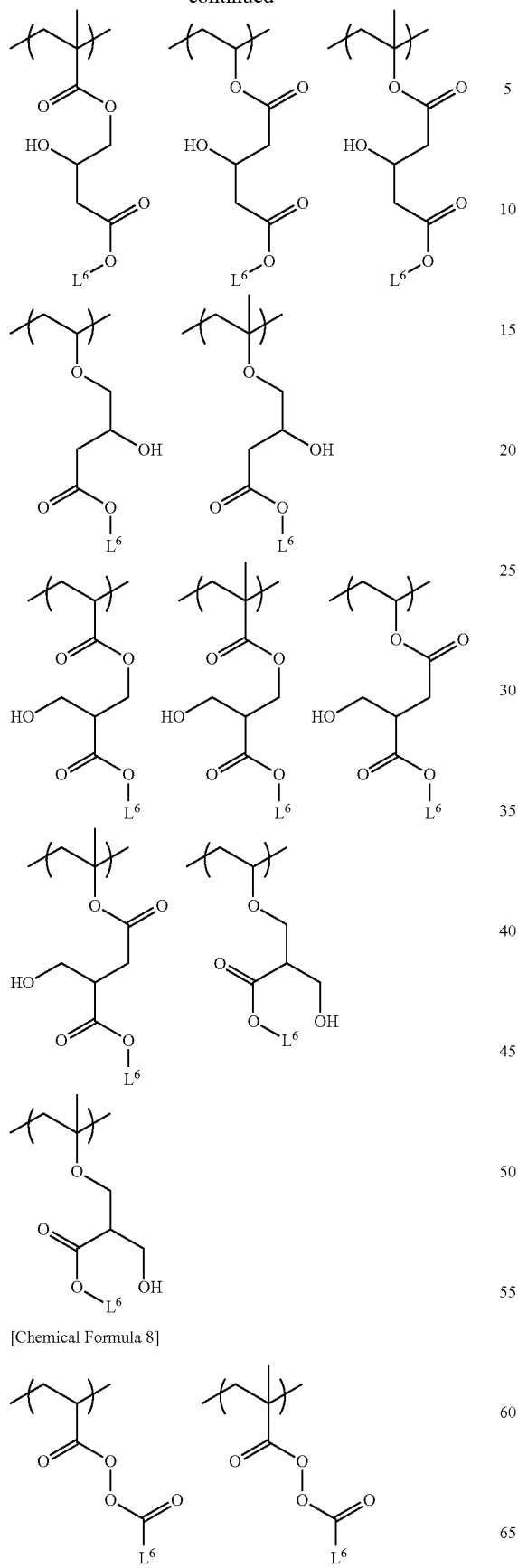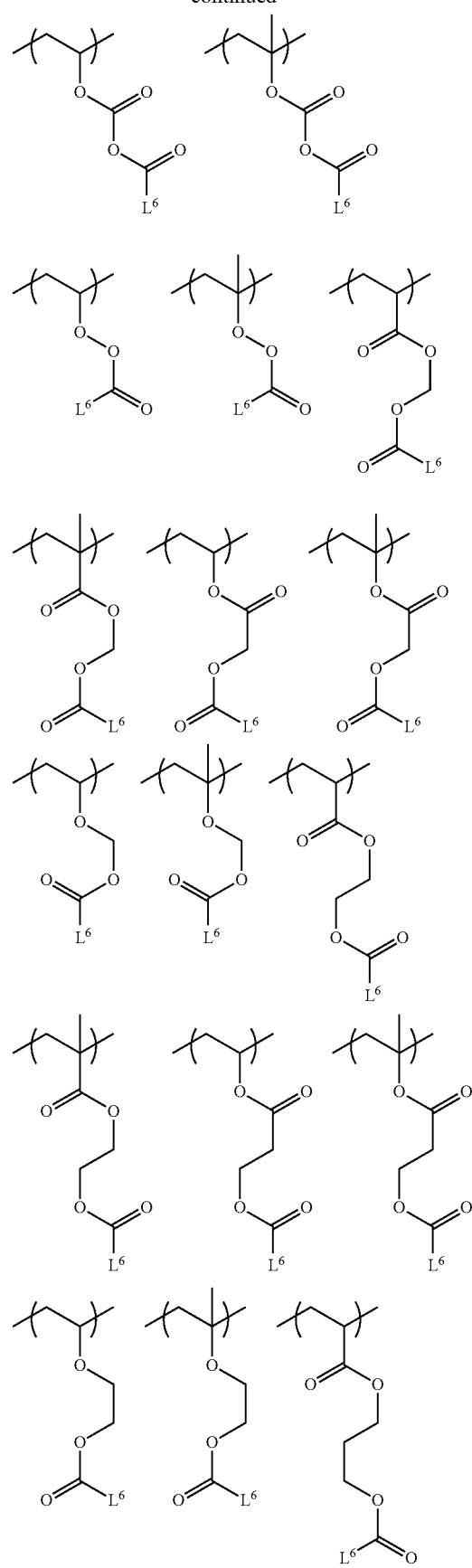

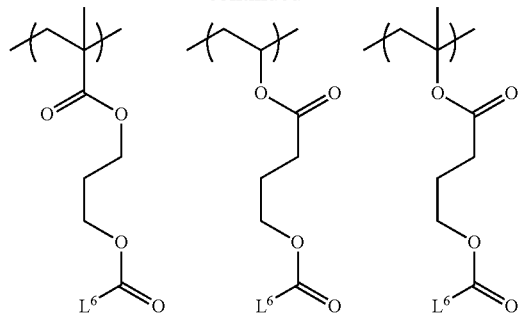
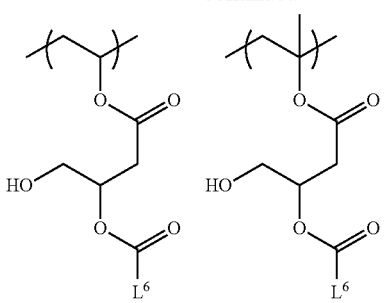
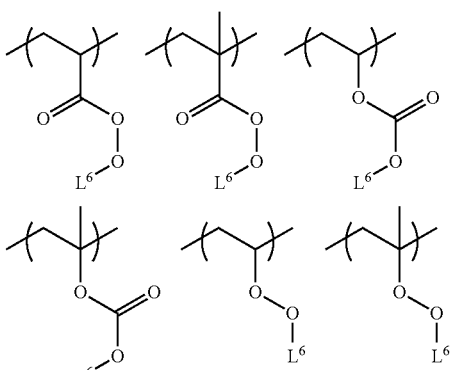
[Chemical Formula 9]
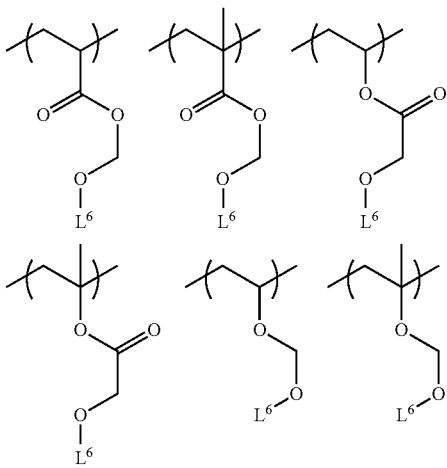
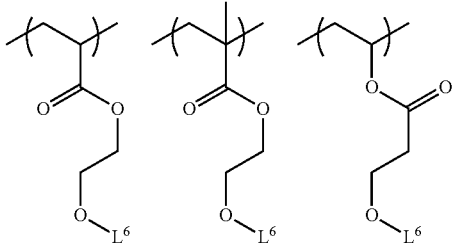

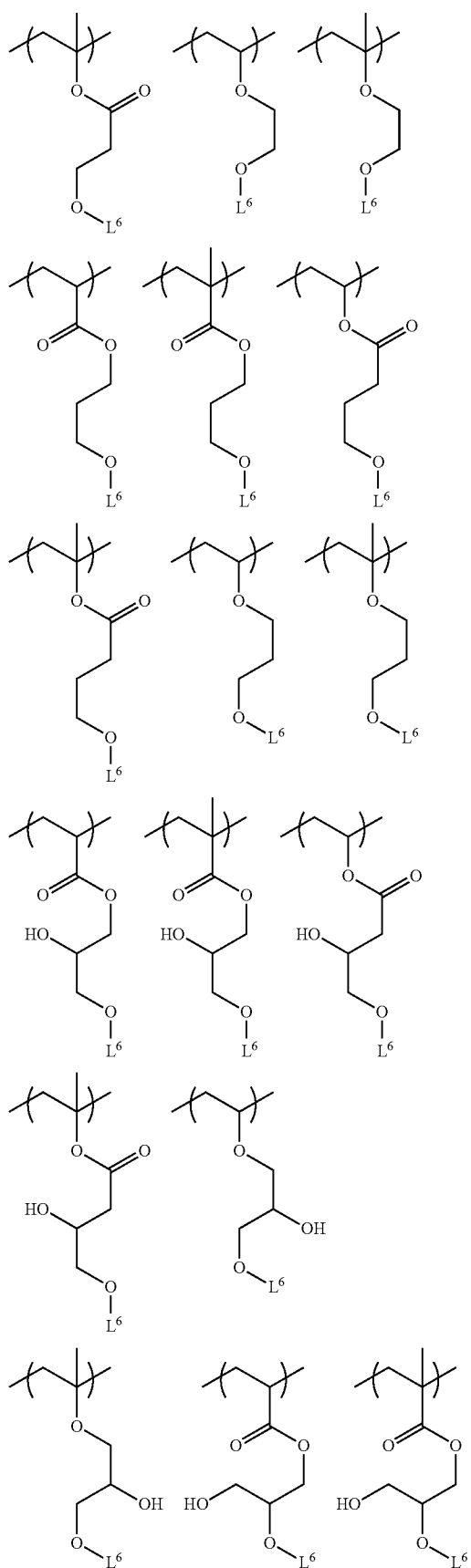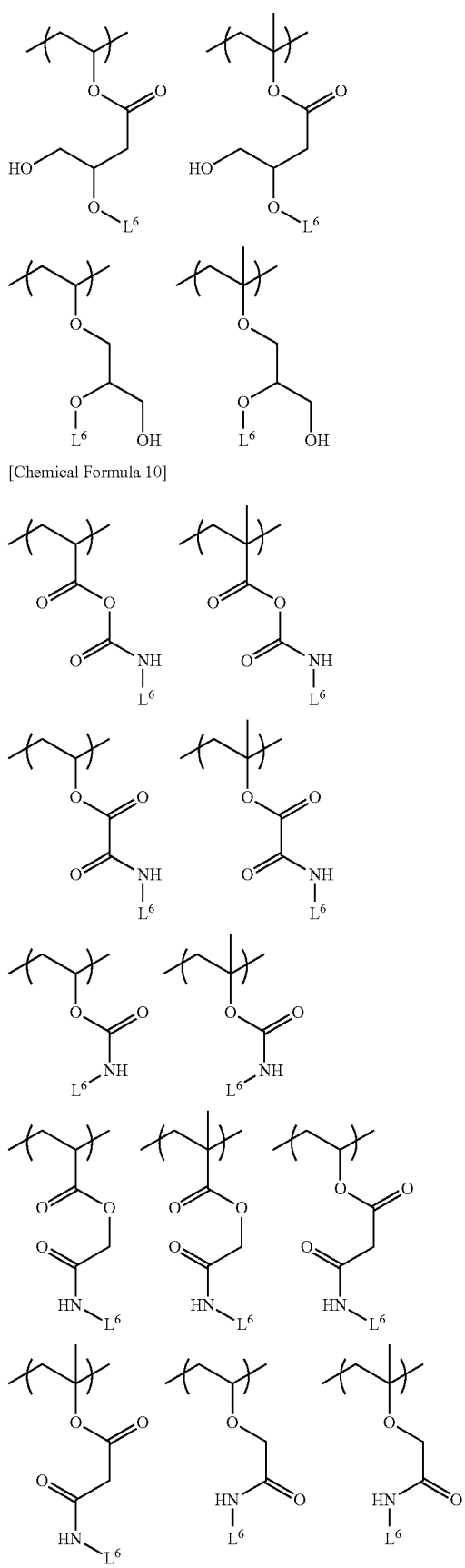
[Chemical Formula 10]

-continued
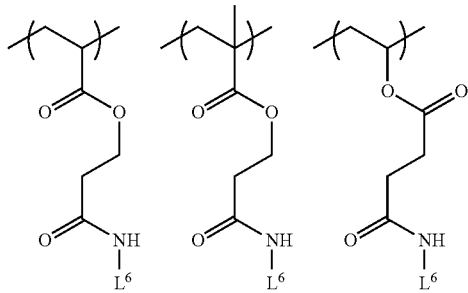
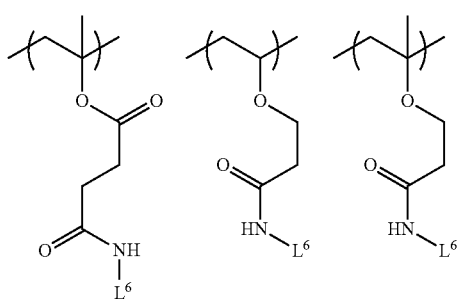
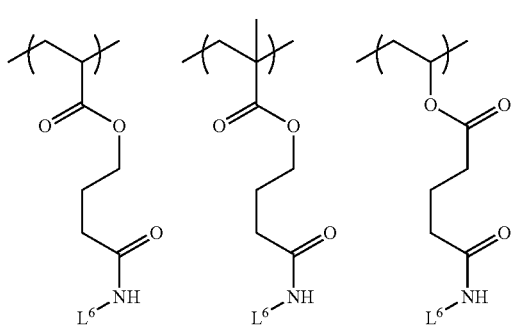
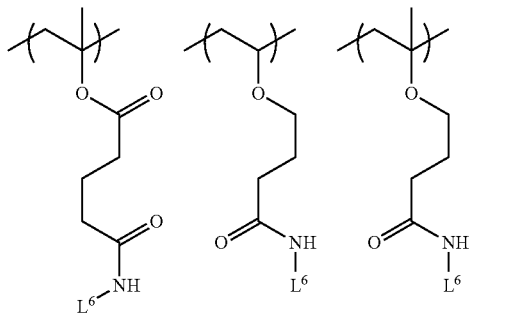
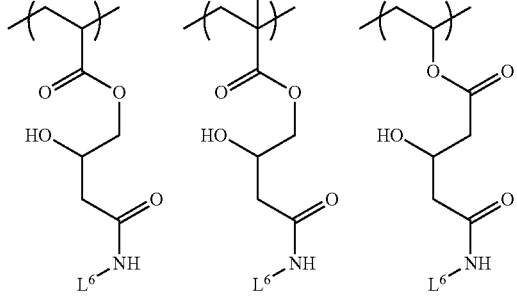
-continued
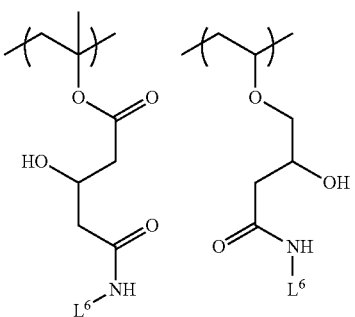
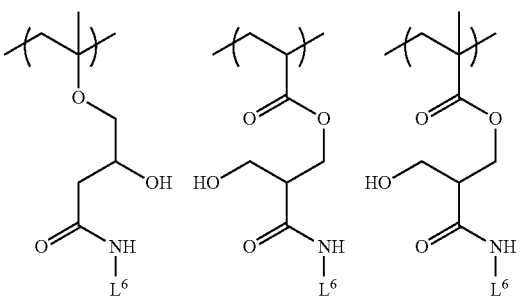
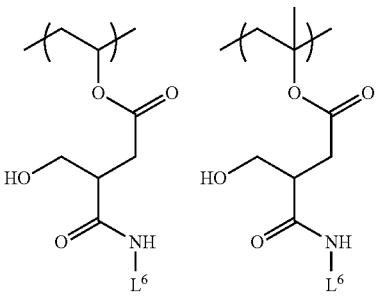
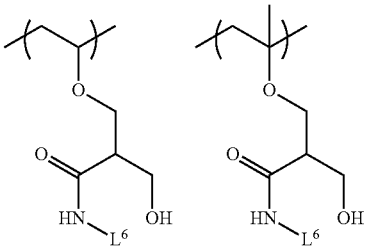
[Chemical Formula 11]
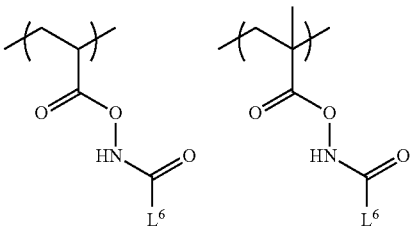
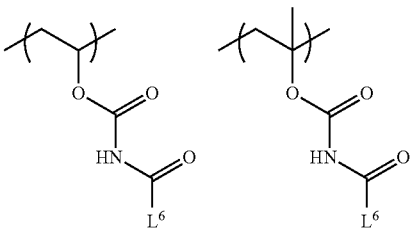

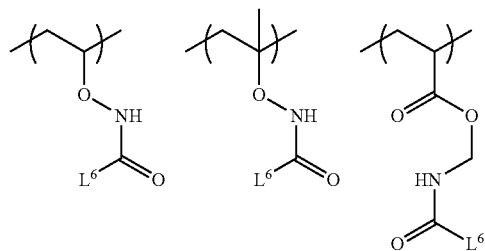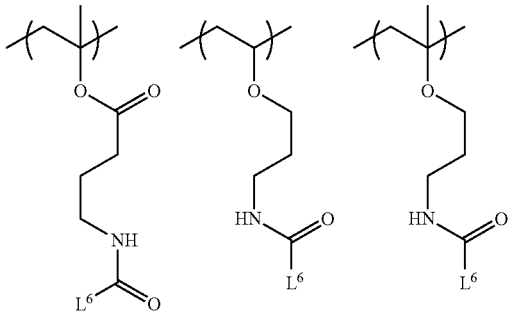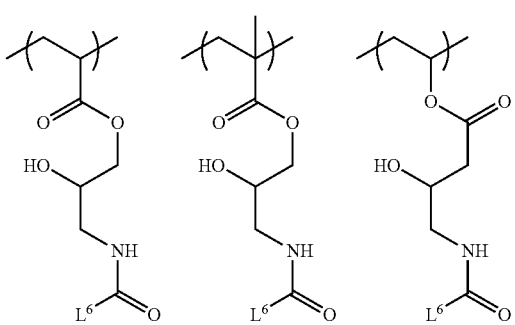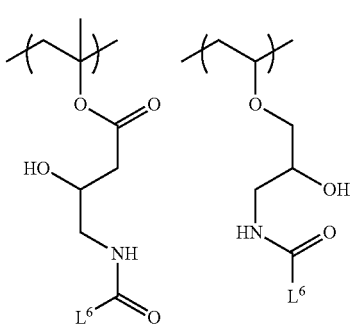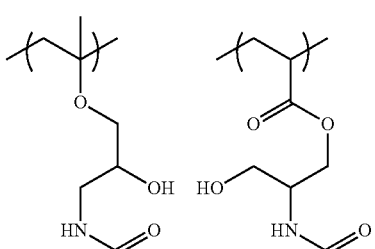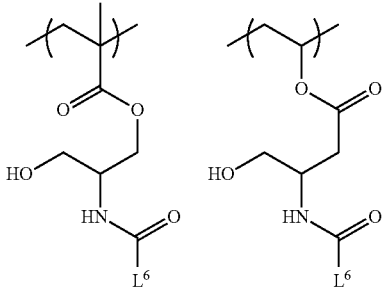

[Chemical Formula 12]

-continued
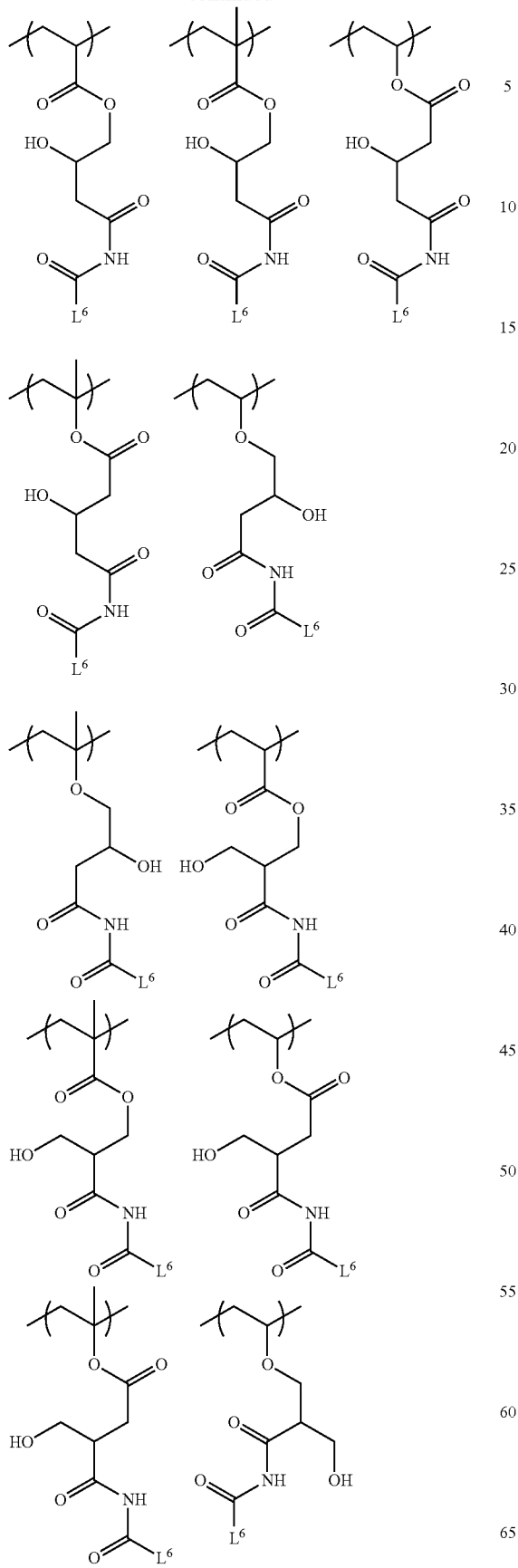
[Chemical Formula 13]
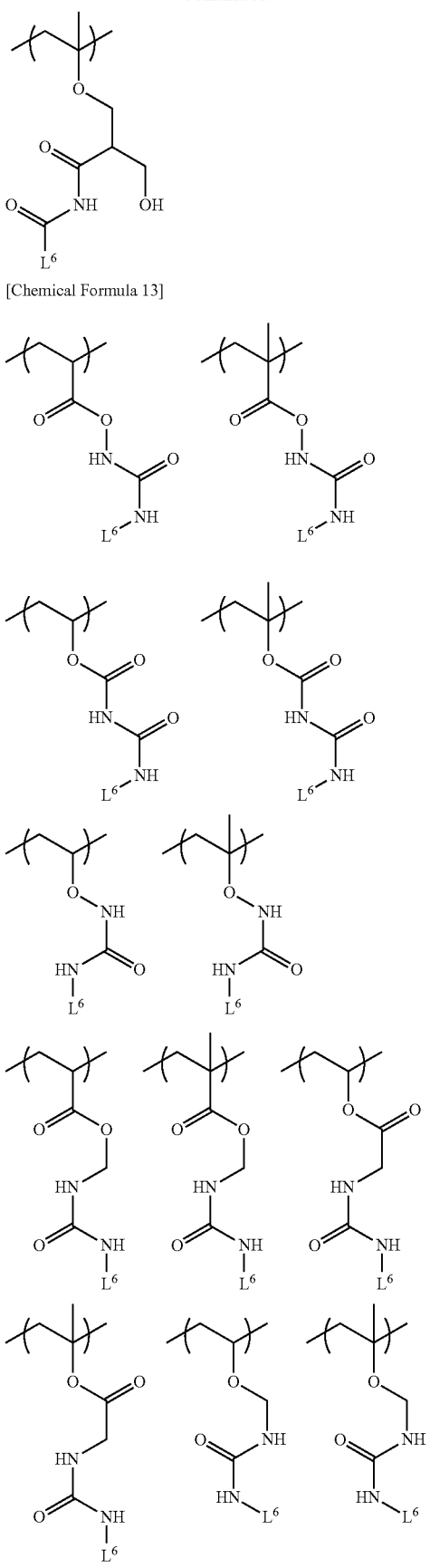

-continued
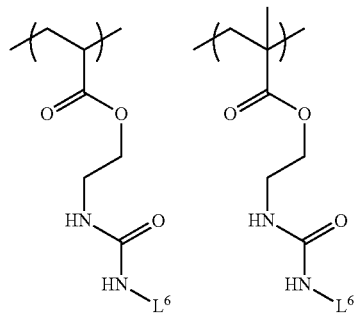
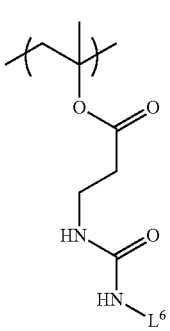
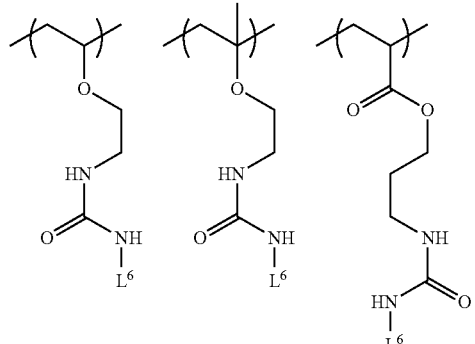
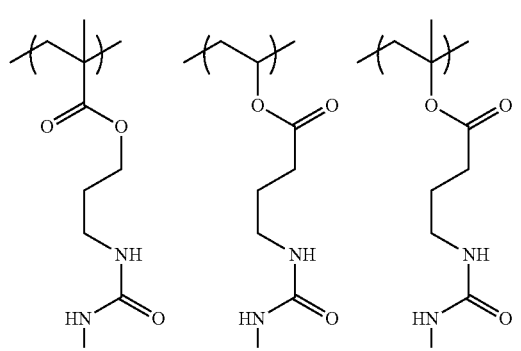
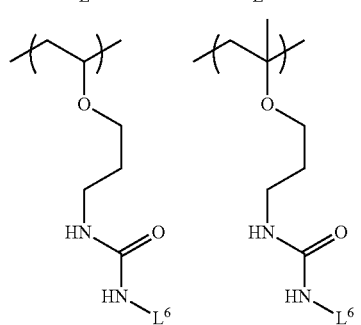
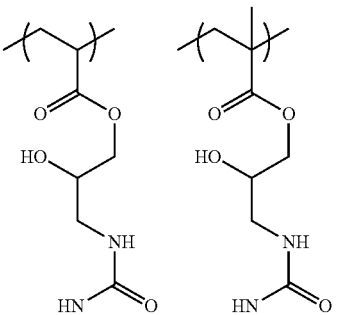
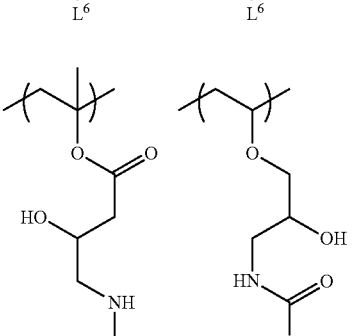
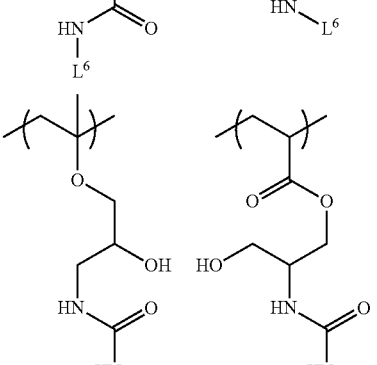
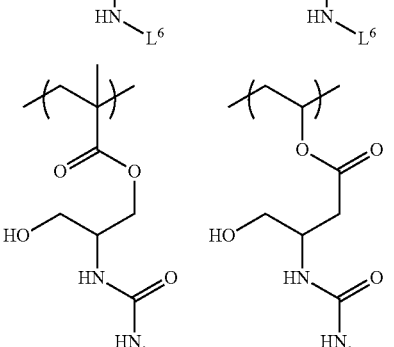
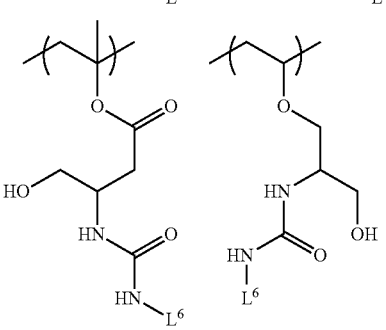

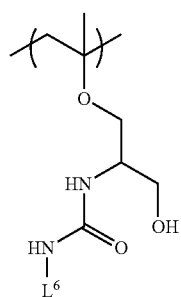
[Chemical Formula 14]
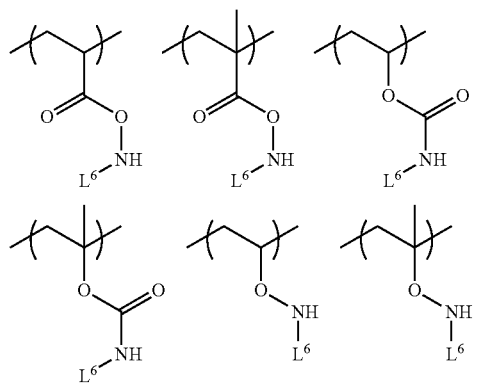
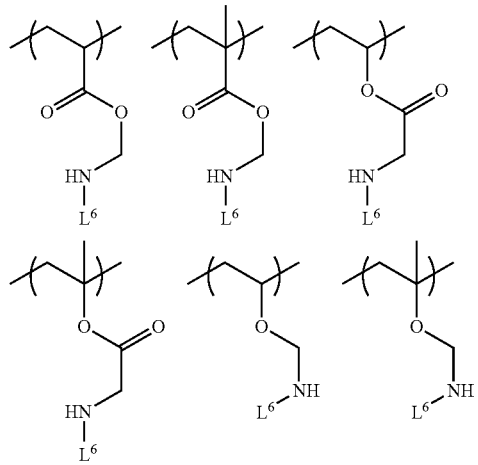
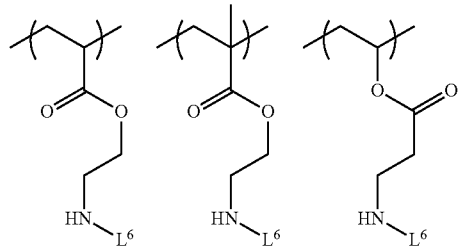
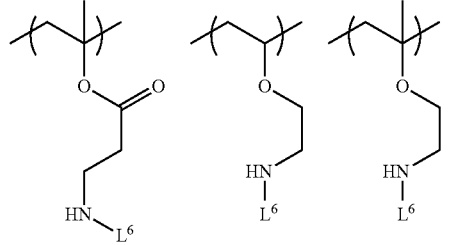
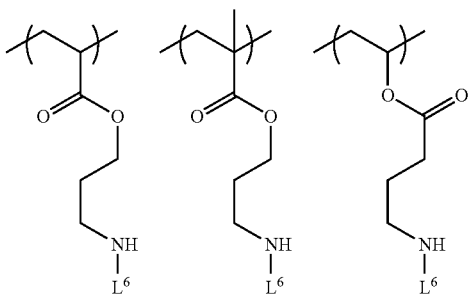
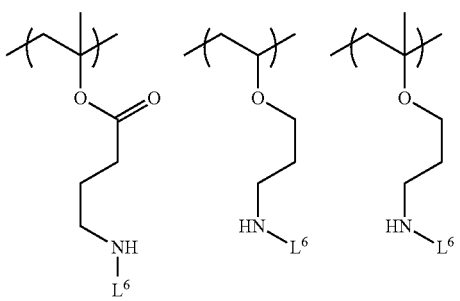
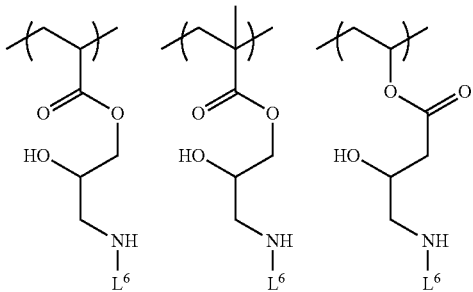
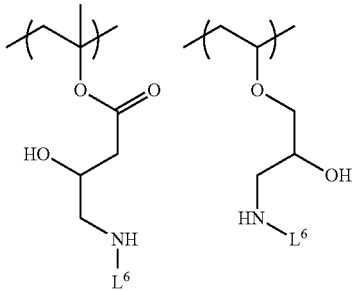
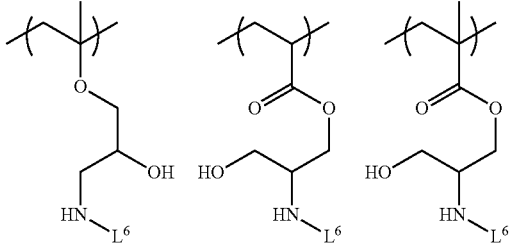
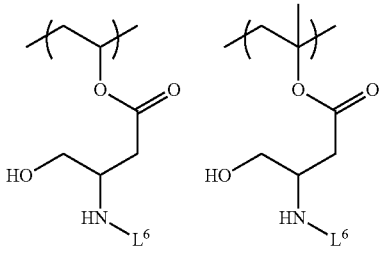

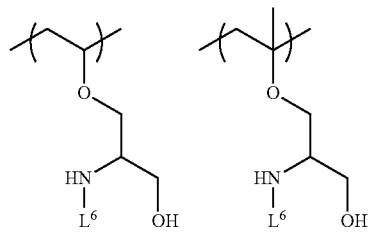
[Chemical Formula 15]
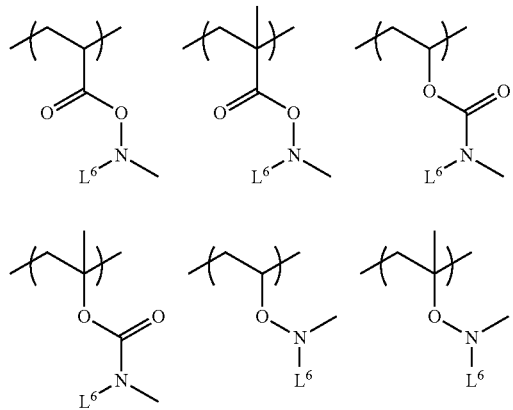
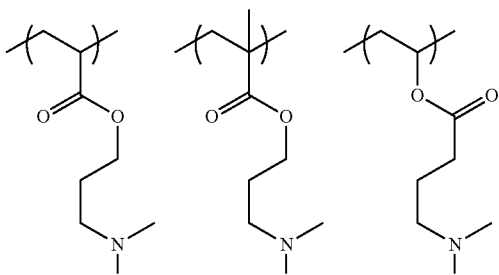
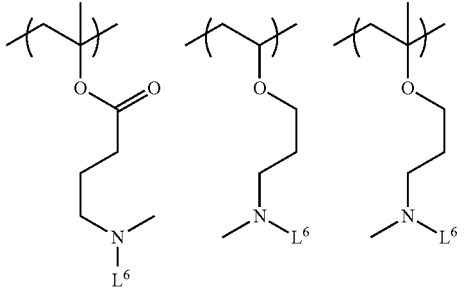
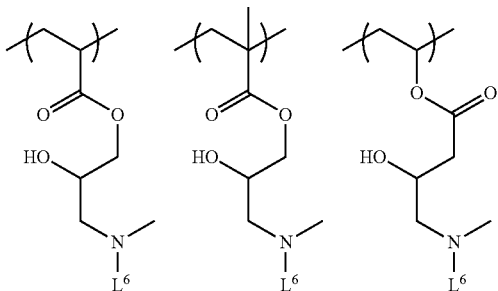
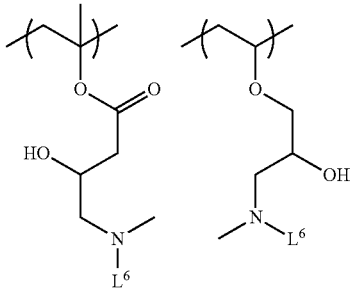
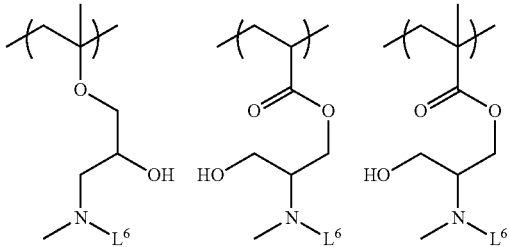
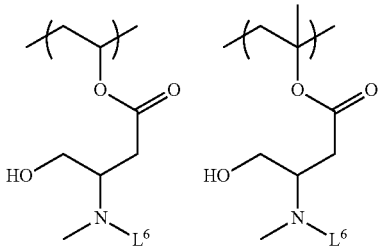

-continued
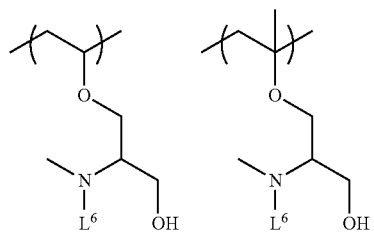
Combination of R, L, $L^2$, and $L^1$ in the formula (1) is preferably as follows.
[Chemical Formula 16]
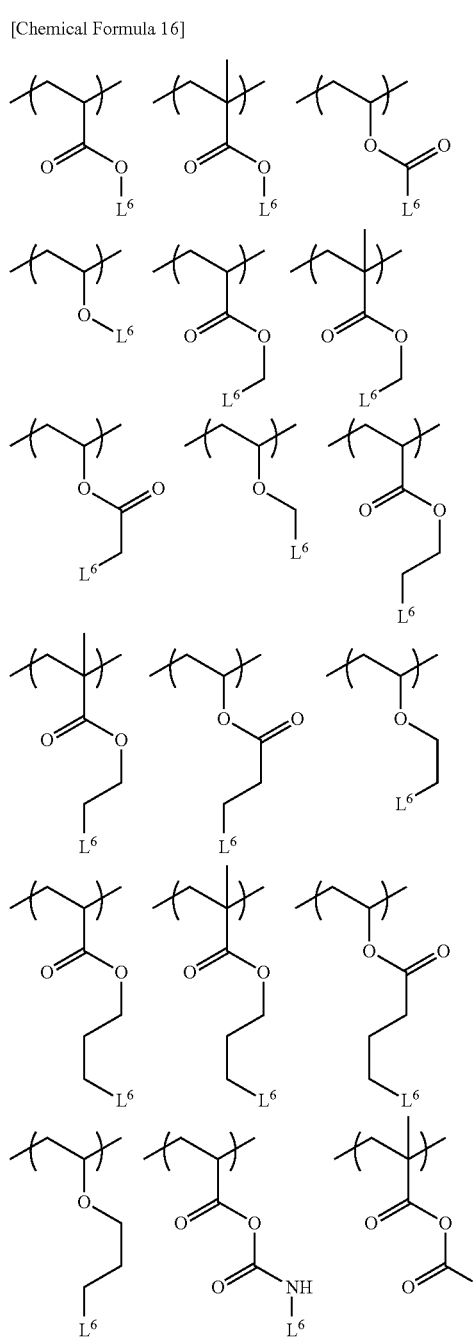
-continued
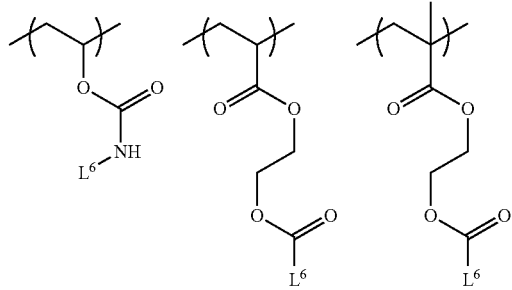
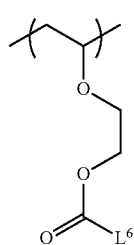
[Chemical Formula 17]
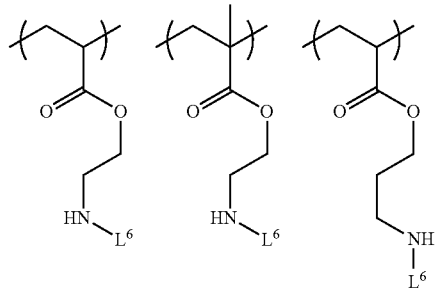
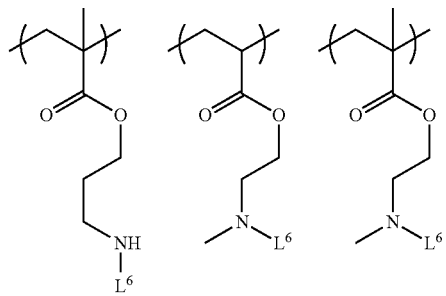
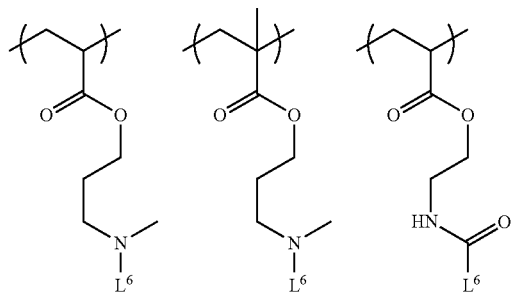

-continued
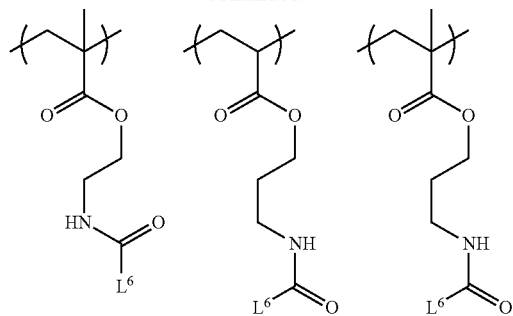
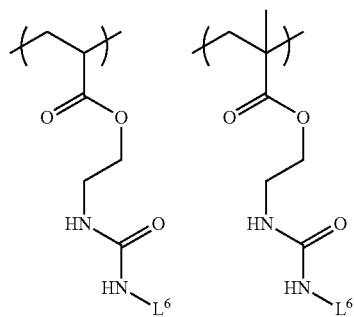
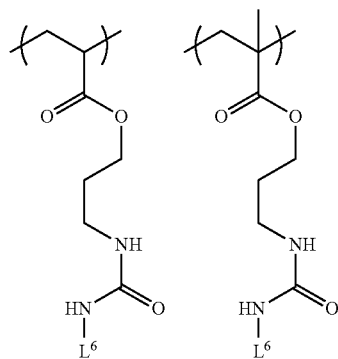
[Chemical Formula 18]
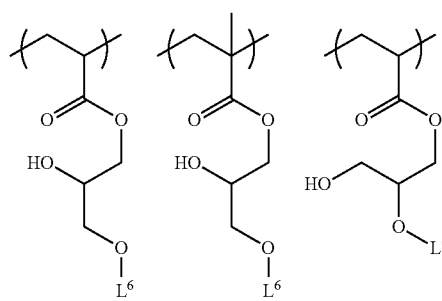
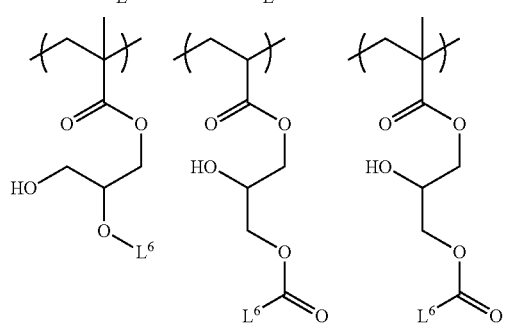
-continued
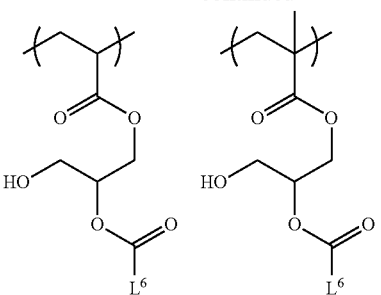
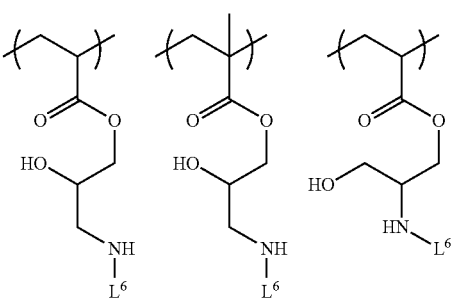
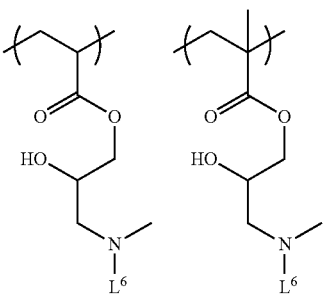
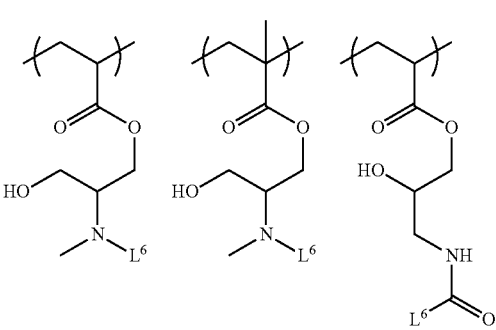

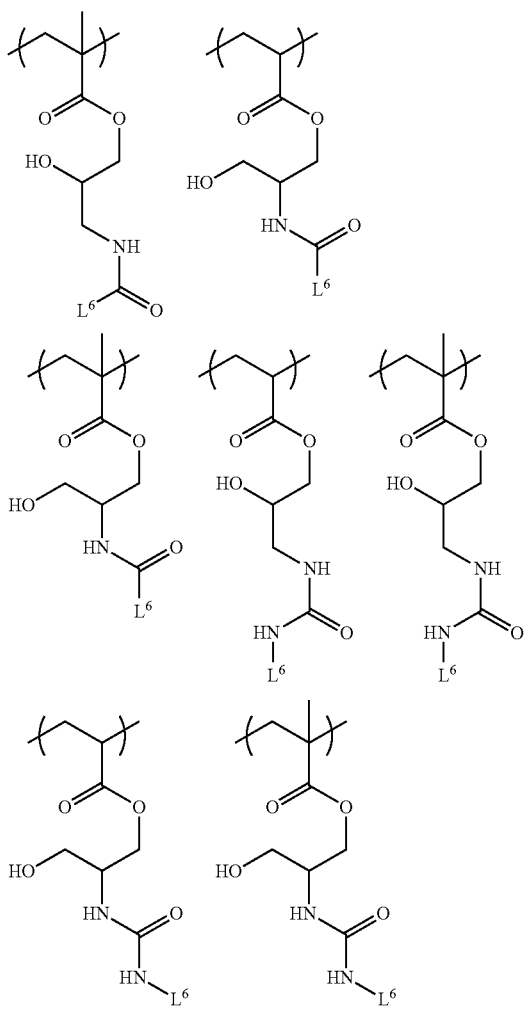

The following is also preferred as combination of R, $L^1$, $L^2$, and $L^3$ in the formula (1):

R is a hydrogen atom, $L^1$, $L^2$, and $L^3$ are each a single bond, and $L^6$ is an alkyl group having 14 or more and 30 or less carbon atoms; or R is a hydrogen atom or a methyl group, $L^1$ is —CO—O—, $L^2$ and $L^3$ are each a single bond, and $L^6$ is an alkyl group having 14 or more and 30 or less carbon atoms.

Combination of R, $L^1$, $L^2$, and $L^3$ in the formula (1) is more preferably as follows.

[Chemical Formula 19]

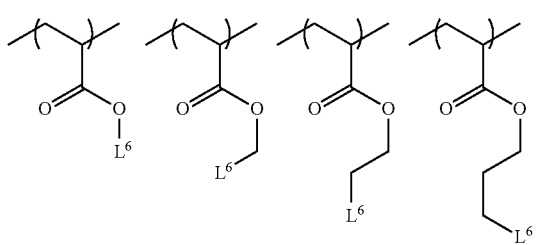

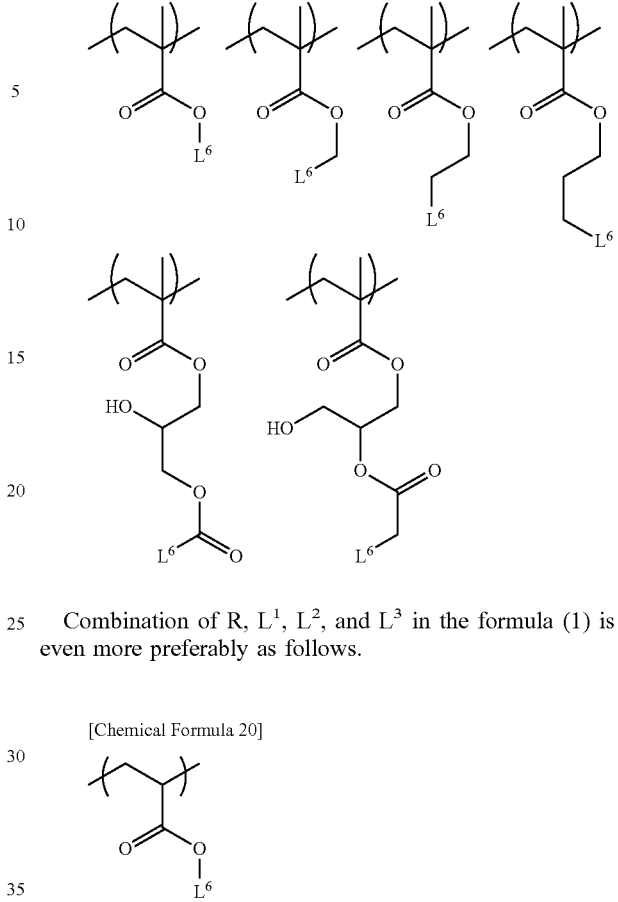

Combination of R, $L^1$, $L^2$, and $L^3$ in the formula (1) is even more preferably as follows.

[Chemical Formula 20]

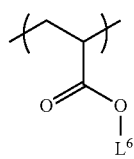

The constitutional unit (B) is preferably a constitutional unit derived from n-hexadecene, a constitutional unit derived from n-octadecene, a constitutional unit derived from n-eicosene, a constitutional unit derived from n-docosene, a constitutional unit derived from n-tetracosene, a constitutional unit derived from n-hexacosene, a constitutional unit derived from n-octacosene, a constitutional unit derived from n-triacontene, a constitutional unit derived from n-dotriacontene, a constitutional unit derived from n-tetradecyl acrylate, a constitutional unit derived from n-pentadecyl acrylate, a constitutional unit derived from n-hexadecyl acrylate, a constitutional unit derived from n-heptadecyl acrylate, a constitutional unit derived from n-octadecyl acrylate, a constitutional unit derived from n-nonadecyl acrylate, a constitutional unit derived from n-eicosyl acrylate, a constitutional unit derived from n-heneicosyl acrylate, a constitutional unit derived from n-docosyl acrylate, a constitutional unit derived from n-tricosyl acrylate, a constitutional unit derived from n-tetracosyl acrylate, a constitutional unit derived from n-pentacosyl acrylate, a constitutional unit derived from n-hexacosyl acrylate, a constitutional unit derived from n-heptacosyl acrylate, a constitutional unit derived from n-octacosyl acrylate, a constitutional unit derived from n-nonacosyl acrylate, a constitutional unit derived from n-triacontyl acrylate, a constitutional unit derived from n-tetradecyl methacrylate, a constitutional unit derived from n-pentadecyl methacrylate, a constitutional unit derived from n-hexadecyl methacrylate, a constitutional unit derived from n-heptadecyl methacrylate, a constitutional unit derived from n-octadecyl methacrylate, a constitutional unit derived from n-nonadecyl methacrylate, a constitutional unit derived from n-eicosyl methacrylate, a constitutional unit derived from n-heneicosyl methacrylate, a constitutional unit derived from n-docosyl methacrylate, a constitutional unit derived from n-tricosyl methacrylate, a constitutional unit derived from n-tetracosyl methacrylate, a constitutional unit derived from n-pentacosyl methacrylate, a constitutional unit derived from n-hexacosyl methacrylate, a constitutional unit derived from n-heptacosyl methacrylate, a constitutional unit derived from n-octacosyl methacrylate, a constitutional unit derived from n-nonacosyl methacrylate, a constitutional unit derived from n-triacontyl methacrylate, a constitutional unit derived from n-vinyl tetradecylate, a constitutional unit derived from n-vinyl hexadecylate, a constitutional unit derived from n-vinyl octadecylate, a constitutional unit derived from n-vinyl eicosylate, a constitutional unit derived from n-vinyl docosylate, a constitutional unit derived from n-tetradecyl vinyl ether, a constitutional unit derived from n-hexadecyl vinyl ether, a constitutional unit derived from n-octadecyl vinyl ether, a constitutional unit derived from n-eicosyl vinyl ether, or a constitutional unit derived from n-docosyl vinyl ether.

The polymer (1) may include two or more types of the constitutional unit (B), and, for example, may be a polymer including a constitutional unit derived from n-eicosyl acrylate and a constitutional unit derived from n-octadecyl acrylate.

It is preferable that the polymer (1) be a polymer including a constitutional unit (A) derived from ethylene for imparting good shape retention to a molded article comprising the resin composition according to the present invention and good formability to the resin composition comprising the polymer (1) at temperatures equal to or higher than the melting peak temperature of the polymer (1). The constitutional unit (A) is a constitutional unit obtained by polymerization of ethylene, and the constitutional unit (A) may be forming a branched structure in the polymer.

The polymer (1) is preferably a polymer including the constitutional unit (B) represented by the formula (1) and the constitutional unit (A) derived from ethylene.

The polymer (1) may include at least one constitutional unit (C) selected from the group consisting of a constitutional unit represented by the following formula (2) and a constitutional unit represented by the following formula (3).

[Chemical Formula 21]

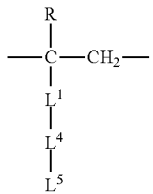

formula (2)

In the formula (2),
R represents a hydrogen atom or a methyl group;
$L^1$ represents a single bond, —CO—O—, —O—CO—, or —O—;
$L^4$ represents an alkylene group having one or more and eight or less carbon atoms;
$L^5$ represents a hydrogen atom, an epoxy group, —CH(OH)—CH2OH, a carboxy group, a hydroxy group, an amino group, or an alkylamino group having one or more and four or less carbon atoms; and
the left side and right side of each of the horizontal chemical formulas for describing the chemical structure of $L^1$ correspond to the upper side of the formula (2) and the lower side of the formula (2), respectively.

[Chemical Formula 22]

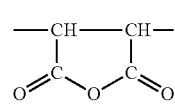

formula (3)

In the formula (2), R is preferably a hydrogen atom.
In the formula (2), $L^1$ is preferably —CO—O—, —O—CO—, or —O—, more preferably —CO—O— or —O—CO—, and even more preferably —CO—O—.

Examples of the alkylene group having one or more and eight or less carbon atoms as $L^4$ in the formula (2) include a methylene group, an ethylene group, an n-propylene group, a 1-methylethylene group, an n-butylene group, a 1,2-dimethylethylene group, a 1,1-dimethylethylene group, a 2,2-dimethylethylene group, an n-pentylene group, an n-hexylene group, an n-heptalene group, an n-octylene group, and a 2-ethyl-n-hexylene group.

In the formula (2), $L^4$ is preferably a methylene group, an ethylene group, or an n-propylene group, and more preferably a methylene group.

Examples of the alkylamino group having one or more and four or less carbon atoms as $L^5$ in the formula (2) include a methylamino group, an ethylamino group, a propylamino group, a butylamino group, a dimethylamino group, and a diethylamino group.

In the formula (2), $L^5$ is preferably a hydrogen atom, an epoxy group, or —CH(OH)—CH2OH, and more preferably a hydrogen atom.

Examples of combination of R, $L^1$, $L^4$, and $L^5$ in the formula (2) include the followings.

[Chemical Formula 23]

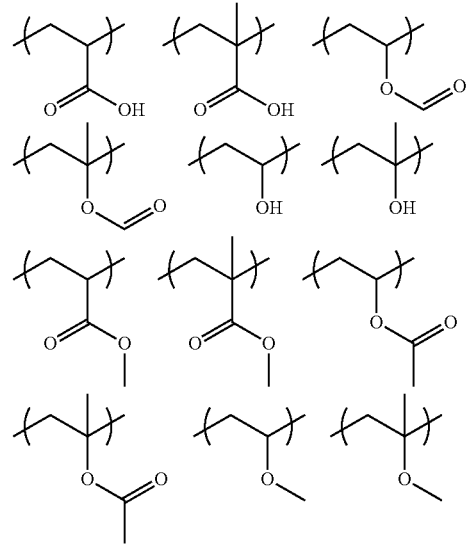

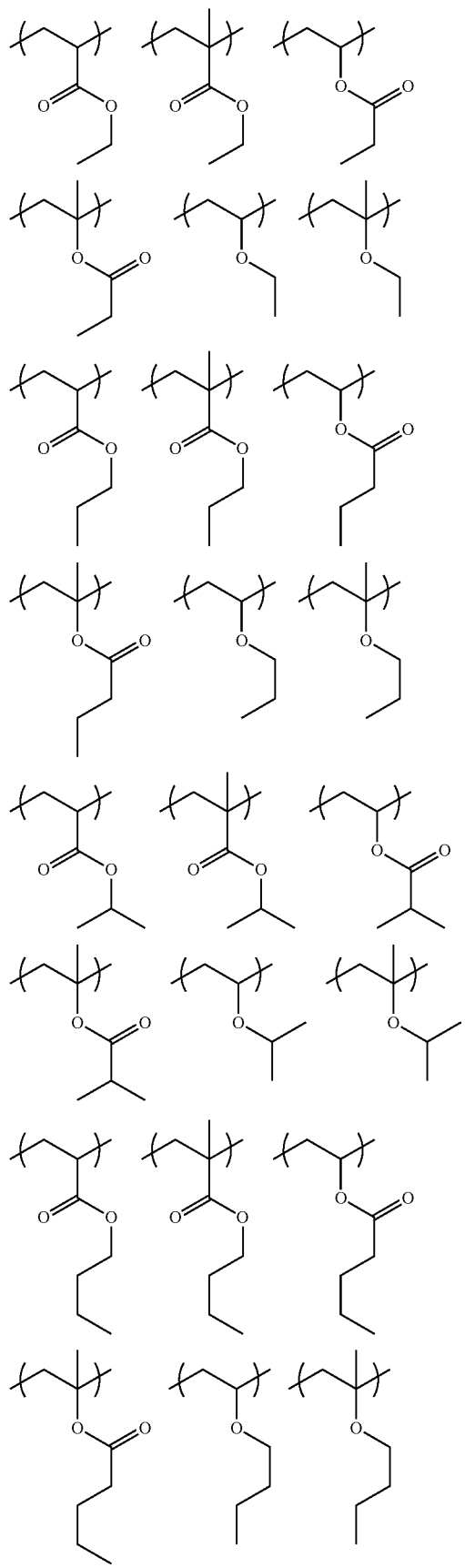
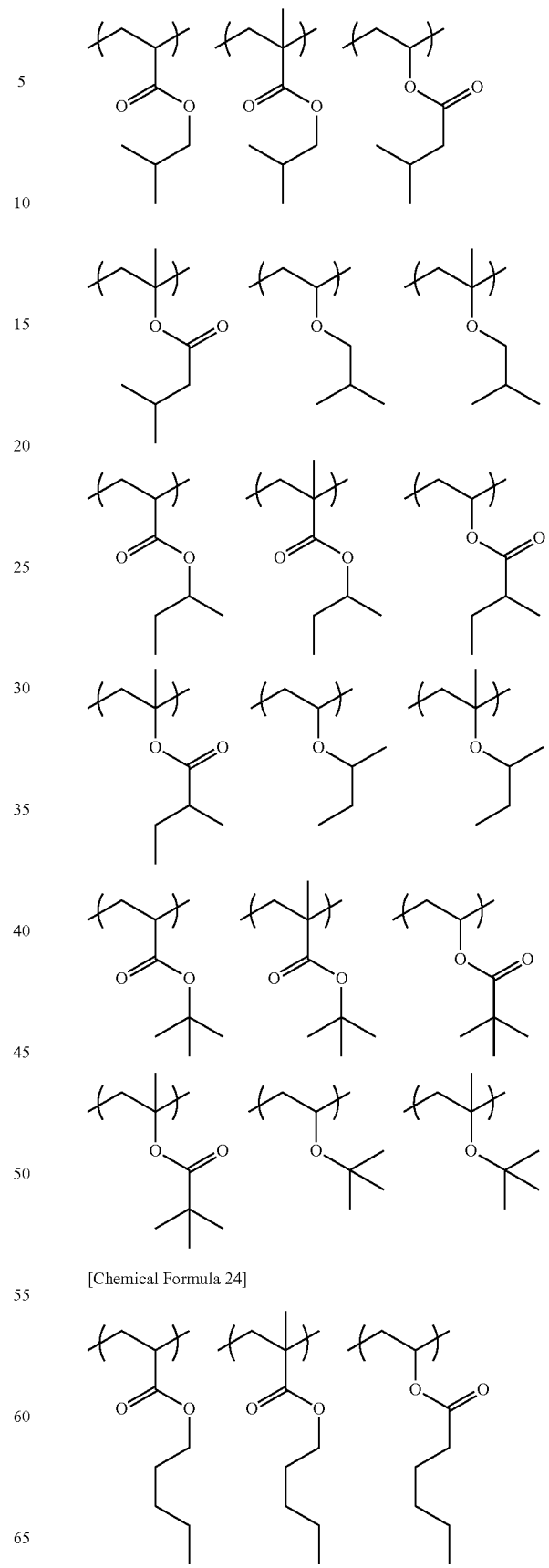
[Chemical Formula 24]

-continued
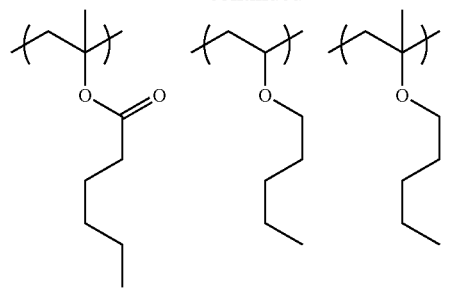
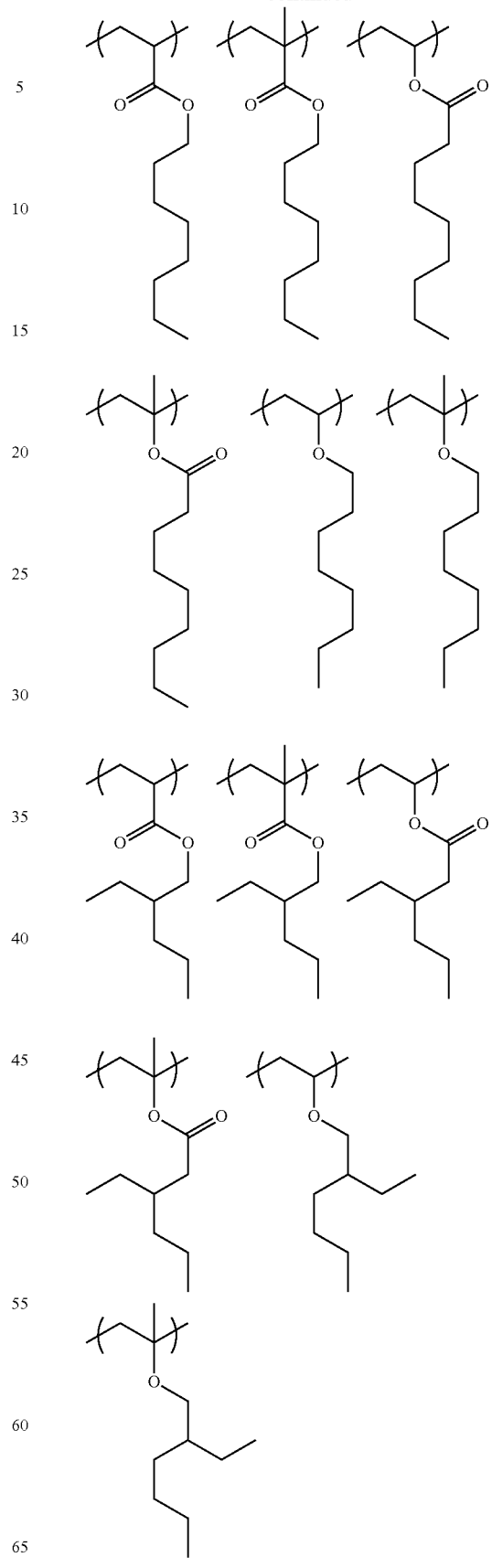

[Chemical Formula 25]
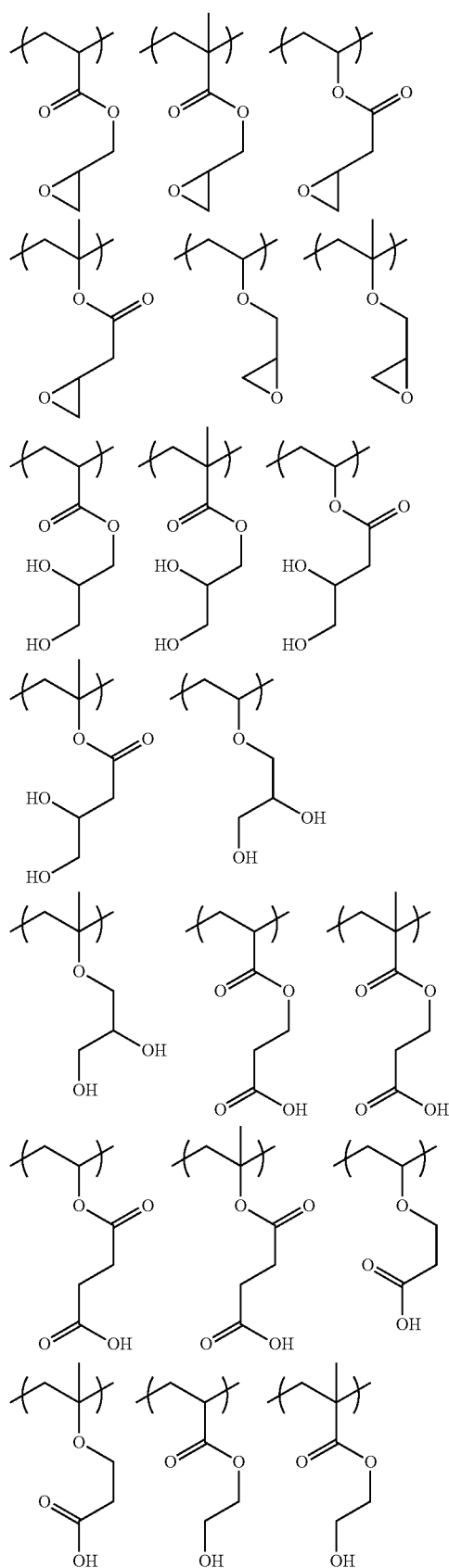
[Chemical Formula 26]
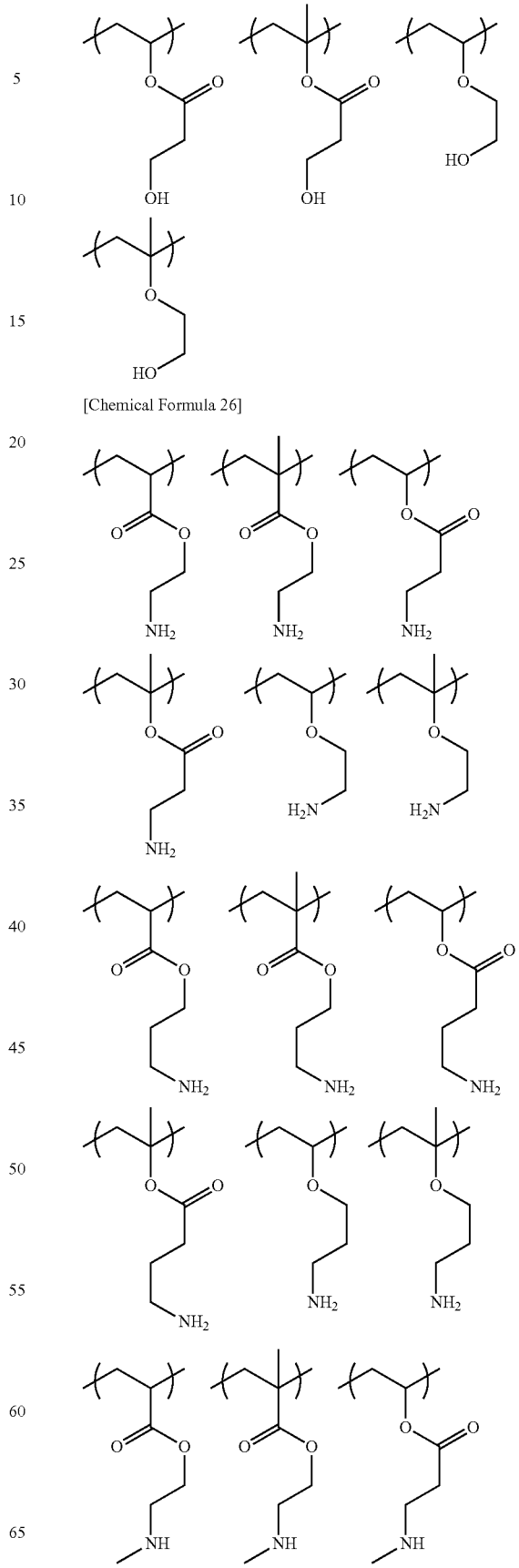

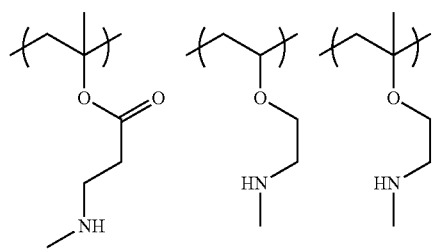
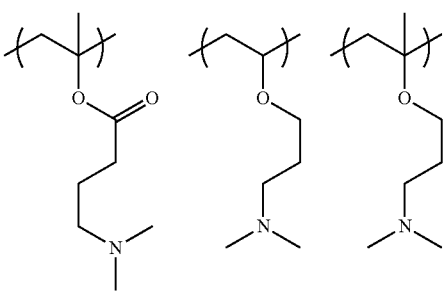
Combination of R, $L^1$, $L^4$, and $L^5$ in the formula (2) is preferably as follows.
[Chemical Formula 27]
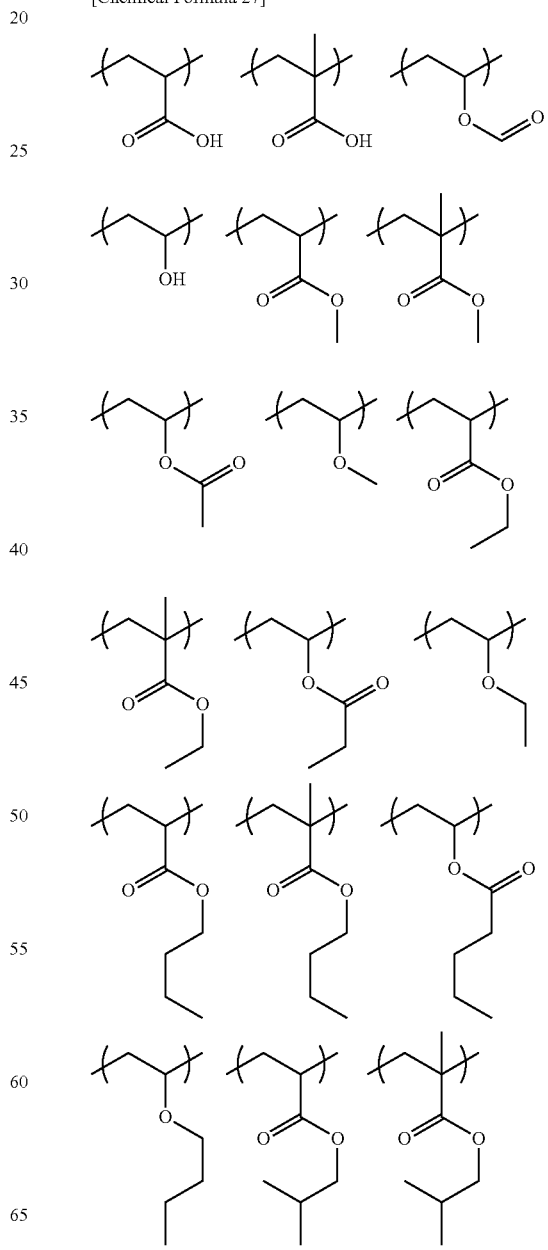

47
-continued
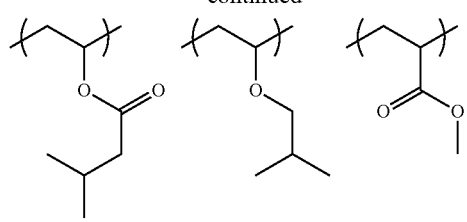
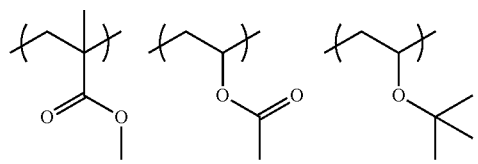
[Chemical Formula 28]
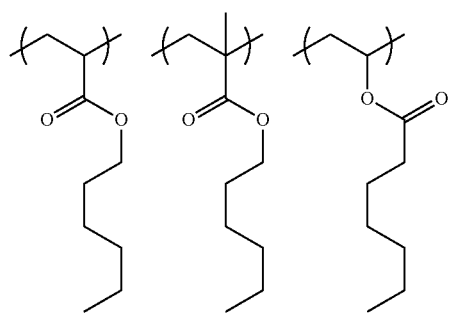
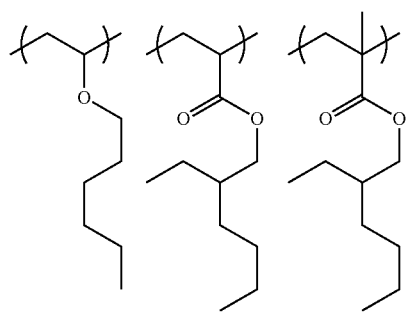
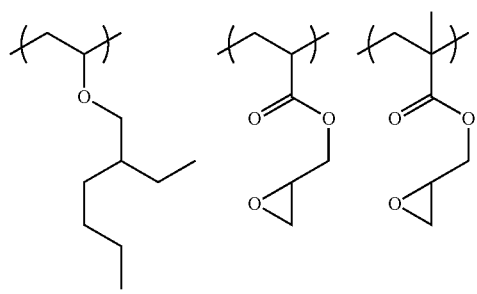
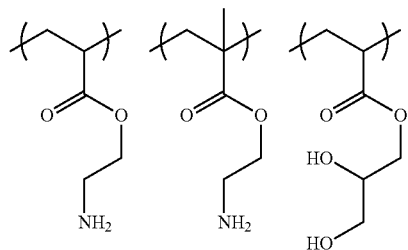
48
-continued
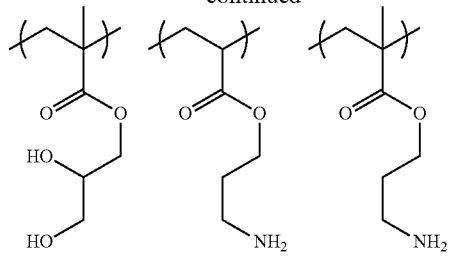
[Chemical Formula 29]
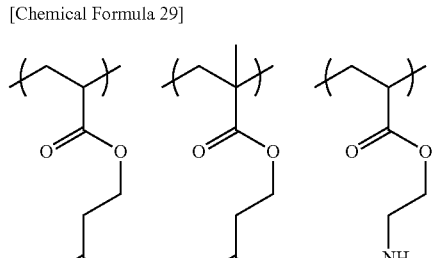
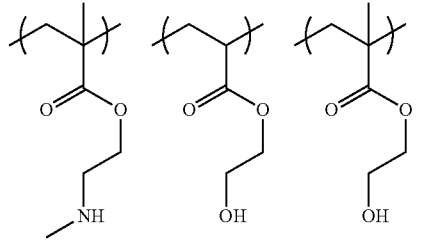
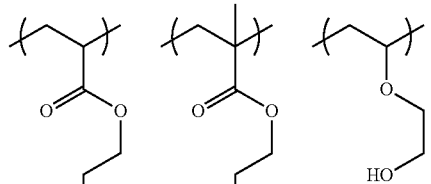
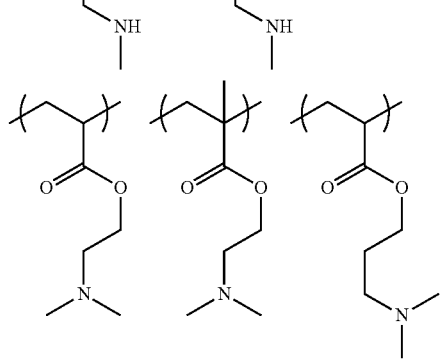
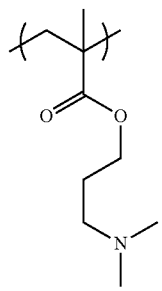
Combination of R, $L^1$, $L^4$, and $L^5$ in the formula (2) is more preferably as follows.

[Chemical Formula 30]

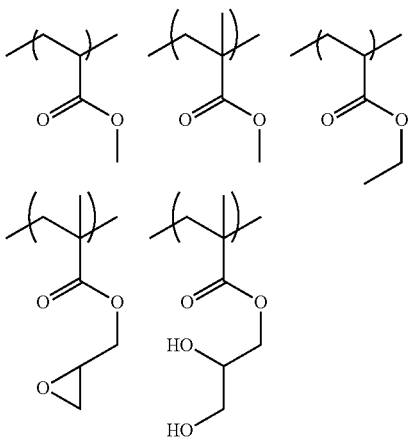

Combination of R, $L^1$, $L^4$, and $L^1$ in the formula (2) is even more preferably as follows.

[Chemical Formula 31]

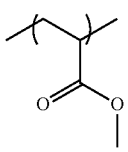

Examples of the constitutional unit represented by the formula (2) include a constitutional unit derived from propylene, a constitutional unit derived from butene, a constitutional unit derived from 1-pentene, a constitutional unit derived from 1-hexene, a constitutional unit derived from 1-heptene, a constitutional unit derived from 1-octene, a constitutional unit derived from acrylic acid, a constitutional unit derived from methacrylic acid, a constitutional unit derived from vinyl alcohol, a constitutional unit derived from methyl acrylate, a constitutional unit derived from ethyl acrylate, a constitutional unit derived from n-propyl acrylate, a constitutional unit derived from isopropyl acrylate, a constitutional unit derived from n-butyl acrylate, a constitutional unit derived from isobutyl acrylate, a constitutional unit derived from sec-butyl acrylate, a constitutional unit derived from tert-butyl acrylate, a constitutional unit derived from methyl methacrylate, a constitutional unit derived from ethyl methacrylate, a constitutional unit derived from n-propyl methacrylate, a constitutional unit derived from isopropyl methacrylate, a constitutional unit derived from n-butyl methacrylate, a constitutional unit derived from isobutyl methacrylate, a constitutional unit derived from sec-butyl methacrylate, a constitutional unit derived from tert-butyl methacrylate, a constitutional unit derived from vinyl formate, a constitutional unit derived from vinyl acetate, a constitutional unit derived from vinyl propionate, a constitutional unit derived from vinyl(n-butyrate), a constitutional unit derived from vinyl(isobutyrate), a constitutional unit derived from methyl vinyl ether, a constitutional unit derived from ethyl vinyl ether, a constitutional unit derived from n-propyl vinyl ether, a constitutional unit derived from isopropyl vinyl ether, a constitutional unit derived from n-butyl vinyl ether, a constitutional unit derived from isobutyl vinyl ether, a constitutional unit derived from sec-butyl vinyl ether, a constitutional unit derived from tert-butyl vinyl ether, a constitutional unit derived from glycidyl acrylate, a constitutional unit derived from glycidyl methacrylate, a constitutional unit derived from 2,3-dihydroxypropyl acrylate, a constitutional unit derived from 2,3-dihydroxypropyl methacrylate, a constitutional unit derived from 3-(dimethylamino)propyl acrylate, and a constitutional unit derived from 3-(dimethylamino)propyl methacrylate.

The constitutional unit represented by the formula (3) is a constitutional unit derived from maleic anhydride.

The polymer (1) may include two or more types of the constitutional unit (C), and, for example, may be a polymer including a constitutional unit derived from methyl acrylate, a constitutional unit derived from ethyl acrylate, and a constitutional unit derived from glycidyl methacrylate.

The polymer (1) is preferably a polymer including the constitutional unit (B) represented by the formula (1).

Examples of the polymer including the constitutional unit (B) represented by the formula (1) include:

a polymer (1) consisting of the constitutional unit (B);

a polymer (1) including the constitutional unit (B) and the constitutional unit (A);

a polymer (1) including the constitutional unit (B) and the constitutional unit (C); and a polymer (1) including the constitutional unit (B), the constitutional unit (A), and the constitutional unit (C).

Examples of the polymer (1) consisting of the constitutional unit (B) include:

a polymer consisting of a constitutional unit (B) represented by the formula (1) in which R is a hydrogen atom, $L^1$, $L^2$, and $L^3$ are each a single bond, and $L^6$ is an alkyl group having 14 or more and 30 or less carbon atoms; and a polymer consisting of a constitutional unit (B) represented by the formula (1) in which R is a hydrogen atom or a methyl group, $L^1$ is —CO—O—, $L^2$ and $L^3$ are each a single bond, and $L^6$ is an alkyl group having 14 or more and 30 or less carbon atoms.

Examples of the polymer (1) including the constitutional unit (B) and the constitutional unit (A) include:

a polymer including a constitutional unit (B) represented by the formula (1) in which R is a hydrogen atom, $L^1$, $L^2$, and $L^3$ are each a single bond, and $L^6$ is an alkyl group having 14 or more and 30 or less carbon atoms, and the constitutional unit (A), wherein the proportion of the number of the constitutional unit (A) and the constitutional unit (B) in total is 90% or more, with respect to 100% of the total number of all constitutional units included in the polymer, and a polymer including a constitutional unit (B) in which R is a hydrogen atom or a methyl group, $L^1$ is —CO—O—, $L^2$ and $L^3$ are each a single bond, and $L^6$ is an alkyl group having 14 or more and 30 or less carbon atoms, and the constitutional unit (A), and optionally including the constitutional unit (C), wherein the proportion of the number of the constitutional unit (A) and the constitutional unit (B) in total is 90% or more, with respect to 100% of the total number of all constitutional units included in the polymer.

It is preferable for increase of ΔH that the polymer (1) be a polymer such that the proportion of the number of the constitutional unit (B) is more than 50% and 80% or less, with respect to 100% of the total number of the constitutional unit (B) and the constitutional unit (A) included in the polymer.

It is preferable for formability that the polymer (1) be a polymer such that the proportion of the number of the constitutional unit (B) is 10% or more and 50% or less, with respect to 100% of the total number of the constitutional unit (B) and the constitutional unit (A) included in the polymer.

Examples of the polymer (1) including the constitutional unit (B) and the constitutional unit (C) include:

a polymer including a constitutional unit (B) represented by the formula (1) in which R is a hydrogen atom or a methyl group, $L^1$ is —CO—O—, $L^2$ and $L^3$ are each a single bond, and $L^6$ is an alkyl group having 14 or more and 30 or less carbon atoms, and a constitutional unit (C) represented by the formula (2) in which R is a hydrogen atom or a methyl group, $L^1$ is —CO—O—, $L^4$ is a methylene group, and $L^5$ is a hydrogen atom. In this case, a polymer is preferred such that the proportion of the number of the constitutional unit (B) is 80% or more, with respect to 100% of the total number of the constitutional unit (B) and the constitutional unit (C) included in the polymer.

In the polymer (1), the proportion of the number of the constitutional unit (A) is 0% or more and 99% or less and the proportion of the number of the constitutional unit (B) and the constitutional unit (C) in total is 1% or more and 100% or less, with respect to 100% of the total number of the constitutional unit (A), the constitutional unit (B), and the constitutional unit (C); and the proportion of the number of the constitutional unit (B) is 1% or more and 100% or less and the proportion of the number of the constitutional unit (C) is 0% or more and 99% or less, with respect to 100% of the total number of the constitutional unit (B) and the constitutional unit (C).

The proportion of the number of the constitutional unit (A) in the polymer (1) is preferably 70% or more and 99% or less, more preferably 80% or more and 97.5% or less, and even more preferably 85% or more and 92.5% or less, with respect to 100% of the total number of the constitutional unit (A), the constitutional unit (B), and the constitutional unit (C), for imparting good shape retention to a molded article comprising the resin composition according to the present invention. The proportion of the number of the constitutional unit (B) and the constitutional unit (C) in total is preferably 1% or more and 30% or less, more preferably 2.5% or more and 20% or less, and even more preferably 7.5% or more and 15% or less, with respect to 100% of the total number of the constitutional unit (A), the constitutional unit (B), and the constitutional unit (C), for imparting good shape retention to a molded article comprising the resin composition according to the present invention.

The proportion of the number of the constitutional unit (B) in the polymer (1) is 1% or more and 100% or less, with respect to 100% of the total number of the constitutional unit (B) and the constitutional unit (C), and is preferably 60% or more and 100% or less, and more preferably 80% or more and 100% or less, for imparting good heat storage performance to the resin composition containing the polymer (1). The proportion of the number of the constitutional unit (C) in the polymer (1) is 0% or more and 99% or less, with respect to 100% of the total number of the constitutional unit (B) and the constitutional unit (C), and is preferably 0% or more and 40% or less, and more preferably 0% or more and 20% or less, for imparting good heat storage performance to the resin composition containing the polymer (1).

Each of the proportion of the number of the constitutional unit (A), the proportion of the number of the constitutional unit (B), and the proportion of the number of the constitutional unit (C) can be determined from an integrated value for a signal attributed to the corresponding constitutional unit in a $^{13}C$ nuclear magnetic resonance spectrum (hereinafter, referred to as "$^{13}C$-NMR spectrum") or a $^1H$ nuclear magnetic resonance spectrum (hereinafter, referred to as "$^1H$-NMR spectrum") by using a well-known method.

If the polymer (1) is a polymer produced, as described later, by using a method of reacting a polymer including at least one constitutional unit (C) selected from the group consisting of the constitutional unit represented by the above formula (2) and the constitutional unit represented by the above formula (3), and optionally including the constitutional unit (A) derived from ethylene (hereinafter, referred to as "precursor polymer (1)") and at least one compound (α) described later, each of the proportion of the number of the constitutional unit (A), the proportion of the number of the constitutional unit (B), and the proportion of the number of the constitutional unit (C) can be determined, for example, in the following manner.

If the precursor polymer (1) includes the constitutional unit (A) derived from ethylene, the proportions of the number of the constitutional unit (A) and the constitutional unit (C) included in the precursor polymer (1) are first determined. In determining from a $^{13}C$-NMR spectrum, for example, the proportions of the number of dyads of the constitutional unit (A) and the constitutional unit (C) (AA, AC, CC) are determined from the spectrum, and substituted into the following formula to determine the proportions of the number of the constitutional unit (A) and the constitutional unit (C). Here, AA represents a constitutional unit (A)-constitutional unit (A) dyad, AC represents a constitutional unit (A)-constitutional unit (C) dyad, and CC represents a constitutional unit (C)-constitutional unit (C) dyad.

Proportion of the number of constitutional unit (A)=100−proportion of the number of constitutional unit (C)

Proportion of the number of constitutional unit (C)=100×(AC/2+CC)/(AA+AC+CC)

Because the constitutional unit (B) in the polymer (1) is formed through reaction between the constitutional unit (C) included in the precursor polymer (1) and the compound (α), the conversion rate of the constitutional unit (C) in the reaction is determined in the following manner.

An integrated value for a signal attributed to a specific carbon included in the side chain of the constitutional unit (C) in the precursor polymer (1) (hereinafter, referred to as "integrated value Y") and an integrated value for a signal attributed to a specific carbon included in the side chain of the constitutional unit (B) in the polymer (1) (hereinafter, referred to as "integrated value Z") are substituted into the following formula to determine the conversion rate.

Conversion rate=$Z/(Y+Z)$

The proportion of the number of the constitutional unit (A) included in the polymer (1) is assumed to be identical to the proportion of the number of the constitutional unit (A) included in the precursor polymer (1) because the constitutional unit (A) included in the precursor polymer (1) remains unchanged after the reaction between the precursor polymer (1) and the compound (α). The proportion of the number of the constitutional unit (B) included in the polymer (1) is determined as the product of the proportion of the number of the constitutional unit (C) included in the precursor polymer (1) and the conversion rate. The proportion of the number of the constitutional unit (C) included in the polymer (1) is determined as the difference between the proportion of the number of the constitutional unit (C) included in the precursor polymer (1) and the proportion of the number of the constitutional unit (B) included in the polymer (1).

The precursor polymer (1) can be, in an example, a polymer including at least one constitutional unit (C) selected from the group consisting of the constitutional unit represented by the above formula (2) and the constitutional unit represented by the above formula (3), provided that $L^1$ in the formula (2) is —CO—O—, —O—CO—, or —O—.

Examples of production methods for the polymer (1) include: a method of reacting the precursor polymer (1) and at least one compound (hereinafter, referred to as "compound (α)") selected from the group consisting of alcohol including an alkyl group having 14 or more and 30 or less carbon atoms, amine including an alkyl group having 14 or more and 30 or less carbon atoms, alkyl halide including an alkyl group having 14 or more and 30 or less carbon atoms, carboxylic acid including an alkyl group having 14 or more and 30 or less carbon atoms, carboxamide including an alkyl group having 14 or more and 30 or less carbon atoms, carboxylic acid halide including an alkyl group having 14 or more and 30 or less carbon atoms, carbamic acid including an alkyl group having 14 or more and 30 or less carbon atoms, alkylurea including an alkyl group having 14 or more and 30 or less carbon atoms, and isocyanate including an alkyl group having 14 or more and 30 or less carbon atoms; a method of polymerizing a monomer to serve as a raw material of the constitutional unit (B); and a method of copolymerizing ethylene and a monomer to serve as a raw material of the constitutional unit (B). The alkyl group of the compound (α) may be, for example, a linear alkyl group or a branched alkyl group, though it is preferable that the alkyl group be a linear alkyl group.

The precursor polymer (1) is a raw material for production of the polymer (1), and the precursor polymer (1) does not include the constitutional unit (B) represented by the formula (1). The precursor polymer (1) may include a constitutional unit corresponding to none of the constitutional unit (A), the constitutional unit (B), and the constitutional unit (C).

In the precursor polymer (1), preferably, the proportion of the number of the constitutional unit (A) is 0% or more and 99% or less and the proportion of the number of the constitutional unit (C) in total is 1% or more and 100% or less, with respect to 100% of the total number of the constitutional unit (A) and the constitutional unit (C). More preferably, the proportion of the number of the constitutional unit (A) is 70% or more and 99% or less and the proportion of the number of the constitutional unit (C) in total is 1% or more and 30% or less.

Examples of methods for forming the constitutional unit (B) in the polymer (1) include: a method of reacting the constitutional unit (C) included in the precursor polymer (1) and the compound (α); a method of polymerizing a monomer to serve as a raw material of the constitutional unit (B); and a method of copolymerizing ethylene and a monomer to serve as a raw material of the constitutional unit (B). It is preferable that the alkyl group of the compound (α) be a linear alkyl group. A polymerization initiator such as an azo compound may be used in the methods of polymerizing a monomer. Examples of the azo compound include azobisisobutyronitrile.

Examples of the precursor polymer (1) include acrylic acid polymer, methacrylic acid polymer, vinyl alcohol polymer, methyl acrylate polymer, ethyl acrylate polymer, n-propyl acrylate polymer, n-butyl acrylate polymer, methyl methacrylate polymer, ethyl methacrylate polymer, n-propyl methacrylate polymer, n-butyl methacrylate polymer, vinyl formate polymer, vinyl acetate polymer, vinyl propionate polymer, vinyl(n-butyrate) polymer, methyl vinyl ether polymer, ethyl vinyl ether polymer, n-propyl vinyl ether polymer, n-butyl vinyl ether polymer, maleic anhydride polymer, glycidyl acrylate polymer, glycidyl methacrylate polymer, 3-(dimethylamino)propyl acrylate polymer, 3-(dimethylamino)propyl methacrylate polymer, ethylene-acrylic acid copolymer, ethylene-methacrylic acid copolymer, ethylene-vinyl alcohol copolymer, ethylene-methyl acrylate copolymer, ethylene-ethyl acrylate copolymer, ethylene-n-propyl acrylate copolymer, ethylene-n-butyl acrylate copolymer, ethylene-methyl methacrylate copolymer, ethylene-ethyl methacrylate copolymer, ethylene-n-propyl methacrylate copolymer, ethylene-n-butyl methacrylate copolymer, ethylene-vinyl formate copolymer, ethylene-vinyl acetate copolymer, ethylene-vinyl propionate copolymer, ethylene-vinyl(n-butyrate) copolymer, ethylene-methyl vinyl ether copolymer, ethylene-ethyl vinyl ether copolymer, ethylene-n-propyl vinyl ether copolymer, ethylene-n-butyl vinyl ether copolymer, ethylene-maleic anhydride copolymer, ethylene-glycidyl acrylate copolymer, ethylene-glycidyl methacrylate copolymer, ethylene-3-(dimethylamino)propyl acrylate copolymer, and ethylene-3-(dimethylamino)propyl methacrylate copolymer.

Examples of the alcohol including a linear alkyl group having 14 or more and 30 or less carbon atoms include n-tetradecyl alcohol, n-pentadecyl alcohol, n-hexadecyl alcohol, n-heptadecyl alcohol, n-octadecyl alcohol, n-nonadecyl alcohol, n-eicosyl alcohol, n-heneicosyl alcohol, n-docosyl alcohol, n-tricosyl alcohol, n-tetracosyl alcohol, n-pentacosyl alcohol, n-hexacosyl alcohol, n-heptacosyl alcohol, n-octacosyl alcohol, n-nonacosyl alcohol, and n-triacontyl alcohol.

Examples of the alcohol including a branched alkyl group having 14 or more and 30 or less carbon atoms include isotetradecyl alcohol, isopentadecyl alcohol, isohexadecyl alcohol, isoheptadecyl alcohol, isooctadecyl alcohol, isononadecyl alcohol, isoeicosyl alcohol, isoheneicosyl alcohol, isodocosyl alcohol, isotricosyl alcohol, isotetracosyl alcohol, isopentacosyl alcohol, isohexacosyl alcohol, isoheptacosyl alcohol, isooctacosyl alcohol, isononacosyl alcohol, and isotriacontyl alcohol.

Examples of the amine including a linear alkyl group having 14 or more and 30 or less carbon atoms include n-tetradecylamine, n-pentadecylamine, n-hexadecylamine, n-heptadecylamine, n-octadecylamine, n-nonadecylamine, n-eicosylamine, n-heneicosylamine, n-docosylamine, n-tricosylamine, n-tetracosylamine, n-pentacosylamine, n-hexacosylamine, n-heptacosylamine, n-octacosylamine, n-nonacosylamine, and n-triacontylamine.

Examples of the amine including a branched alkyl group having 14 or more and 30 or less carbon atoms include isotetradecylamine, isopentadecylamine, isohexadecylamine, isoheptadecylamine, isooctadecylamine, isononadecylamine, isoeicosylamine, isoheneicosylamine, isodocosylamine, isotricosylamine, isotetracosylamine, isopentacosylamine, isohexacosylamine, isoheptacosylamine, isooctacosylamine, isononacosylamine, and isotriacontylamine.

Examples of the alkyl halide including a linear alkyl group having 14 or more and 30 or less carbon atoms include n-tetradecyl iodide, n-pentadecyl iodide, n-hexadecyl iodide, n-heptadecyl iodide, n-octadecyl iodide, n-nonadecyl iodide, n-eicosyl iodide, n-heneicosyl iodide, n-docosyl iodide, n-tricosyl iodide, n-tetracosyl iodide, n-pentacosyl iodide, n-hexacosyl iodide, n-heptacosyl iodide, n-octacosyl iodide, n-nonacosyl iodide, and n-triacontyl iodide.

Examples of the alkyl halide including a branched alkyl group having 14 or more and 30 or less carbon atoms include isotetradecyl iodide, isopentadecyl iodide, isohexadecyl iodide, isoheptadecyl iodide, isooctadecyl iodide, isononadecyl iodide, isoeicosyl iodide, isoheneicosyl iodide, isodocosyl iodide, isotricosyl iodide, isotetracosyl iodide, isopentacosyl iodide, isohexacosyl iodide, isoheptacosyl iodide, isooctacosyl iodide, isononacosyl iodide, and isotriacontyl iodide.

Examples of the carboxylic acid including a linear alkyl group having 14 or more and 30 or less carbon atoms include n-tetradecanoic acid, n-pentadecanoic acid, n-hexadecanoic acid, n-heptadecanoic acid, n-octadecanoic acid, n-nonadecanoic acid, n-eicosanoic acid, n-heneicosanoic acid, n-docosanoic acid, n-tricosanoic acid, n-tetracosanoic acid, n-pentacosanoic acid, n-hexacosanoic acid, n-heptacosanoic acid, n-octacosanoic acid, n-nonacosanoic acid, and n-triacontanoic acid.

Examples of the carboxylic acid including a branched alkyl group having 14 or more and 30 or less carbon atoms include isotetradecanoic acid, isopentadecanoic acid, isohexadecanoic acid, isoheptadecanoic acid, isooctadecanoic acid, isononadecanoic acid, isoeicosanoic acid, isoheneicosanoic acid, isodocosanoic acid, isotricosanoic acid, isotetracosanoic acid, isopentacosanoic acid, isohexacosanoic acid, isoheptacosanoic acid, isooctacosanoic acid, isononacosanoic acid, and isotriacontanoic acid.

Examples of the carboxamide including a linear alkyl group having 14 or more and 30 or less carbon atoms include n-tetradecanamide, n-pentadecanamide, n-hexadecanamide, n-heptadecanamide, n-octadecanamide, n-nonadecanamide, n-eicosanamide, n-heneicosanamide, n-docosanamide, n-tricosanamide, n-tetracosanamide, n-pentacosanamide, n-hexacosanamide, n-heptacosanamide, n-octacosanamide, n-nonacosanamide, and n-triacontanamide.

Examples of the carboxamide including a branched alkyl group having 14 or more and 30 or less carbon atoms include isotetradecanamide, isopentadecanamide, isohexadecanamide, isoheptadecanamide, isooctadecanamide, isononadecanamide, isoeicosanamide, isoheneicosanamide, isodocosanamide, isotricosanamide, isotetracosanamide, isopentacosanamide, isohexacosanamide, isoheptacosanamide, isooctacosanamide, isononacosanamide, and isotriacontanamide.

Examples of the carboxylic acid halide including a linear alkyl group having 14 or more and 30 or less carbon atoms include n-tetradecanoic acid chloride, n-pentadecanoic acid chloride, n-hexadecanoic acid chloride, n-heptadecanoic acid chloride, n-octadecanoic acid chloride, n-nonadecanoic acid chloride, n-eicosanoic acid chloride, n-heneicosanoic acid chloride, n-docosanoic acid chloride, n-tricosanoic acid chloride, n-tetracosanoic acid chloride, n-pentacosanoic acid chloride, n-hexacosanoic acid chloride, n-heptacosanoic acid chloride, n-octacosanoic acid chloride, n-nonacosanoic acid chloride, and n-triacontanoic acid chloride.

Examples of the carboxylic acid halide including a branched alkyl group having 14 or more and 30 or less carbon atoms include isotetradecanoic acid chloride, isopentadecanoic acid chloride, isohexadecanoic acid chloride, isoheptadecanoic acid chloride, isooctadecanoic acid chloride, isononadecanoic acid chloride, isoeicosanoic acid chloride, isoheneicosanoic acid chloride, isodocosanoic acid chloride, isotricosanoic acid chloride, isotetracosanoic acid chloride, isopentacosanoic acid chloride, isohexacosanoic acid chloride, isoheptacosanoic acid chloride, isooctacosanoic acid chloride, isononacosanoic acid chloride, and isotriacontanoic acid chloride.

Examples of the carbamic acid including a linear alkyl group having 14 or more and 30 or less carbon atoms include n-tetradecylcarbamic acid, n-pentadecylcarbamic acid, n-hexadecylcarbamic acid, n-heptadecylcarbamic acid, n-octadecylcarbamic acid, n-nonadecylcarbamic acid, n-eicosylcarbamic acid, n-heneicosylcarbamic acid, n-docosylcarbamic acid, n-tricosylcarbamic acid, n-tetracosylcarbamic acid, n-pentacosylcarbamic acid, n-hexacosylcarbamic acid, n-heptacosylcarbamic acid, n-octacosylcarbamic acid, n-nonacosylcarbamic acid, and n-triacontylcarbamic acid.

Examples of the carbamic acid including a branched alkyl group having 14 or more and 30 or less carbon atoms include isotetradecylcarbamic acid, isopentadecylcarbamic acid, isohexadecylcarbamic acid, isoheptadecylcarbamic acid, isooctadecylcarbamic acid, isononadecylcarbamic acid, isoeicosylcarbamic acid, isoheneicosylcarbamic acid, isodocosylcarbamic acid, isotricosylcarbamic acid, isotetracosylcarbamic acid, isopentacosylcarbamic acid, isohexacosylcarbamic acid, isoheptacosylcarbamic acid, isooctacosylcarbamic acid, isononacosylcarbamic acid, and isotriacontylcarbamic acid.

Examples of the alkylurea including a linear alkyl group having 14 or more and 30 or less carbon atoms include n-tetradecylurea, n-pentadecylurea, n-hexadecylurea, n-heptadecylurea, n-octadecylurea, n-nonadecylurea, n-eicosylurea, n-heneicosylurea, n-docosylurea, n-tricosylurea, n-tetracosylurea, n-pentacosylurea, n-hexacosylurea, n-heptacosylurea, n-octacosylurea, n-nonacosylurea, and n-triacontylurea.

Examples of the alkylurea including a branched alkyl group having 14 or more and 30 or less carbon atoms include isotetradecylurea, isopentadecylurea, isohexadecylurea, isoheptadecylurea, isooctadecylurea, isononadecylurea, isoeicosylurea, isoheneicosylurea, isodocosylurea, isotricosylurea, isotetracosylurea, isopentacosylurea, isohexacosylurea, isoheptacosylurea, isooctacosylurea, isononacosylurea, and isotriacontylurea.

Examples of the isocyanate including a linear alkyl group having 14 or more and 30 or less carbon atoms include n-tetradecyl isocyanate, n-pentadecyl isocyanate, n-hexadecyl isocyanate, n-heptadecyl isocyanate, n-octadecyl isocyanate, n-nonadecyl isocyanate, n-eicosyl isocyanate, n-heneicosyl isocyanate, n-docosyl isocyanate, n-tricosyl isocyanate, n-tetracosyl isocyanate, n-pentacosyl isocyanate, n-hexacosyl isocyanate, n-heptacosyl isocyanate, n-octacosyl isocyanate, n-nonacosyl isocyanate, and n-triacontyl isocyanate.

Examples of the isocyanate including a branched alkyl group having 14 or more and 30 or less carbon atoms include isotetradecyl isocyanate, isopentadecyl isocyanate, isohexadecyl isocyanate, isoheptadecyl isocyanate, isooctadecyl isocyanate, isononadecyl isocyanate, isoeicosyl isocyanate, isoheneicosyl isocyanate, isodocosyl isocyanate, isotricosyl isocyanate, isotetracosyl isocyanate, isopentacosyl isocyanate, isohexacosyl isocyanate, isoheptacosyl isocyanate, isooctacosyl isocyanate, isononacosyl isocyanate, and isotriacontyl isocyanate.

If the precursor polymer (1) includes the constitutional unit (A) derived from ethylene, the product of reactivity ratios, r1r2, where r1 represents the reactivity ratio of ethylene to be used as a raw material in production of the precursor polymer (1), and r2 represents the reactivity ratio of a monomer to form the constitutional unit (C), is preferably 0.5 or higher and 5.0 or lower, and more preferably 0.5 or higher and 3.0 or lower, for imparting good shape retention to the resin composition containing the precursor polymer (1).

The reactivity ratio of ethylene, r1, is a value defined as the formula r1=k11/k12 in copolymerizing ethylene and a monomer to form the constitutional unit (C), where k11 represents the reaction rate of ethylene to bond to a polymer including the constitutional unit (A) at an end, and k12 represents the reaction rate of the monomer to form the constitutional unit (C) to bond to the polymer including the constitutional unit (A) at an end. The reactivity ratio, r1, is an index indicative of which of ethylene and a monomer to form the constitutional unit (C) a polymer including the constitutional unit (A) at an end is more reactive with in copolymerizing ethylene and a monomer to form the constitutional unit (C). Higher r1 indicates that the polymer including the constitutional unit (A) at an end is more reactive with ethylene, and a chain of the constitutional unit (A) is likely to be generated.

The reactivity ratio of a monomer to form the constitutional unit (C), r2, is a value defined as r2=k22/k21 in copolymerizing ethylene and a monomer to form the constitutional unit (C), where k21 represents the reaction rate of ethylene to bond to a polymer including the constitutional unit (C) at an end, and k22 represents the reaction rate of the monomer to form the constitutional unit (C) to bond to the polymer including the constitutional unit (C) at an end. The reactivity ratio, r2, is an index indicative of which of ethylene and a monomer to form the constitutional unit (C) a polymer including the constitutional unit (C) at an end is more reactive with in copolymerizing ethylene and a monomer to form the constitutional unit (C). Higher r2 indicates that the polymer including the constitutional unit (C) at an end is more reactive with the monomer to form the constitutional unit (C), and a chain of the constitutional unit (C) is likely to be generated.

The product of the reactivity ratios, r1r2, is calculated by using a method described in the literature "Kakugo, M.; Naito, Y.; Mizunuma, K.; Miyatake, T. Macromolecules, 1982, 15, 1150". In the present invention, the product of the reactivity ratios, r1r2, is obtained by substituting the proportions of the number of dyads of the constitutional unit (A) and the constitutional unit (C), namely, AA, AC, and CC, calculated from a $^{13}C$ nuclear magnetic resonance spectrum for the precursor polymer (1) into the following formula.

$$r1r2=AA[CC/(AC/2)^2]$$

The product of the reactivity ratios, r1r2, is an index indicative of the monomer chain distribution of a copolymer. The monomer chain distribution of a copolymer has higher randomness as the r1r2 is closer to 1, and the monomer chain distribution of a copolymer has a higher degree of alternating copolymerization character as the r1r2 is closer to 0, and the monomer chain distribution of a copolymer has a higher degree of block copolymerization character as the r1r2 is larger beyond 1.

The melt flow rate (MFR) of the precursor polymer (1) as measured in accordance with JIS K7210 at a temperature of 190° C. with a load of 21 N is preferably 0.1 g/10 min or higher and 500 g/10 min or lower.

Examples of methods for producing the precursor polymer (1) include a coordination polymerization method, a cationic polymerization method, an anionic polymerization method, and a radical polymerization method, and a radical polymerization method is preferred, and a radical polymerization method under high pressure is more preferred.

The reaction temperature for reacting the precursor polymer (1) and the at least one compound (α) is typically 40° C. or higher and 250° C. or lower. This reaction may be performed in the presence of a solvent, and examples of the solvent include hexane, heptane, octane, nonane, decane, toluene, and xylene. If any byproduct is generated in this reaction, the reaction may be performed while the byproduct is distilled off under reduced pressure to promote the reaction, or performed while the byproduct is azeotroped with the solvent, the volatilized byproduct and the solvent are cooled, the distillate containing the byproduct and the solvent is separated into a byproduct layer and a solvent layer, and only the recovered solvent is returned as a reflux solution into the reaction system.

The reaction between the precursor polymer (1) and the at least one compound (α) may be performed while the precursor polymer (1) and the compound (α) are melt-kneaded together. If any byproduct is generated in reacting the precursor polymer (1) and the compound (α) with melt-kneading, the reaction may be performed while the byproduct is distilled off under reduced pressure to promote the reaction. Examples of the melt-kneading apparatus for the melt-kneading include apparatuses including a single-screw extruder, a twin-screw extruder, and a Banbury mixer. The temperature of the melt-kneading apparatus is preferably 100° C. or higher and 250° C. or lower.

In reacting the precursor polymer (1) and the at least one compound (α), a catalyst may be added to promote the reaction. Examples of the catalyst include alkali metal salts and group 4 metal complexes. Examples of alkali metal salts include alkali metal hydroxides such as lithium hydroxide, sodium hydroxide, and potassium hydroxide; and alkali metal alkoxides such as lithium methoxide and sodium methoxide. Examples of group 4 metal complexes include tetra(isopropyl) orthotitanate, tetra(n-butyl) orthotitanate, and tetraoctadecyl orthotitanate. It is preferable that the loading of the catalyst be 0.01 parts by weight or more and 50 parts by weight or less with respect to 100 parts by weight of the total amount of the precursor polymer (1) and the at least one compound (α) to be used for the reaction, and the loading is more preferably 0.01 parts by weight or more and 5 parts by weight or less.

The polymer (1) preferably includes the constitutional unit (A) derived from ethylene for imparting good shape retention to the molded article comprising the resin composition according to the present invention and imparting good formability to the resin composition comprising the polymer (1) at temperatures equal to or higher than the melting peak temperature of the polymer (1). More preferably, the constitutional unit (A) derived from ethylene is forming a branched structure in the polymer for imparting good formability to the resin composition comprising the polymer (1), and, even more preferably, the branched structure is a long chain branched structure to a degree allowing polymer chains in the branched structure to tangle together.

The ratio defined for the polymer (1) as the following formula (I), A, is preferably 0.95 or lower, more preferably 0.90 or lower, and even more preferably 0.80 or lower:

$$A=\alpha_1/\alpha_0 \quad (I)$$

wherein $\alpha_1$ represents a value obtained by using a method including: measuring the absolute molecular weight and intrinsic viscosity of a polymer through gel permeation chromatography with an apparatus including a light scattering detector and a viscosity detector, plotting measurements in a manner such that logarithms of the absolute molecular weight are plotted on an abscissa and logarithms of the intrinsic viscosity are plotted on an ordinate; and performing least squares approximation for the logarithms of the absolute molecular weight and the logarithms of the intrinsic viscosity by using a formula (I-I) within the range of the logarithm of the weight-average molecular weight of the polymer or more and the logarithm of the z-average molecular weight of the polymer or less along the abscissa to derive the slope of the line representing the formula (I-I) as $\alpha_1$:

$$\log[\eta_1] = \alpha_1 \log M_1 + \log K_1 \quad \text{(I-I)}$$

wherein $[\eta_1]$ represents the intrinsic viscosity (unit: dl/g) of the polymer, $M_1$ represents the absolute molecular weight of the polymer, and $K_1$ represents a constant.

In the formula (I), $\alpha_0$ represents a value obtained by using a method including: measuring the absolute molecular weight and intrinsic viscosity of Polyethylene Standard Reference Material 1475a (produced by National Institute of Standards and Technology) through gel permeation chromatography with an apparatus including a light scattering detector and a viscosity detector, plotting measurements in a manner such that logarithms of the absolute molecular weight are plotted on an abscissa and logarithms of the intrinsic viscosity are plotted on an ordinate; and performing least squares approximation for the logarithms of the absolute molecular weight and the logarithms of the intrinsic viscosity by using a formula (I-II) within the range of the logarithm of the weight-average molecular weight of the Polyethylene Standard Reference Material 1475a or more and the logarithm of the z-average molecular weight of the Polyethylene Standard Reference Material 1475a or less along the abscissa to derive the slope of the line representing the formula (I-II) as $\alpha_0$:

$$\log[\eta_0] = \alpha_0 \log M_0 + \log K_0 \quad \text{(I-II)}$$

wherein $[\eta_0]$ represents the intrinsic viscosity (unit: dl/g) of the Polyethylene Standard Reference Material 1475a, $M_0$ represents the absolute molecular weight of the Polyethylene Standard Reference Material 1475a, and $K_0$ represents a constant. Here, in measurement of absolute molecular weight and intrinsic viscosity for the polymer and the Polyethylene Standard Reference Material 1475a by gel permeation chromatography, the mobile phase is ortho-dichlorobenzene and the measurement temperature is 155° C.

In determining absolute molecular weight from data acquired with the light scattering detector and determining intrinsic viscosity ($[\eta]$) with the viscosity detector, calculation is made by using the data processing software OmniSEC (version 4.7) from Malvern Instruments Limited with reference to the literature "Size Exclusion Chromatography, Springer (1999)".

The Polyethylene Standard Reference Material 1475a (produced by National Institute of Standards and Technology) is an unbranched high-density polyethylene. Each of the formula (I-I) and the formula (I-II), which is called "Mark-Hauwink-Sakurada equation", represents the correlation between the intrinsic viscosity and molecular weight of a polymer, and the smaller the $\alpha_1$, the larger the number of tangling polymer chains in a branched structure. Since no branched structure is formed in the Polyethylene Standard Reference Material 1475a, tangling of polymer chains in a branched structure is not generated. The smaller the A, which is the ratio of $\alpha_1$ to $\alpha_0$ of the Polyethylene Standard Reference Material 1475a, the larger the fraction of a long chain branched structure formed by the constitutional unit (A) in a polymer.

The weight-average molecular weight of the polymer (1) as measured through gel permeation chromatography with an apparatus including a light scattering detector is preferably 10000 to 1000000, more preferably 50000 to 750000, and even more preferably 100000 to 500000.

In measurement of the weight-average molecular weight of the polymer (1) through gel permeation chromatography, the mobile phase is ortho-dichlorobenzene, and the measurement temperature is 155° C.

For a more reduced load of extrusion in molding, the flow activation energy ($E_a$) of the polymer (1) is preferably 40 kJ/mol or higher, more preferably 50 kJ/mol or higher, and even more preferably 60 kJ/mol or higher. For imparting good appearance to a molded article to be obtained by extrusion, $E_a$ is preferably 100 kJ/mol or lower, more preferably 90 kJ/mol or lower, and even more preferably 80 kJ/mol or lower. The magnitude of $E_a$ primarily depends on the number of long chain branches in a polymer. A polymer including a larger number of long chain branches has higher $E_a$.

The flow activation energy ($E_a$) is determined in the following manner. First, three or more temperatures including 170° C. are selected from temperatures of 90° C., 110° C., 130° C., 150° C., and 170° C., and a melt complex viscosity-angular frequency curve is determined for a polymer at each of the temperatures (T, unit: ° C.). The melt complex viscosity-angular frequency curve is a log-log curve with logarithms of melt complex viscosities (unit: Pa-sec) on the ordinate and logarithms of angular frequencies (unit: rad/sec) on the abscissa. Next, angular frequencies and melt complex viscosities in each of the melt complex viscosity-angular frequency curves determined at the temperatures other than 170° C. are multiplied by $a_T$ and $1/a_T$, respectively, so that each of the melt complex viscosity-angular frequency curves fits just to the melt complex viscosity-angular frequency curve at 170° C. $a_T$ is a value appropriately determined so that a melt complex viscosity-angular frequency curves determined at a temperature other than 170° C. fits just to the melt complex viscosity-angular frequency curve at 170° C.

The $a_T$ is a value commonly referred to as "shift factor" and varies depending on the temperature to determine a melt complex viscosity-angular frequency curve.

Subsequently, $[\ln(a_T)]$ and $[1/(T+273.16)]$ are determined for each temperature (T), and $[\ln(a_T)]$ and $[1/(T+273.16)]$ are subjected to least squares approximation by using the following formula (II) to determine the slope, m, of the line representing the formula (II). The m is substituted into the following formula (111) to determine $E_a$.

$$\ln(a_T) = m(1/(T+273.16)) + n \quad \text{(II)}$$

$$E_a = |0.008314 \times m| \quad \text{(III)}$$

$a_T$: shift factor
$E_a$: flow activation energy (unit: kJ/mol)
T: temperature (unit: ° C.)

Commercially available calculation software may be used for the calculation, and examples of the calculation software include Ochestrator produced by TA Instruments, Inc.

The above method is based on the following principle.

It is known that melt complex viscosity-angular frequency curves (log-log curves) determined at different temperatures fit just to one parent curve (referred to as "master curve") by translation of specific distances, and this is termed "temperature-time superposition principle". The distance of translation, termed "shift factor", is a value depending on temperature, and the temperature dependence of the shift factor is known to be represented by the above formulas (II) and (III), and the formulas (II) and (I) are each called "Arrhenius-type equation".

The correlation coefficient in least squares approximation of $[\ln(a_T)]$ and $[1/(T+273.16)]$ by using the above formula (II) is controlled to be 0.9 or higher.

The determination of melt complex viscosity-angular frequency curves is performed by using a viscoelastometer (e.g., ARES, produced by TA Instruments, Inc.) typically under conditions of geometry: parallel plates, plate diameter: 25 mm, plate interval: 1.2 to 2 mm, strain: 5%, angular frequency: 0.1 to 100 rad/sec. The determination is performed under nitrogen atmosphere. It is preferable to blend in advance a proper quantity (e.g., 1000 ppm by weight) of an antioxidant to a measurement sample.

The elongational viscosity nonlinear index, k, of the polymer (1), as an indicator of intensity of strain hardening, is preferably 0.85 or higher, more preferably 0.90 or higher, and even more preferably 0.95 or higher, for excellent formability such as reduced neck-in or reduced unevenness of thickness in a resulting film in T-die film processing.

The strain hardening of a polymer is a phenomenon that the elongational viscosity of the polymer drastically increases when strain applied to the polymer exceeds a certain amount of strain. It is preferable for ease of formation of the polymer (1) or a resin composition of the present invention containing the polymer (1) into a desired shape that the index, k, be 2.00 or lower, and the index is more preferably 1.50 or lower, even more preferably 1.40 or lower, furthermore preferably 1.30 or lower, and particularly preferably 1.20 or lower.

The elongational viscosity nonlinear index, k, is determined in the following manner.

Determined are viscosity, $\eta_E 1(t)$, at each elongation time, t, during uniaxially elongating a polymer at a temperature of 110° C. and a strain rate of 1 sec$^{-1}$, and viscosity, $\eta_E 1(t)$, at each elongation time, t, during uniaxially elongating the polymer at a temperature of 110° C. and a strain rate of 0.1 sec$^{-1}$. The $\eta_E 1(t)$ and the $\eta_E 0.1(t)$ at the same, arbitrary elongation time, t, are substituted into the following formula to determine $\alpha(t)$.

$$\alpha(t) = \eta_E 1(t)/\eta_E 0.1(t)$$

Logarithms of $\alpha(t)$ ($\ln(\alpha(t))$) are plotted against elongation time, t, and $\ln(\alpha(t))$ and t within the range of t from 2.0 seconds to 2.5 seconds are subjected to least squares approximation by using the following formula. The slope of the line representing the following formula is k.

$$\ln(\alpha(t)) = kt$$

Employed is k for the case that the correlation function, r2, used in least squares approximation based on the above formula is 0.9 or higher.

The measurement of viscosity in uniaxial elongation is performed by using a viscoelastometer (e.g., ARES, produced by TA Instruments, Inc.) under nitrogen atmosphere.

In measurement of elongational viscosity, polymers including a long chain branch have a tendency to undergo drastic increase of elongational viscosity beyond the linear regime in a high-strain region, what is called "strain hardening property". The logarithm of $\alpha(t)$ ($\ln(\alpha(t))$) is known to increase in proportion to $\ln(l/l_0)$ for polymers having the strain hardening property (here, $l_0$ and l respectively represent the lengths of a sample at elongation times of 0 and t) [reference: Kiyohito Koyama, Osamu Ishizuka; Journal of Fiber Science and Technology, 37, T-258 (1981)]. For polymers having no strain hardening property, $\alpha(t)$ is 1 at any elongation time, and the slope, k, of a line obtained by plotting the logarithm of $\alpha(t)$ ($\ln(\alpha(t))$) against elongation time is 0. For polymers having the strain hardening property, the slope, k, of the line plot is not 0, particularly in a high-strain region. In the present invention, k is defined as the slope of a line obtained by plotting the logarithm of the nonlinear parameter $\alpha(t)$ ($\ln(\alpha(t))$) as a parameter indicative of the degree of the strain hardening property, against elongation time.

The polymer (1) may be forming a mixture with the compound ($\alpha$) left unreacted, or with a catalyst added to promote the reaction. It is preferable for preventing the polymer from adhering to a substrate of glass, metal, or another material that the content of the compound ($\alpha$) left unreacted in the mixture be less than 3 parts by weight with respect to 100 parts by weight of the polymer.

The polymer (1) may be a crosslinked polymer, or an uncrosslinked polymer.

In one mode, the polymer (1) is an uncrosslinked polymer (hereinafter, referred to as "polymer ($\alpha$)").

The polymer ($\alpha$) has a gel fraction, which is described later, of less than 20 wt %.

It is preferable that the proportion of the number of the constitutional unit (A), the constitutional unit (B), and the constitutional unit (C) in total in the polymer ($\alpha$) be 90% or more with respect to 100% of the total number of all constitutional units included in the polymer, and the proportion of the number is more preferably 95% or more, and even more preferably 100%.

<Crosslinked Polymer>

In one mode, the polymer (1) is crosslinked. Specifically, at least a part of molecules of the polymer (1) are linked together via intermolecular covalent bonding.

Examples of methods for crosslinking the polymer (1) include a method of crosslinking through irradiation with ionizing radiation and a method of crosslinking with an organic peroxide.

In crosslinking through irradiating the polymer (1) with ionizing radiation, the polymer ($\alpha$) molded into a desired shape in advance is typically irradiated with ionizing radiation. Any known method can be used for molding, and extrusion, injection molding, and press molding are preferred. The molded article to be irradiated with ionizing radiation may be a molded article containing the polymer (1) as the only resin component, or a molded article containing the polymer (1) and a polymer different from the polymer (1). In the latter case, examples of the polymer different from the polymer (1) include a polymer (2) described later. In the case that the molded article contains the polymer (1) and the polymer (2), it is preferable that the content of the polymer (1) be 30 wt % or more and 99 wt % or less, with respect to 100 wt % of the total amount of the polymer (1) and the polymer (2).

Examples of ionizing radiation include $\alpha$-rays, $\beta$-rays, $\gamma$-rays, electron beams, neutron beams, and X-rays, and $\gamma$-rays from cobalt-60 and electron beams are preferred. In the case that the molded article containing the polymer (1) is in the form of a sheet, at least one surface of the molded article in the form of a sheet can be suitably irradiated with ionizing radiation.

Irradiation with ionizing radiation is performed by using a known ionizing radiation irradiator, and the dose is typically 5 to 300 kGy, and preferably 10 to 150 kGy. The polymer (1) can attain a higher degree of crosslinking with a dose lower than those in typical cases.

In obtaining the polymer (1) crosslinked through irradiation with ionizing radiation, a higher degree of crosslinking is achieved for the polymer (1) if the molded article to be irradiated with ionizing radiation contains a crosslinking aid. The crosslinking aid is for the purpose of increasing the degree of crosslinking of the polymer (1) to improve the mechanical properties, and a compound including a plurality of double bonds in the molecule is preferably used.

Examples of the crosslinking aid include N,N'-m-phenylene bismaleimide, toluylene bismaleimide, triallyl isocyanurate, triallyl cyanurate, p-quinone dioxime, nitrobenzene, diphenylguanidine, divinylbenzene, ethylene glycol dimethacrylate, polyethylene glycol dimethacrylate, trimethylolpropane trimethacrylate, trimethylolpropane triacrylate, and allyl methacrylate. More than one of these crosslinking aids may be used in combination.

It is preferable that the loading of the crosslinking aid be 0.01 to 4.0 parts by weight with respect to 100 parts by weight of the total weight of the polymer (1) and the polymer different from the polymer (1) contained in the molded article to be irradiated with ionizing radiation, and it is more preferable that the loading of the crosslinking aid be 0.05 to 2.0 parts by weight Examples of the method of crosslinking with an organic peroxide include a method of crosslinking of the polymer (α) by subjecting a resin composition containing the polymer (α) and an organic peroxide to a known molding method involving heating. Examples of the known molding method involving heating include extrusion, injection molding, and press molding. The resin composition containing the polymer (α) and an organic peroxide may contain the polymer (1) as the only resin component, or contain the polymer (1) and a polymer different from the polymer (1).

In the case that the resin composition containing the polymer (α) and an organic peroxide contains a polymer different from the polymer (1), examples of the polymer different from the polymer (1) include a polymer (2) described later, and it is preferable that the content of the polymer (1) be 30 wt % or more and 99 wt % or less with respect to 100 wt % of the total amount of the polymer (1) and the polymer (2).

In crosslinking with an organic peroxide, an organic peroxide having a decomposition temperature equal to or higher than the fluidizing temperature of the resin component contained in the composition containing the polymer (α) and an organic peroxide is suitably used, and preferred examples of the organic peroxide include dicumyl peroxide, 2,5-dimethyl-2,5-di-tert-butylperoxyhexane, 2,5-dimethyl-2,5-di-tert-butylperoxyhexyne, α,α-di-tert-butylperoxyisopropylbenzene, and tert-butylperoxy-2-ethylhexyl carbonate.

The crosslinked polymer (1) may contain a known additive, as necessary. Examples of the additive include flame retardants, antioxidants, weatherproofing agents, lubricants, anti-blocking agents, antistatics, anti-fogging agents, anti-drip agents, pigments, and fillers. These additives can be added through kneading with the polymer (1) before crosslinking.

The gel fraction of the crosslinked polymer (1) is preferably 20 wt % or more, more preferably 40 wt % or more, even more preferably 60 wt % or more, and the most preferably 70 wt % or more. The gel fraction is indicative of the degree of crosslinking of a crosslinked polymer, and a situation that the gel fraction of a polymer is high indicates that the polymer has a high degree of crosslinked structure and a more robust network structure is formed. If the gel fraction of a polymer is high, the polymer has high shape retention, and is less likely to deform.

The gel fraction is determined in the following manner. Approximately 500 mg of a polymer and an empty mesh basket fabricated from a metal mesh (mesh size: 400 mesh) are weighed. The mesh basket encapsulating the polymer and 50 mL of xylene (Grade of Guaranteed reagent produced by KANTO CHEMICAL CO., INC., or an equivalent product; mixture of o-, m-, and p-xylenes and ethylbenzene, total weight of o-, m-, and p-xylenes: 85 wt % or more) are introduced into a 100 mL test tube, and subjected to heating extraction at 110° C. for 6 hours. After the extraction, the mesh basket with an extraction residue is removed from the test tube, and dried under reduced pressure by using a vacuum dryer at 80° C. for 8 hours, and the mesh basket with an extraction residue after drying is weighed. The gel weight is calculated from the difference in weight between the mesh basket with an extraction residue after drying and the mesh basket when being empty. The gel fraction (wt %) is calculated on the basis of the following formula.

Gel fraction=(Gel weight/Weight of measurement sample)×100

<Thermally Conductive Material (3)>

The resin composition according to the present invention comprises a thermally conductive material (3) having a thermal conductivity of 1 W/(m·K) or higher. Herein, thermal conductivity is a coefficient indicative of the degree of allowance for heat transfer, and means the amount of heat transferred through a unit area for a unit time when there is a temperature difference of 1° C. per unit thickness. Thermal conductivity is measured, for example, by using a hot disk method (ISO/CD22007-2), a probe method (JIS R2616), a heat flow method (ASTM E1530), or a laser flash method (JIS R1611).

It is preferable that the thermal conductivity of the thermally conductive material (3) be 10 W/(m·K) or higher, it is more preferable that the thermal conductivity be 100 W/(m·K) or higher, and it is even more preferable that the thermal conductivity be 1000 W/(m·K) or higher.

Examples of the thermally conductive material (3) having a thermal conductivity of 1 W/(m·K) or higher include metals, low-melting point alloys, metal oxides, metal nitrides, metal carbides, metal carbonates, metal hydroxides, carbon materials, potassium titanate, talc, and wollastonite.

Examples of metals include aluminum, nickel, and copper.

Examples of low-melting point alloys include low-melting point alloys with a liquidus temperature of 300° C. or higher and a solidus temperature of 150° C. or higher and 250° C. or lower.

Examples of metal oxides include aluminum oxide, magnesium oxide, silicon oxide, beryllium oxide, copper oxide, and copper suboxide.

Examples of metal nitrides include aluminum nitride, silicon nitride, and boron nitride.

Examples of metal carbides include silicon carbide.

Examples of metal carbonates include magnesium carbonate.

Examples of metal hydroxides include aluminum hydroxide and magnesium hydroxide.

Examples of carbon materials include graphite, carbon fibers, carbon nanotubes, and diamond.

The form of the thermally conductive material (3) is not limited, and examples thereof include various forms such as the forms of a scale, a fiber, a flake, a plate, a sphere, a particle, a fine particle, a nanoparticle, an agglomerate, a tube, a nanotube, a wire, a rod, an irregular object, an object like a rugby ball, a hexahedral, a composite particle of a large particle and a fine particle, and liquid.

Examples of the thermally conductive material (3) in the form of a fiber include glass fibers, carbon fibers, whiskers of potassium titanate, and silicon nitride fibers.

Examples of the thermally conductive material (3) in the form of a nanotube include carbon nanotubes and boron nitride nanotubes.

The thermally conductive material (3) may be a natural material or a synthesized material.

In the case of a natural material, the production area is not limited and any production area can be appropriately selected.

The resin composition according to the present invention may contain only one thermally conductive material (3), or two or more thermally conductive materials (3).

It is preferable that the thermally conductive material (3) be graphite.

Although the graphite may be any of natural graphite and artificial graphite and combination of them may be used, natural graphite is preferred for availability at low cost.

The graphite may be any of α-graphite and β-graphite, and they may be combined.

Examples of graphite include scale graphite, fibrous graphite, bulk graphite, earthy graphite, and spherical graphite.

It is more preferable that the thermally conductive material (3) be scale graphite. Scale graphite is a graphite particle having an appearance of a thin scale.

In the molded article comprising the resin composition according to the present invention, the volume-average particle diameter of the scale graphite contained in the molded article is preferably 40 μm or larger, and more preferably 50 μm or larger, for improvement of the thermal conduction of the molded article. The volume-average particle diameter of the scale graphite contained in the molded article is preferably 700 μm or smaller, more preferably 500 μm or smaller, and even more preferably 300 μm or smaller, for the strength of the molded article. Volume-average particle diameter can be measured, for example, by a laser diffraction method or a light scattering method.

It is preferable for improvement of the thermal conduction of the molded article comprising the resin composition according to the present invention that the fixed carbon content of the scale graphite be 98 mass % or more, and the fixed carbon content is more preferably 98.5 mass %, and even more preferably 99 mass % or more. The fixed carbon content can be measured in accordance with JIS M8511.

It is preferable that the aspect ratio of the scale graphite in the molded article be 21 or higher. Although the higher the aspect ratio is, the more preferred the aspect ratio is, and the upper limit of the aspect ratio is not limited, a preferable range is 10000 or lower, a more preferable range is 5000 or lower, and an even more preferable range is 3000 or lower. The aspect ratio can be calculated from the latitudinal and longitudinal lengths measured by using an electron microscope or the like.

Although the particle size distribution of the scale graphite is not limited, the ratio between D20 and D80, D80/D20, where D20 and D80 are diameters at which a cumulative volume acquired in measurement of particle size distribution reaches 20% and 80%, respectively, is preferably 1 to 20, more preferably 1 to 10, and even more preferably 1 to 5.

The resin composition according to the present invention is produced by melt-kneading the polymer (1), the scale graphite, and, as necessary, an additional component. The larger the volume-average particle diameter of the scale graphite as a raw material before melt-kneading is, the more preferred the volume-average particle diameter is, and the volume-average particle diameter is preferably 200 to 700 μm, more preferably 230 to 650 μm, and even more preferably 250 to 400 μm. The aspect ratio of the scale graphite before melt-kneading is preferably 21 or higher. With respect to the upper limit of the aspect ratio, the higher the better, and the upper limit of the aspect ratio is not particularly limited, but a preferable range is 3000 or lower, a more preferred range is 1000 or lower, and an even more preferred range is 500 or lower. The fixed carbon content is assumed to remain unchanged after melt-kneading or molding. Because graphite is generally crushed in melt-kneading or molding, the volume-average particle diameter of the scale graphite is kept larger after melt-kneading or molding as the volume-average particle diameter of the scale graphite before melt-kneading is larger, and the thermal conductivity and formability are improved.

In addition to the scale graphite, the resin composition according to the present invention may contain graphite having a form or properties different from those of the scale graphite.

<Resin Composition>

The resin composition according to the present invention comprising: the polymer (1) and a thermally conductive material (3), wherein the content of the thermally conductive material (3) is 1 part by weight or more and 80 parts by weight or less with respect to 100 parts by weight of the total amount of polymer components contained in the resin composition.

It is preferable that the content of the thermally conductive material (3) be 5 parts by weight or more with respect to 100 parts by weight of the total amount of polymer components contained in the resin composition, and it is more preferable that the content of the thermally conductive material (3) be 10 parts by weight or more. It is preferable for formability of the composition that the content of the thermally conductive material (3) be 60 parts by weight or less with respect to 100 parts by weight of the total amount of polymer components contained in the resin composition, and it is more preferable that the content of the thermally conductive material (3) be 40 parts by weight or less.

In one mode, the resin composition may further contain a polymer (2) different from the polymer (1) and having a melting peak temperature or glass transition temperature of 50° C. or higher and 180° C. or lower observed in differential scanning calorimetry, and, in this case, the content of the polymer (1) is 30 wt % or more and 99 wt % or less and the content of the polymer (2) is 1 wt % or more and 70 wt % or less, with respect to 100 wt % of the total amount of the polymer (1) and the polymer (2). Regarding the contents of the polymer (1) and the polymer (2) with respect to 100 wt % of the total amount of the polymer (1) and the polymer (2), it is preferable that the content of the polymer (1) be 40 wt % or more and 95 wt % or less and the content of the polymer (2) be 5 wt % or more and 60 wt % or less, it is more preferable that the content of the polymer (1) be 50 wt % or more and 90 wt % or less and the content of the polymer (2) be 10 wt % or more and 50 wt % or less, and it is even more preferable that the content of the polymer (1) be 60 wt % or more and 85 wt % or less and the content of the polymer (2) be 15 wt % or more and 40 wt % or less.

In one mode, it is preferable that the polymer (2) be a polymer different from polymers to be excluded as defined later and having a melting peak temperature or glass transition temperature of 50° C. or higher and 180° C. or lower observed in differential scanning calorimetry. In this case, it is preferable that the content of the polymer (1) be 30 wt % or more and 99 wt % or less and the content of the polymer (2) be 1 wt % or more and 70 wt % or less, with respect to 100 wt % of the total amount of the polymer (1) and the polymer (2).

Polymers to be excluded: polymers including the constitutional unit (B) represented by the following formula (1).

[Chemical Formula 32]

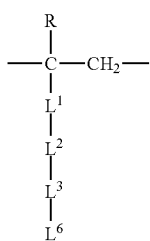

formula (1)

wherein
R represents a hydrogen atom or a methyl group;
$L^1$ represents a single bond, —CO—O—, —O—CO—, or —O—;
$L^2$ represents a single bond, —CH$_2$—, —CH$_2$—CH$_2$—, —CH$_2$—CH$_2$—CH$_2$—, —CH$_2$—CH(OH)—CH$_2$—, or —CH$_2$—CH(CH$_2$OH)—;
$L^3$ represents a single bond, —CO—O—, —O—CO—, —O—, —CO—NH—, —NH—CO—, —CO—NH—CO—, —NH—CO—NH—, —NH—, or —N(CH$_3$)—;
$L^6$ represents an alkyl group having 14 or more and 30 or less carbon atoms; and
the left side and right side of each of the horizontal chemical formulas for describing the chemical structures of $L^1$, $L^2$, and $L^3$ correspond to the upper side of the formula (1) and the lower side of the formula (1), respectively.

The polymer (1) may consist of two or more polymers, and the polymer (2) may consist of two or more polymers.

The melting peak temperature or glass transition temperature of the polymer (2) observed in differential scanning calorimetry (DSC) is in the range of 50° C. or higher and 180° C. or lower. The melting peak temperature of the polymer (2) is a temperature at a melting peak top determined through analysis of a melting curve acquired in differential scanning calorimetry described later by using a method in accordance with JIS K7121-1987, and a temperature at which heat of fusion absorbed is maximized.

The glass transition temperature of the polymer (2) is an intermediate glass transition temperature determined through analysis of a melting curve acquired in differential scanning calorimetry described later by using a method in accordance with JIS K7121-1987.

[Differential Scanning Calorimetry]

In a differential scanning calorimeter under nitrogen atmosphere, an aluminum pan encapsulating approximately 5 mg of a sample therein is (1) retained at 200° C. for 5 minutes, and then (2) cooled from 200° C. to −50° C. at a rate of 5° C./min, and then (3) retained at −50° C. for 5 minutes, and then (4) warmed from −50° C. to 200° C. at a rate of 5° C./min. A differential scanning calorimetry curve acquired in the calorimetry of the process (4) is defined as a melting curve.

Examples of the polymer (2) having a melting peak temperature in the range of 50° C. or higher and 180° C. or lower include high-density polyethylene (HDPE), high-pressure low-density polyethylene (LDPE), ethylene-α-olefin copolymer, ethylene-vinyl acetate copolymer (EVA), and polypropylene (PP).

Examples of the polymer (2) having a glass transition temperature in the range of 50° C. or higher and 180° C. or lower include cyclic olefin polymer (COP), cyclic olefin copolymer (COC), polystyrene (PS), polyvinyl chloride (PVC), acrylonitrile-styrene copolymer (AS), acrylonitrile-butadiene-styrene copolymer (ABS), polymethyl methacrylate (PMMA), polyvinyl alcohol (PVA), polyethylene terephthalate (PET), polyacrylonitrile (PAN), polyamide 6 (PA6), polyamide 66 (PA66), polycarbonate (PC), polyphenylene sulfide (PPS), and polyether ether ketone (PEEK).

The ethylene-α-olefin copolymer as the polymer (2) is a copolymer including a constitutional unit derived from ethylene and a constitutional unit derived from α-olefin. Examples of the α-olefin include propylene, 1-butene, 1-pentene, 1-hexene, 1-heptene, 1-octene, 4-methyl-1-pentene, and 4-methyl-1-hexene, and the α-olefin may be one of these, or two or more thereof. The α-olefin is preferably an α-olefin having four to eight carbon atoms, and more preferably 1-butene, 1-hexene, or 1-octene.

The density of the high-density polyethylene, high-pressure low-density polyethylene, or ethylene-α-olefin copolymer is 860 kg/m$^3$ or higher and 960 kg/m$^3$ or lower.

Examples of the polypropylene as the polymer (2) include propylene homopolymer, propylene random copolymer described later, and propylene polymer material described later. The content of the constitutional unit derived from propylene in the polypropylene is more than 50 wt % and 100 wt % or less (assuming the total amount of the constitutional units constituting the polypropylene as 100 wt %). It is preferable that the melting peak temperature of the polypropylene be 100° C. or higher.

The propylene random copolymer is a random copolymer including a constitutional unit derived from propylene and at least one constitutional unit selected from the group consisting of a constitutional unit derived from ethylene and a constitutional unit derived from α-olefin. Examples of the propylene random copolymer include propylene-ethylene random copolymer, propylene-ethylene-α-olefin random copolymer, and propylene-α-olefin random copolymer. It is preferable that the α-olefin be an α-olefin having 4 to 10 carbon atoms, and examples of such α-olefin include linear α-olefin such as 1-butene, 1-pentene, 1-hexene, 1-octene, and 1-decene, and branched α-olefin such as 3-methyl-1-butene and 3-methyl-1-pentene. The α-olefin included in the propylene random copolymer may be one α-olefin or two or more α-olefins.

Examples of methods for producing the propylene homopolymer and propylene random copolymer include polymerization methods including a slurry polymerization method, solution polymerization method, bulk polymerization method, and gas phase polymerization method with a Ziegler-Natta catalyst or a complex catalyst such as a metallocene catalyst and a non-metallocene catalyst.

The propylene polymer material is a polymer material consisting of a propylene homopolymer component (I) and an ethylene copolymer component (II), wherein the ethylene copolymer component (II) includes: at least one constitutional unit selected from the group consisting of a constitutional unit derived from propylene and a constitutional unit derived from α-olefin having four or more carbon atoms; and a constitutional unit derived from ethylene.

Examples of the α-olefin having four or more carbon atoms in the ethylene copolymer component (II) include 1-butene, 1-pentene, 1-hexene, 1-heptene, 1-octene, 1-nonene, 1-decene, 1-undecene, 1-dodecene, 1-tridecene, 1-tetradecene, 1-pentadecene, 1-hexadecene, 1-heptadecene, 1-octadecene, 1-nonadecene, 1-eicosene, 3-methyl-1-butene, 3-methyl-1-pentene, 4-methyl-1-pentene, 2-ethyl-1-hexene, and 2,2,4-trimethyl-1-pentene. It is preferable that the α-olefin having four or more carbon atoms be an α-olefin having 4 or more and 20 or less carbon atoms, it is more preferable that the α-olefin having four or more carbon atoms be an α-olefin having 4 or more and 10 or less carbon atoms, and it is even more preferable that the α-olefin having four or more carbon atoms be 1-butene, 1-hexene, or 1-octene. The α-olefin having four or more carbon atoms included in the ethylene copolymer component (II) may be one α-olefin or two or more α-olefins.

Examples of the ethylene copolymer component (II) include propylene-ethylene copolymer, ethylene-1-butene copolymer, ethylene-1-hexene copolymer, ethylene-1-octene copolymer, propylene-ethylene-1-butene copolymer, propylene-ethylene-1-hexene copolymer, and propylene-ethylene-1-octene copolymer. The ethylene copolymer component (II) may be a random copolymer or a block copolymer.

The propylene polymer material can be produced through multistage polymerization with a polymerization catalyst. For example, the propylene polymer material can be produce in a manner such that the propylene homopolymer component (I) is produced in the former polymerization step, and the ethylene copolymer component (II) is produced in the latter polymerization step.

Examples of the polymerization catalyst for production of the propylene polymer material include the catalysts for production of the propylene homopolymer and the propylene random copolymer.

Examples of polymerization methods in the polymerization steps of production of the propylene polymer material include a bulk polymerization method, solution polymerization method, slurry polymerization method, and gas phase polymerization method. Examples of inert hydrocarbon solvent for a solution polymerization method and slurry polymerization method include propane, butane, isobutane, pentane, hexane, heptane, and octane. Two or more of these polymerization methods may be combined, and these polymerization methods may be in a batch mode or a continuous mode. It is preferable that the polymerization method in production of the propylene polymer material be continuous gas phase polymerization or bulk-gas phase polymerization in which bulk polymerization and gas phase polymerization are sequentially performed.

The polypropylene as the polymer (2) is preferably propylene homopolymer.

The polymer (1) may consist of two or more polymers, the thermally conductive material (3) may consist of two or more materials, and the polymer (2) to be optionally contained may consist of two or more polymers.

It is preferable for formability that the melt flow rate (MFR) of the resin composition according to the present invention as measured in accordance with JIS K7210 at a temperature of 230° C. with a load of 2.16 kgf be 0.1 g/10 min or higher and 30 g/10 min or lower.

The gel fraction of the resin composition according to the present invention is preferably 20 wt % or more, more preferably 40 wt % or more, even more preferably 60 wt % or more, and the most preferably 70 wt % or more. The gel fraction is indicative of the degree of crosslinking of a crosslinked polymer, and a situation that the gel fraction of a resin composition is higher indicates that the polymer contained in the resin composition has a higher degree of crosslinked structure and a more robust network structure is formed. If the gel fraction of a resin composition is higher, the resin composition has higher shape retention, and is less likely to deform.

The gel fraction is determined in the following manner. Approximately 500 mg (corresponding to the weight of a measurement sample) of a polymer constituting a resin composition and an empty mesh basket fabricated from a metal mesh (mesh size: 400 mesh) are weighed. The mesh basket encapsulating the polymer and 50 mL of xylene (Grade of Guaranteed reagent produced by KANTO CHEMICAL CO., INC., or an equivalent product; mixture of o-, m-, and p-xylenes and ethylbenzene, total weight of o-, m-, and p-xylenes: 85 wt % or more) are introduced into a 100 mL test tube, and subjected to heating extraction at 110° C. for 6 hours. After the extraction, the mesh basket with an extraction residue is removed from the test tube, and dried under reduced pressure by using a vacuum dryer at 80° C. for 8 hours, and the mesh basket with an extraction residue after drying is weighed. The gel weight is calculated from the difference in weight between the mesh basket with an extraction residue after drying and the mesh basket when being empty. The gel fraction (wt %) is calculated on the basis of the following formula.

Gel fraction=(Gel weight/Weight of measurement sample)×100

The resin composition according to the present invention may contain an additive such as an inorganic filler, an organic filler, an antioxidant, a weatherproofing agent, a UV absorber, a thermal stabilizer, a light stabilizer, an antistatic, a crystal-nucleating agent, a pigment, an adsorbent, a metal chloride, hydrotalcite, an aluminate, a lubricant, and a silicone compound.

In the case that the resin composition according to the present invention contains an additive, the additive may be blended in advance in one or more raw materials to be used in production of a polymer to be contained in the resin composition (the polymer (1) or a polymer different therefrom (e.g., the polymer (2))), or blended after a polymer to be contained in the resin composition is produced. In the case that a polymer to be contained in the resin composition is produced and an additive is then blended, the additive can be blended while the polymer is melt-kneaded. For example, the additive can be blended in producing the resin composition with melt-kneading the polymer (1) and a polymer different therefrom (e.g., the polymer (2)) to be used as necessary. Alternatively, the additive can be blended while a polymer and the thermally conductive material (3) are melt-kneaded.

It is preferable that the blend ratio of the additive be 0.001 parts by weight or more and 10 parts by weight or less with respect to 100 parts by weight of the resin composition according to the present invention, it is more preferable that the blend ratio of the additive be 0.005 parts by weight or more and 5 parts by weight or less, and it is even more preferable that the blend ratio of the additive be 0.01 parts by weight or more and 1 part by weight or less.

Examples of inorganic fillers include talc, calcium carbonate, and calcined kaolin.

Examples of organic fillers include fibers, wood flours, and cellulose powders.

Examples of antioxidants include phenol-based antioxidants, sulfur-containing antioxidants, phosphorus-containing antioxidants, lactone antioxidants, and vitamin antioxidants.

Examples of UV absorbers include benzotriazole-based UV absorbers, tridiamine-based UV absorbers, anilide UV absorbers, and benzophenone-based UV absorbers.

Examples of light stabilizers include hindered amine light stabilizers and benzoate light stabilizers.

Examples of pigments include titanium dioxide and carbon black.

Examples of adsorbents include metal oxides such as zinc oxide and magnesium oxide.

Examples of metal chlorides include iron chloride and calcium chloride.

Examples of lubricants include fatty acids, higher alcohols, aliphatic amides, and aliphatic esters.

The resin composition according to the present invention and a molded article of the resin composition can be used as a heat storage material.

The heat storage material containing the resin composition according to the present invention is excellent in formability and shape retention, and thus the form is arbitrary, and examples thereof include the forms of a sphere, a cuboid (cube), a particle (bead), a cylinder (pellet), a powder, a bar (stick), a needle, a filament (fiber), a strand, a thread, a string, a code, a rope, a plate, a sheet, a membrane (film), a woven fabric, a nonwoven fabric, a box (capsule), and a foam, and any other three-dimensional form, and any form can be selected in accordance with the purpose of use.

The heat storage material in the form of a sphere, a cuboid (cube), a particle (bead), a cylinder (pellet), or a powder may be formed of a core-shell structure in which the resin composition according to the present invention is covered with a material different from the resin composition according to the present invention, or a core-shell structure in which a material different from the resin composition according to the present invention is covered with the resin composition according to the present invention. The material different from the resin composition according to the present invention is a polymer different from the resin composition according to the present invention, a metal, or an inorganic substance except metals.

The heat storage material in the form of a bar (stick), a needle, a filament (fiber), a strand, a thread, a string, a code, or a rope may be formed of a core-sheath structure in which the resin composition according to the present invention is covered with a material different from the resin composition according to the present invention, or a core-sheath structure in which a material different from the resin composition according to the present invention is covered with the resin composition according to the present invention.

The heat storage material in the form of a plate, a sheet, a membrane (film), a woven fabric, a nonwoven fabric, or a box (capsule) may be formed of a laminate structure in which both surfaces or one surface are/is covered with a material different from the resin composition according to the present invention, or a laminate structure in which both surfaces or one surface of a material different from the resin composition according to the present invention are/is covered with the resin composition according to the present invention.

The heat storage material in the form of a foam may form a core-shell structure, core-sheath structure, or laminate structure with the heat storage material having a form different from the form of a foam or a material different from the resin composition according to the present invention.

The heat storage material can be formed into any three-dimensional form, for example, by extrusion, injection molding, vacuum molding, blow molding, or rolling, and can be subjected to multilayer molding with a material different from the resin composition according to the present invention.

The heat storage material can be suitably used as a heat storage layer in a laminate described in the following.

[Laminate]

The laminate according to an embodiment of the present invention comprises: a heat storage layer (1) comprising the resin composition; and a thermally conductive layer (2) containing a thermally conductive material (3) having a thermal conductivity of 1 W/(m·K) or higher in an amount of 90 wt % or more with respect to 100 wt % of the total weight of the thermally conductive layer (2).

<Heat Storage Layer (1)>

The heat storage layer (1) consists of the resin composition. The thickness of the heat storage layer (1) is not limited and can be appropriately determined in accordance with the type of an element, a device, or the like in which the laminate is to be installed, and, for example, is 0.01 mm to 100 mm. The size of the heat storage layer (1) is not limited and can be appropriately determined in accordance with the type of an element, a device, or the like in which the laminate is to be installed, and, for example, is a square of 1 mm×1 mm to 100 cm×100 cm.

The form of the heat storage layer (1) is not limited, and examples thereof include various forms such as the forms of a sheet, a plate, and a film.

<Thermally Conductive Layer (2)>

The thermally conductive layer (2) contains a thermally conductive material (3) having a thermal conductivity of 1 W/(m·K) or higher in an amount of 90 wt % or more with respect to 100 wt % of the total weight of the thermally conductive layer (2).

It is preferable that the thermal conductivity of the thermally conductive material (3) be 10 W/(m·K) or higher, it is more preferable that the thermal conductivity of the thermally conductive material (3) be 100 W/(m·K) or higher, and it is even more preferable that the thermal conductivity of the thermally conductive material (3) be 1000 W/(m·K) or higher.

Examples of the thermally conductive material (3) having a thermal conductivity of 1 W/(m·K) or higher include the materials described above.

It is preferable that the thermally conductive material (3) be graphite.

Although the graphite may be any of natural graphite and artificial graphite and combination of them may be used, natural graphite is preferred for availability at low cost.

The graphite may be any of α-graphite and β-graphite, and they may be combined.

Examples of graphite include scale graphite, fibrous graphite, bulk graphite, earthy graphite, and spherical graphite.

The thermally conductive layer (2) may contain only one thermally conductive material (3), or two or more thermally conductive materials (3). The thermally conductive material (3) contained in the thermally conductive layer (2) may be the same as or different from the thermally conductive material (3) contained in the resin composition in the heat storage layer (1).

It is preferable that the amount of the thermally conductive material (3) in the thermally conductive layer (2) be 95 wt % or more, it is more preferable that the amount of the thermally conductive material (3) in the thermally conductive layer (2) be 99 wt % or more, and it is even more preferable that the amount of the thermally conductive material (3) in the thermally conductive layer (2) be 99.9 wt % or more with respect to 100 wt % of the total weight of the thermally conductive layer (2).

In addition to the thermally conductive material (3), the thermally conductive layer (2) may contain, for example, an acrylic resin or an epoxy resin.

The form of the thermally conductive material (3) contained in the thermally conductive layer (2) is not limited, and examples thereof include various forms such as the forms of a scale, a fiber, a flake, a plate, a sphere, a particle, a fine particle, a nanoparticle, an agglomerate, a tube, a nanotube, a wire, a rod, an irregular object, an object like a rugby ball, a hexahedral, a composite particle of a large particle and a fine particle, and liquid.

The form of the thermally conductive layer (2) is not limited, and examples thereof include various forms such as the forms of a sheet, a plate, and a film.

The thickness of the thermally conductive layer (2) is not limited and can be appropriately determined in accordance with the type of an element, a device, or the like in which the laminate is to be installed, and, for example, is 0.01 mm to 100 mm. The size of the thermally conductive layer (2) is not limited and can be appropriately determined in accordance with the type of an element, a device, or the like in which the laminate is to be installed, and, for example, is a square of 1 mm×1 mm to 100 cm×100 cm.

The ratio between the thickness of the heat storage layer (1) and the thickness of the thermally conductive layer (2) is, for example, 1:1 to 10000:1, and it is preferable that the ratio be 1:1 to 1:1000, and it is more preferable that the ratio be 1:1 to 1:100.

The ratio between the area of the heat storage layer (1) and the area of the thermally conductive layer (2) is, for example, 1:0.1 to 1:10, and it is preferable that the ratio be 1:0.2 to 1:5, and it is more preferable that the ratio be 1:0.5 to 1:2.

<Laminate>

The laminate comprises the heat storage layer (1) and the thermally conductive layer (2). The heat storage layer (1) and the thermally conductive layer (2) in the laminate may be laminated in direct contact or laminated with an additional layer sandwiched therebetween. Examples of the additional layer include an adhesive layer. It is preferable for suppression of temperature elevation in heat-generating members that the adhesive layer have a thermal conductivity of 0.1 W/(m·K) or higher as a property. Examples of the adhesive include thermally conductive acrylic adhesives, thermally conductive epoxy adhesives, and thermally conductive silicone adhesives.

Because the heat storage layer (1) efficiently absorbs heat, the laminate according to the present invention can efficiently protect electronic parts (members including heat-generating members) constituting an electronic device from heat generated from electronic parts (heat-generating members). Because the thermally conductive layer (2) efficiently conducts heat to the heat storage layer (1), the laminate according to the present invention can more efficiently protect electronic parts (members including heat-generating members).

In installing the laminate in an electronic device, it is preferable, in one mode, that the laminate be placed in a manner such that the thermally conductive layer (2) is disposed in the heat-generating member side in the electronic device. This allows efficient conduction of heat from a heat-generating member to the heat storage layer (1), and the heat storage layer (1) can efficiently absorb the heat. It is preferable that the laminate have an area larger than that of a heat-generating member. Because this allows the thermally conductive layer (2) with such a larger area to disperse heat locally generated by the heat-generating member to conduct the heat to the heat storage layer (1), the laminate according to the present invention can more efficiently conduct heat even in the case that a larger amount of heat is locally generated such as cases with highly integrated electronic parts.

In using the laminate as a member of an electronic device to be used in contact with a human body, for example, the laminate in the form of a plate or a sheet can be suitably used to inhibit heat generated from heat-generating members constituting an electronic device from being conducted to a human body via a housing constituting the electronic device.

Because the resin composition constituting the heat storage layer (1) in the laminate is not liquefied through absorption of heat, the heat storage layer (1) can be formed, in one mode, without being encapsulated in a capsule or the like. Thus, a step of encapsulating is not needed and a problem such as the breakage of a capsule in molding does not arise, which allows production of the laminate in a simple manner. Since a problem such as the breakage of a capsule does not arise in electric devices, there is no possibility of impacting on electric devices, leading to superiority in safety.

Examples of electronic devices include televisions, Blu-ray recorders and/or players, DVD recorders and/or players, monitors, displays, projectors, rear-projection televisions, stereo components, boomboxes, digital cameras, digital video cameras, cellular phones, smartphones, laptop computers, desktop computers, tablet PCs, PDAs, printers, 3D printers, scanners, video game consoles, handheld game consoles, batteries for electronic devices, and transformers for electronic devices.

Examples of heat-generating members in electronic devices include integrated circuits, semiconductors, capacitors, motors, and batteries. The laminate and a heat-generating member may be adhered via an adhesive layer. It is preferable for suppression of temperature elevation in heat-generating members that the adhesive layer have a thermal conductivity of 0.5 W/(m·K) or higher as a property.

Examples of the adhesive include thermally conductive acrylic adhesives, thermally conductive epoxy adhesives, and thermally conductive silicone adhesives.

EXAMPLES

Hereinafter, the present invention will be described in more detail with reference to Examples and Comparative Examples.

[1] Proportions of the Number of Constitutional Unit (A) Derived from Ethylene, Constitutional Unit (B) Represented by Formula (1), and Constitutional Unit (C) Represented by Formula (2) Included in Polymer (1) (Unit: %)

Nuclear magnetic resonance spectra (hereinafter, abbreviated as "NMR spectra") were determined by using a nuclear magnetic resonance spectrometer (NMR) under the following measurement conditions.

<Carbon Nuclear Magnetic Resonance ($^{13}$C-NMR) Measurement Conditions>

Apparatus: AVANCE III 600HD produced by Bruker BioSpin GmbH

Measurement probe: 10 mm CryoProbe

Measurement solvent: mixed solvent of 1,2-dichlorobenzene/1,1,2,2-tetrachloroethane-$d_2$=85/15 (volume ratio)

Sample concentration: 100 mg/mL
Measurement temperature: 135° C.
Measurement method: proton decoupling method
Number of scans: 256
Pulse width: 45 degrees
Pulse repetition time: 4 seconds
Measurement reference: tetramethylsilane <Proportions of the Number of Constitutional Unit ($A_1$) Derived from Ethylene and Constitutional Unit ($C_1$) Derived from Methyl Acrylate Included in Ethylene-Methyl Acrylate Copolymer> (Unit: %)

Integrated values in the following ranges of $a_1$, $b_1$, $c_1$, $d_1$, and $e_1$ were determined from the $^{13}$C-NMR spectrum acquired for ethylene-methyl acrylate copolymer under the $^{13}$C-NMR measurement conditions, and the contents (proportions of the number) of three dyads (EE, EA, AA) were determined by using the following formulas, and the proportions of the number of the constitutional unit ($A_1$) derived from ethylene and the constitutional unit ($C_1$) derived from methyl acrylate were calculated from the contents. EE represents an ethylene-ethylene dyad, EA represents an ethylene-methyl acrylate dyad, and AA represents a methyl acrylate-methyl acrylate dyad.

$a_1$: 28.1-30.5 ppm
$b_1$: 31.9-32.6 ppm
$c_1$: 41.7 ppm
$d_1$: 43.1-44.2 ppm
$e_1$: 45.0-46.5 ppm $$EE = a_1/4 + b/2$$

$$EA = e_1$$

$$AA = c_1 + d_1$$

Proportion of the number of constitutional unit ($A_1$)
= 100 − proportion of the number of constitutional unit ($C_1$)

Proportion of the number of constitutional unit ($C_1$)
= 100 × (EA/2 + AA)/(EE + EA + AA)

<Conversion Rate ($X_1$) of Constitutional Unit ($C_1$) Derived from Methyl Acrylate into Constitutional Unit ($B_2$) Represented by Formula (1)>(Unit: %)

In Examples in each of which ethylene-methyl acrylate copolymer and long-chain alkyl alcohol were reacted together to obtain a polymer consisting of the constitutional unit ($A_2$) derived from ethylene, the constitutional unit ($B_2$) represented by the formula (1), and the constitutional unit ($C_2$) derived from methyl acrylate, a $^{13}$C-NMR spectrum was determined for the polymer under the $^{13}$C-NMR measurement conditions and integrated values in the following ranges of $f_1$ and $g_1$ were determined therefrom. Subsequently, the conversion rate ($X_1$) of the constitutional unit ($C_1$) derived from methyl acrylate included in the ethylene-methyl acrylate copolymer into the constitutional unit ($B_2$) of the polymer (1) represented by formula (1) was calculated.

$f_1$: 50.6-51.1 ppm
$g_1$: 63.9-64.8 ppm

Conversion rate ($X_1$) = 100 × $g_1$/($f_1$ + $g_1$)

<Proportions of the Number of Constitutional Unit ($A_2$) Derived from Ethylene, Constitutional Unit ($B_2$) Represented by Formula (1), and Constitutional Unit ($C_2$) Derived from Methyl Acrylate Included in Polymer (1)> (Unit: %)

The proportions of the number of the constitutional unit ($A_2$) derived from ethylene, the constitutional unit ($B_2$) represented by the formula (1), and the constitutional unit ($C_2$) derived from methyl acrylate included in the polymer (1) were calculated by using the following formulas.

Proportion of the number of constitutional unit ($A_2$) included in polymer (1) = proportion of the number of constitutional unit ($A_1$) included in ethylene-methyl acrylate copolymer Proportion of the number of constitutional unit ($B_2$) included in polymer (1) = (proportion of the number of constitutional unit ($C_1$) included in ethylene-methyl acrylate copolymer) × conversion rate ($X_1$)/100

Proportion of the number of constitutional unit ($C_2$) included in polymer (1) = (proportion of the number of constitutional unit ($C_1$) included in ethylene-methyl acrylate copolymer) − (proportion of the number of constitutional unit ($B_2$) included in polymer (1))

The thus-determined proportion of the number of the constitutional unit ($A_2$), proportion of the number of the constitutional unit ($B_2$), and proportion of the number of the constitutional unit ($C_2$) respectively correspond to the proportion of the number of the constitutional unit (A) derived from ethylene, proportion of the number of the constitutional unit (B) represented by the above formula (1), and proportion of the number of the constitutional unit (C) represented by the above formula (1) included in a polymer (unit: %).

<Proportions of the Number of Constitutional Unit ($A_3$) Derived from Ethylene and Constitutional Unit ($B_3$) Derived from α-Olefin Included in Ethylene-α-Olefin Copolymer> (Unit: %)

Integrated values in the following ranges of $a_3$, $b_3$, $c_3$, $d_3$, $d'_3$, $e_3$, $f_3$, $g_3$, $h_3$, $i_3$, and $j_3$ were determined from a $^{13}$C-NMR spectrum acquired for ethylene-α-olefin copolymer under the above $^{13}$C-NMR measurement conditions, and the contents (proportions of the number) of eight triads (EEE, EEL, LEE, LEL, ELE, ELL, LLE, LLL) were determined by using the following formulas, and the proportions of the number of the constitutional unit ($A_3$) derived from ethylene and the constitutional unit ($B_3$) derived from α-olefin were calculated from the contents. E and L in each triad represent ethylene and α-olefin, respectively.

$a_3$: 40.6-40.1 ppm
$b_3$: 38.5-38.0 ppm
$c_3$: 36.3-35.8 ppm
$d_3$: 35.8-34.3 ppm
$d'_3$: 34.0-33.7 ppm
$e_3$: 32.4-31.8 ppm
$f_3$: 31.4-29.1 ppm
$g_3$: 27.8-26.5 ppm
$h_3$: 24.8-24.2 ppm
$i_3$: 23.0-22.5 ppm
$j_3$: 14.4-13.6 ppm $$EEE = f_3/2 - g_3/4 - (n_L - 7) \times (b_3 + c_3 + d'_3)/4$$

$$EEL + LEE = g_3 - e_3$$

$$LEL = h_3$$

$$ELE = b_3$$

$$ELL + LLE = c_3$$

$$LLL = a_3 - c_3/2 \text{ (if } a_3 - c_3/2 < 0, \text{ then } LLL = d'_3)$$

The $n_L$ represents the average number of carbon atoms of α-olefin.

Proportion of the number of constitutional unit
$(A_3)$=100×(EEE+EEL+LEE+LEL)/(EEE+EEL+
LEE+LEL+ELE+ELL+LLE+LLL)

Proportion of the number of constitutional unit
$(B_3)$=100−proportion of the number of constitutional unit $(A_3)$

[II] Content of Unreacted Compound Including Alkyl Group Having 14 or More and 30 or Less Carbon Atoms (Unit: Wt %)

A product obtained in "Production of polymer (1)" in each Example is a mixture of the polymer (1) and an unreacted compound including an alkyl group having 14 or more and 30 or less carbon atoms. The content of the unreacted compound including an alkyl group having 14 or more and 30 or less carbon atoms in the product was measured in the following manner using gas chromatography (GC). The content of the unreacted compound is a value with respect to 100 wt % of the total weight of the polymer (1) obtained and the unreacted compound.

[GC Measurement Conditions]
GC apparatus: Shimadzu GC2014
Column: DB-5MS (60 m, 0.25 mm+, 1.0 μm)
Column temperature: a column retained at 40° C. was warmed to 300° C.
at a rate of 10° C./min, and then retained at 300° C. for 40 minutes
Vaporizing chamber/detector temperature: 300° C./300° C. (FID)
Carrier gas: helium
Pressure: 220 kPa
Total flow rate: 17.0 mL/min
Column flow rate: 1.99 mL/min
Purge flow rate: 3.0 mL/min
Linear velocity: 31.8 cm/sec
Injection mode/sprit ratio: split injection/6:1
Amount of injection: 1 μL
Sample preparation method: 8 mg/mL (o-dichlorobenzene solution)

(1) Preparation of Calibration Curve
[Preparation of Solution]

Into a 9 mL vial, 5 mg of an authentic sample was weighed, and 100 mg of n-tridecane as an internal standard material was weighed therein, and 6 mL of o-dichlorobenzene as a solvent was further added and the sample was completely dissolved to afford a standard solution for preparation of a calibration curve. Two standard solutions were additionally prepared in the described manner except that the quantity of the authentic sample was changed to 25 mg or 50 mg.

[GC Measurement]

The standard solutions for preparation of a calibration curve were subjected to measurement under the GC measurement conditions described in the previous section to prepare a calibration curve in which the ordinate represented the GC area ratios between the authentic sample and the internal standard material and the abscissa represented the weight ratios between the authentic sample and the internal standard material, and the slope of the calibration curve, a, was determined.

(2) Measurement of Content of Measuring Object (Unreacted Compound Including Alkyl Group Having 14 or More and 30 or Less Carbon Atoms) in Sample (Product)
[Preparation of Solution]

Into a 9 mL vial, 50 mg of a sample and 100 mg of n-tridecane were weighed, and 6 mL of o-dichlorobenzene was further added and the sample was completely dissolved at 80° C. to afford a sample solution.

[GC Measurement]

The sample solution was subjected to measurement under the GC measurement conditions described in the previous section to determine the content of a measuring object in the sample, $P_S$, by using the following equation.

$P_S$: content of measuring object in sample (wt %)
$W_S$: weight of sample (mg)
$W_{IS}$: weight of internal standard material (IS) (mg)
$A_S$: peak area counts for measuring object
$A_{IS}$: peak area counts for internal standard material (IS)
a: slope of calibration curve for measuring object $$P_S = \frac{W_{IS} \times A_S}{W_S \times A_{IS} \times a} \times 100 \quad \text{[Formula 1]}$$

[III] Method for Evaluating Physical Properties of Polymer (1)

(1) Melting Peak Temperature, T. (Unit: ° C.), Enthalpy of Fusion Observed in Temperature Range of 10° C. or Higher and Lower than 60° C., ΔH (Unit: J/g)

In a differential scanning calorimeter (produced by TA Instruments, Inc., DSC Q100) under nitrogen atmosphere, an aluminum pan encapsulating approximately 5 mg of a sample therein was (1) retained at 150° C. for 5 minutes, and then (2) cooled from 150° C. to −50° C. at a rate of 5° C./min, and then (3) retained at −50° C. for 5 minutes, and then (4) warmed from −50° C. to 150° C. at a rate of 5° C./min. A differential scanning calorimetry curve acquired in the calorimetry of the process (4) was defined as a melting curve. The melting curve was analyzed by using a method in accordance with JIS K7121-1987 to determine the melting peak temperature, $T_m$.

A part in the temperature range of 10° C. or higher and lower than 60° C. in the melting curve was analyzed by using a method in accordance with JIS K7122-1987 to determine the enthalpy of fusion, ΔH (J/g).

(2) Ratio Defined as Formula (I), a (Unit: None)

Absolute molecular weight and intrinsic viscosity were measured for the polymer (1) and Polyethylene Standard Reference Material 1475a (produced by National Institute of Standards and Technology) through gel permeation chromatography (GPC) with an apparatus including a light scattering detector and a viscosity detector.

GPC apparatus: Tosoh HLC-8121 GPC/HT
Light scattering detector: Precision Detectors PD2040
Differential viscometer: Viscotek H502
GPC column: Tosoh GMHHR-H (S) HT×3
Concentration of sample solution: 2 mg/mL
Amount of injection: 0.3 mL
Measurement temperature: 155° C.
Dissolution conditions: 145° C. 2 hr
Mobile phase: ortho-dichlorobenzene (with 0.5 mg/mL of BHT)
Flow rate in elution: 1 mL/min
Measurement time: approx. 1 hr

[GPC Apparatus]

An HLC-8121 GPC/HT from Tosoh Corporation was used as a GPC apparatus equipped with a differential refractometer (RI). A PD2040 from Precision Detectors, Inc., as a light scattering detector (LS), was connected to the GPC apparatus. The scattering angle used in detection of light scattering was 90° C. Further, an H502 from Viscotek Corp., as a viscosity detector (VISC), was connected to the GPC apparatus. The LS and the VISC were set in a column oven of the GPC apparatus, and the LS, the RI, and the VISC were connected together in the order presented. For calibration for the LS and the VISC and correction of delay volumes between detectors, the polystyrene standard reference material Polycal TDS-PS-N (weight-average molecular weight, Mw: 104349, polydispersity: 1.04) from Malvern Instruments Limited was used with a solution concentration of 1 mg/mL. Ortho-dichlorobenzene to which dibutylhydroxytoluene in a concentration of 0.5 mg/mL had been added as a stabilizer was used for the mobile phase and the solvent. The dissolution conditions for the sample were 145° C. and 2 hours. The flow rate was 1 mL/min. Three columns of Tosoh GMHHR-H (S) HT were connected together for use as a column. The temperatures of the column, the sample injection part, and the detectors were each 155° C. The concentration of the sample solution was 2 mg/mL. The amount of the sample solution to be injected (sample loop volume) was 0.3 mL. The refractive index increment for the NIST 1475a and the sample in ortho-dichlorobenzene (dn/dc) was −0.078 mL/g. The dn/dc for the polystyrene standard reference material was 0.079 mL/g. In determining absolute molecular weight and intrinsic viscosity ([ti]) from data from the detectors, calculation was made by using the data processing software OmniSEC (version 4.7) from Malvern Instruments Limited with reference to the literature "Size Exclusion Chromatography, Springer (1999)". The refractive index increment is the change rate of the refractive index to concentration change.

$\alpha_1$ and $\alpha_0$ in the formula (I) were determined in the following manner and they were substituted into the formula (I) to determine A.

$$A = \alpha_1/\alpha_0 \tag{I}$$

$\alpha_1$ represents a value obtained by using a method including: plotting measurements in a manner such that logarithms of the absolute molecular weight of the polymer (1) were plotted on an abscissa and logarithms of the intrinsic viscosity of the polymer (1) were plotted on an ordinate; and performing least squares approximation for the logarithms of the absolute molecular weight and the logarithms of the intrinsic viscosity by using a formula (I-I) within a range of the logarithm of the weight-average molecular weight of the polymer (1) or more and the logarithm of the z-average molecular weight of the polymer (1) or less along the abscissa to derive the slope of the line representing the formula (I-I) as at:

$$\log[\eta_1] = \alpha_1 \log M_1 + \log K_1 \tag{I-I}$$

wherein $[\eta_1]$ represents the intrinsic viscosity (unit: dl/g) of the polymer, $M_1$ represents the absolute molecular weight of the polymer, and $K_1$ represents a constant.

$\alpha_0$ represents a value obtained by using a method including: plotting measurements in a manner such that logarithms of the absolute molecular weight of the Polyethylene Standard Reference Material 1475a were plotted on an abscissa and logarithms of the intrinsic viscosity of the Polyethylene Standard Reference Material 1475a were plotted on an ordinate; and performing least squares approximation for the logarithms of the absolute molecular weight and the logarithms of the intrinsic viscosity by using a formula (I-II) within a range of the logarithm of the weight-average molecular weight of the Polyethylene Standard Reference Material 1475a or more and the logarithm of the z-average molecular weight of the Polyethylene Standard Reference Material 1475a or less along the abscissa to derive the slope of the line representing the formula (I-II) as $\alpha_0$:

$$\log[\eta_0] = \alpha_0 \log M_0 + \log K_0 \tag{I-II}$$

wherein $[\eta_0]$ represents the intrinsic viscosity (unit: dl/g) of the Polyethylene Standard Reference Material 1475a, $M_0$ represents the absolute molecular weight of the Polyethylene Standard Reference Material 1475a, and $K_0$ represents a constant.

[IV] Raw Materials

<Precursor Polymer Including Constitutional Unit (A) and Constitutional Unit (C)>

A-1: Ethylene-Methyl Acrylate Copolymer

Ethylene-methyl acrylate copolymer A-1 was produced as follows.

In an autoclave reactor, ethylene and methyl acrylate were copolymerized with tert-butyl peroxypivalate as a radical polymerization initiator at a reaction temperature of 195° C. under a reaction pressure of 160 MPa to afford ethylene-methyl acrylate copolymer A-1. The composition and MFR of the copolymer A-1 obtained were as follows.

Proportion of the number of constitutional unit derived from ethylene: 87.1% (68.8 wt %)

Proportion of the number of constitutional unit derived from methyl acrylate: 12.9% (31.2 wt %)

MFR (measured at 190° C., 21 N): 40.5 g/10 min.

<Compound Including Alkyl Group Having 14 or More and 30 or Less Carbon Atoms>

B-1: KALCOL 220-80 (mixture of n-docosyl alcohol, n-eicosyl alcohol, and n-octadecyl alcohol) [produced by Kao Corporation]

B-2: n-Octadecyl methacrylate [produced by Tokyo Chemical Industry Co., Ltd.]

<Catalyst>

C-1: Tetra(n-octadecyl) orthotitanate [produced by Matsumoto Fine Chemical Co. Ltd.]

<Polypropylene>

D-1: SUMITOMO NOBLEN D101 (propylene homopolymer) [produced by Sumitomo Chemical Company, Limited]

D-2: SUMITOMO NOBLEN U501E1 (propylene homopolymer) [produced by Sumitomo Chemical Company, Limited]

<Organic Peroxide and Azo Compound>

E-1: Kayahexa AD-40C (mixture containing 2,5-dimethyl-2,5-di(tert-butylperoxy)hexane, calcium carbonate, and amorphous silicon dioxide) (1-minute half-life temperature: 180° C.) [produced by Kayaku Akzo Corporation]

E-2: YP-50S (mixture containing 2,5-dimethyl-2,5-di(tert-butylperoxy)hexyne-3, amorphous silicon dioxide, amorphous silica, and liquid paraffin) (1-minute half-life temperature: 180° C.)[produced by Kayaku Akzo Corporation]

E-3: Azobisisobutyronitrile (10-hour half-life temperature: 65° C.) [produced by Tokyo Chemical Industry Co., Ltd.]

<Crosslinking Aid>

F-1: Hi-Cross MS50 (mixture of trimethylolpropane trimethacrylate and amorphous silicon dioxide) [produced by Seiko Chemical Co., Ltd.]

<Antioxidant>

G-1: IRGANOX 1010 (pentaerythritol=tetrakis[3-(3',5'-di-tert-butyl-4'-hydroxyphenyl)propionate]) [produced by BASF SE]

<Processing Heat Stabilizer>

H-1: IRGAFOS 168 (tris(2,4-di-tert-butylphenyl)phosphite) [produced by BASF SE]

<Thermally Conductive Material>
I-1: CB150 (scale graphite) [produced by NIPPON GRAPHITE INDUSTRIES, LTD.]
I-2: PT110 (boron nitride) [Produced by Momentive Performance Materials Inc.]
I-3: RF-10C-AC (magnesium oxide) [produced by Ube Material Industries, Ltd.]
<Extruder>
Twin-Screw Extruder (1)
    Barrel diameter D=75 mm
    Screw effective length L/barrel diameter D=40
Twin-Screw Extruder (2)
    Barrel diameter D=15 mm
    Screw effective length L/barrel diameter D=45

Reference Example 1

(1) Production of Polymer Consisting of Constitutional Unit (A), Constitutional Unit (B), and Constitutional Unit (C) (Ethylene-n-Docosyl Acrylate-n-Eicosyl Acrylate-n-Octadecyl Acrylate-Methyl Acrylate Copolymer)

The inside of a reactor equipped with a stirrer was purged with nitrogen, and then A-1:100 parts by weight, B-1: 97.4 parts by weight, and C-1: 2.1 parts by weight were added, and heated and stirred with the jacket temperature set at 140° C. under a reduced pressure of 1 kPa for 12 hours to afford a polymer (cf1) (ethylene-n-docosyl acrylate-n-eicosyl acrylate-n-octadecyl acrylate-methyl acrylate copolymer). Physical property values and evaluation results for the polymer (cf1) are shown in Table 1.

Reference Example 2

(1) Preparation of Crosslinked Resin Composition (Crosslinked Resin Composition Containing Ethylene-n-Docosyl Acrylate-n-Eicosyl Acrylate-n-Octadecyl Acrylate-Methyl Acrylate Copolymer and Polypropylene)

The polymer (cf1) obtained in Reference Example 1(1): 80 parts by weight, D-1: 20 parts by weight, E-1: 1.0 part by weight, F-1: 1.0 part by weight, G-1: 0.1 parts by weight, and H-1: 0.1 parts by weight were extruded by using the twin-screw extruder (1) with a screw rotation frequency of 350 rpm, discharge rate of 200 kg/hr, first-half barrel temperature of 200° C., second-half barrel temperature of 220° C., and die temperature of 200° C. to prepare a crosslinked resin composition (cf2).

Reference Example 3

(1) Production of Polymer Consisting of Constitutional Unit (A) and Constitutional Unit (B) (Ethylene-α-Olefin Copolymer)

An autoclave having an inner volume of 5 L and equipped with a stirrer was dried under reduced pressure and the inside was then purged with nitrogen, into which 1.4 L of toluene solution containing 706 g of α-olefin C2024 (mixture of $C_{18}$, $C_{20}$, $C_{22}$, $C_{24}$, and $C_{26}$ olefins, produced by INEOS) was added, and then toluene was added thereto to a liquid volume of 3 L. The autoclave was warmed to 60° C., and ethylene was then added until the partial pressure reached 0.1 MPa to stabilize the inside of the system. Hexane solution of triisobutylaluminum (0.34 mol/L, 14.7 ml) was loaded therein. Subsequently, toluene solution of dimethylanilinium tetrakis(pentafluorophenyl)borate (1.0 mmol/13.4 mL) and toluene solution of diphenylmethylene (cyclopentadienyl)(fluorenyl)zirconium dichloride (0.2 mmol/L, 7.5 mL) were loaded therein to initiate polymerization, and ethylene gas was fed to keep the total pressure constant.

After the lapse of 3 hours, 2 ml of ethanol was added to terminate the polymerization. After the termination of the polymerization, the polymer-containing toluene solution was added into acetone to precipitate an ethylene-α-olefin copolymer (cf3), which was subjected to filtration, and the separated polymer (cf3) was further washed twice with acetone.

The resulting polymer (cf3) was vacuum-dried at 80° C. to afford 369 g of the polymer (cf3). Physical property values and evaluation results for the polymer (cf3) are shown in Table 1.

Reference Example 4

(1) Preparation of Crosslinked Resin Composition (Crosslinked Resin Composition Containing Ethylene-α-Olefin Copolymer and Polypropylene Homopolymer)

The polymer (cf3) obtained in Reference Example 3(1): 80 parts by weight, D-1: 20 parts by weight, E-2: 0.5 parts by weight, F-1: 0.75 parts by weight, and G-1: 0.1 parts by weight were extruded by using the twin-screw extruder (2) with a screw rotation frequency of 150 rpm, discharge rate of 1.8 kg/hr, first-half barrel temperature of 180° C., second-half barrel temperature of 220° C., and die temperature of 200° C. to prepare a crosslinked resin composition (cf4).

Reference Example 5

(1) Production of Polymer Consisting of Constitutional Unit (B) (n-Octadecyl Methacrylate Homopolymer)

A flask having an inner volume of 300 mL was dried under reduced pressure and the inside was then purged with nitrogen, into which B-2: 126.7 g was added, and heated and stirred with the inner temperature set at 50° C. to completely dissolve B-2. Subsequently, E-3: 307.3 mg was added thereto, and the resultant was heated and stirred with the inner temperature set at 80° C. for 80 minutes, and the product was washed with 1000 mL of ethanol and vacuum-dried at 120° C. to afford a polymer (cf5) (n-octadecyl methacrylate homopolymer). Physical property values and evaluation results for the polymer (cf5) are shown in Table 1.

Reference Example 6

(1) Preparation of Resin Composition (Resin Composition Containing n-Octadecyl Methacrylate Homopolymer and Polypropylene Homopolymer)

The resin composition (cf5) obtained in Reference Example 5(1): 80 parts by weight and D-2: 20 parts by weight were kneaded together by using a LABO PLASTO-MILL (produced by Toyo Seiki Seisaku-sho, Ltd., model: 65C150) under nitrogen atmosphere with a rotational frequency of 80 rpm and a chamber temperature of 200° C. for 5 minutes to prepare a resin composition (cf6).

[V] System of Device Experiment

FIG. 1 shows a schematic diagram of the system of an experiment.

<Base 5>

A plate of STYROFOAM IB (produced by Dow Kakoh K.K., specific gravity=26 kg/m³, thermal conductivity=0.04 W/mK or lower) was cut to prepare four pieces of a 20×10×10 mm cuboid as bases 5.

<Housing Base Material 4>

A commercially available polycarbonate sheet (thickness: 0.8 mm) was cut into a 50 mm×50 mm square for use as a housing base material 4. The four bases 5 were attached with double-sided tape at the four corners of the housing base material 4.

<Substrate 3>

A laminate of a commercially available copper foil 3a (thickness: 35 μm) and a Bakelite sheet 3b (total thickness: 0.9 mm) was cut into a 50 mm×50 mm square for use as a substrate 3. The surface of the substrate 3b (Bakelite) and the housing base material 4 were fixed together with a spray adhesive 77 (produced by 3M Japan Limited) in a manner such that the center of the substrate 3 was positioned at the center of the housing base material 4.

<Heat-Generating Object 2>

An SIC Schottky diode (C3D02060A, produced by CREE, Inc.) was used as a heat-generating object 2. The heat-generating object 2 and the surface of the substrate 3a (copper foil) were fixed together with thermally conductive curable silicone (SCV-22, thermal conductivity: 0.92 W/m·K, produced by Sunhayato Corp.) in a manner such that the center of the heat-generating object 2 was positioned at the center of the substrate 3. To measure the temperature of the heat-generating object 2, the upper surface of the heat-generating object 2 was partially shaved, and a thermocouple was fixed thereto with the thermally conductive curable silicone.

<Test Piece 1>

Laminates obtained in Examples 1 to 6 and Comparative Examples 1 and 2, which are described later, were each used as a test piece 1. The test piece 1 and the heat-generating object 2 were closely adhered together with thermally conductive grease silicone (SCH-20, thermal conductivity: 0.84 W/m·K, produced by Sunhayato Corp.) in a manner such that the center of the test piece 1 was positioned at the center of the heat-generating object 2.

<Test Conditions>

A test was conducted in an environment kept at 23° C. and 45% RH. A constant electric current was applied to the diode of the heat-generating object 2 by using a DC stabilized power supply (AD-8723D, produced by A&D Company, Limited) in accordance with the following Steps 1 to 3, and the temperature of the heat-generating object 2 was measured. The heat generation-suppressing effect of the test piece 1 on the heat-generating object 2 was evaluated on the basis of the temperature of the heat-generating object 2, 3 minutes after the initiation of Step 3 ($T_{180}$).

(Step 1)

Apply a constant electric current of 1.63 A to the heat-generating object 2 with a temperature of 24±0.5° C. and continue the application for 10 minutes.

(Step 2)

Suspend the application of the constant electric current for natural air cooling until the temperature of the heat-generating object 2 reaches 24±0.5° C.

(Step 3)

Apply a constant electric current of 1.63 A to the heat-generating object 2 with a temperature of 24±0.5° C. and continue the application for 10 minutes.

Example 1

(1) Preparation of Resin Composition

The crosslinked resin composition (cf2) obtained in Reference Example 2(1): 80 parts by weight and I-1: 20 parts by weight were kneaded together by using a LABO PLASTO-MILL (produced by Toyo Seiki Seisaku-sho, Ltd., model: 65C150) under nitrogen atmosphere with a rotational frequency of 80 rpm and a chamber temperature of 180° C. for 5 minutes to prepare a resin composition (ex1-1). The formulation for kneading is shown in Table 2.

(2) Preparation of Resin Composition Sheet

The resin composition (ex1-1) obtained in Example 1(1) was subjected to compression molding by using a mold with a thickness of 0.5 mm at 210° C. for 5 minutes, and then cooled while being compressed at 20° C. for 5 minutes to prepare a resin composition sheet (ex1-2) of 50 mm×50 mm.

(3) Preparation of Laminate

A graphite sheet (EYGA121807, produced by Panasonic Corporation) consisting of a resin release layer, a pressure-sensitive adhesive layer and a graphite layer was removed of the resin release layer, and the pressure-sensitive adhesive layer exposed on the surface and the resin composition sheet (ex1-2) obtained in Example 1(2) were pasted together, and excessive portions of the graphite sheet were cut out to prepare a laminate (ex1-3) of 50 mm×50 mm.

(4) Device Experiment

Measurement was performed under <Test conditions> by using the laminate (ex1-3) prepared in Example 1(3) as <Test piece 1> for the above system of the device experiment. The temperature of the heat-generating object 2, 3 minutes after the initiation of Step 3 is shown in Table 3.

Example 2

(1) Preparation of Resin Composition

A resin composition (ex2-1) was prepared in the same manner as in Example 1(1) except that I-1 was replaced with 1-2. The formulation for kneading is shown in Table 2.

(2) Preparation of Resin Composition Sheet

A resin composition sheet (ex2-2) of 50 mm×50 mm was prepared in the same manner as in Example 1(2) except that the resin composition (ex1-1) obtained in Example 1(1) was replaced with the resin composition (ex2-1) obtained in Example 2(1).

(3) Preparation of Laminate

A laminate (ex2-3) of 50 mm×50 mm was prepared in the same manner as in Example 1(3) except that the resin composition sheet (ex1-2) obtained in Example 1(2) was replaced with the resin composition sheet (ex2-2) obtained in Example 2(2).

(4) Device Experiment

Measurement was performed in the same manner as in Example 1(4) except that the laminate (ex1-3) obtained in Example 1(3) was replaced with the laminate (ex2-3) obtained in Example 2(3). The temperature of the heat-generating object 2, 3 minutes after the initiation of Step 3 is shown in Table 3.

Example 3

(1) Preparation of Resin Composition

A resin composition (ex3-1) was prepared in the same manner as in Example 1(1) except that I-1 was replaced with 1-3. The formulation for kneading is shown in Table 2.

(2) Preparation of Resin Composition Sheet

A resin composition sheet (ex3-2) of 50 mm×50 mm was prepared in the same manner as in Example 1(2) except that the resin composition (ex1-1) obtained in Example 1(1) was replaced with the resin composition (ex3-1) obtained in Example 3(1).

(3) Preparation of Laminate

A laminate (ex3-3) of 50 mm×50 mm was prepared in the same manner as in Example 1(3) except that the resin composition sheet (ex1-2) obtained in Example 1(2) was replaced with the resin composition sheet (ex3-2) obtained in Example 3(2).

(4) Device Experiment

Measurement was performed in the same manner as in Example 1(4) except that the laminate (ex1-3) obtained in Example 1(3) was replaced with the laminate (ex3-3) obtained in Example 3(3). The temperature of the heat-generating object 2, 3 minutes after the initiation of Step 3 is shown in Table 3.

Example 4

(1) Preparation of Resin Composition

A resin composition (ex4-1) was prepared in the same manner as in Example 2(1) except that the crosslinked resin composition (cf2) obtained in Reference Example 2(1): 80 parts by weight was replaced with the crosslinked resin composition (cf2) obtained in Reference Example 2(1): 60 parts by weight, and I-2: 20 parts by weight was replaced with I-2: 40 parts by weight. The formulation for kneading is shown in Table 2.

(2) Preparation of Resin Composition Sheet

A resin composition sheet (ex4-2) of 50 mm×50 mm was prepared in the same manner as in Example 1(2) except that the resin composition (ex1-1) obtained in Example 1(1) was replaced with the resin composition (ex4-1) obtained in Example 4(1).

(3) Preparation of Laminate

A laminate (ex4-3) of 50 mm×50 mm was prepared in the same manner as in Example 1(3) except that the resin composition sheet (ex1-2) obtained in Example 1(2) was replaced with the resin composition sheet (ex4-2) obtained in Example 4(2).

(4) Device Experiment

Measurement was performed in the same manner as in Example 1(4) except that the laminate (ex1-3) obtained in Example 1(3) was replaced with the laminate (ex4-3) obtained in Example 4(3). The temperature of the heat-generating object 2, 3 minutes after the initiation of Step 3 is shown in Table 3.

Example 5

(1) Preparation of Resin Composition

A resin composition (ex5-1) was prepared in the same manner as in Example 2(1) except that the crosslinked resin composition (cf2) obtained in Reference Example 2(1) was replaced with the crosslinked resin composition (cf4) obtained in Reference Example 4(1). The formulation for kneading is shown in Table 2.

(2) Preparation of Resin Composition Sheet

A resin composition sheet (ex5-2) of 50 mm×50 mm was prepared in the same manner as in Example 1(2) except that the resin composition (ex1-1) obtained in Example 1(1) was replaced with the resin composition (ex5-1) obtained in Example 5(1).

(3) Preparation of Laminate

A laminate (ex5-3) of 50 mm×50 mm was prepared in the same manner as in Example 1(3) except that the resin composition sheet (ex1-2) obtained in Example 1(2) was replaced with the resin composition sheet (ex5-2) obtained in Example 5(2).

(4) Device Experiment

Measurement was performed in the same manner as in Example 1(4) except that the laminate (ex1-3) obtained in Example 1(3) was replaced with the laminate (ex5-3) obtained in Example 5(3). The temperature of the heat-generating object 2, 3 minutes after the initiation of Step 3 is shown in Table 3.

Example 6

(1) Preparation of Resin Composition

A resin composition (ex6-1) was prepared in the same manner as in Example 2(1) except that the crosslinked resin composition (cf2) obtained in Reference Example 2(1) was replaced with the resin composition (cf6) obtained in Reference Example 6(1). The formulation for kneading is shown in Table 2.

(2) Preparation of Resin Composition Sheet

A resin composition sheet (ex6-2) of 50 mm×50 mm was prepared in the same manner as in Example 1(2) except that the resin composition (ex1-1) obtained in Example 1(1) was replaced with the resin composition (ex6-1) obtained in Example 6(1).

(3) Preparation of Laminate

A laminate (ex6-3) of 50 mm×50 mm was prepared in the same manner as in Example 1(3) except that the resin composition sheet (ex1-2) obtained in Example 1(2) was replaced with the resin composition sheet (ex6-2) obtained in Example 6(2).

(4) Device Experiment

Measurement was performed in the same manner as in Example 1(4) except that the laminate (ex1-3) obtained in Example 1(3) was replaced with the laminate (ex6-3) obtained in Example 6(3). The temperature of the heat-generating object 2, 3 minutes after the initiation of Step 3 is shown in Table 3.

Comparative Example 1

(3) Preparation of Laminate

A laminate (re1-3) of 50 mm×50 mm consisting of a pressure-sensitive adhesive layer and a graphite layer was prepared in the same manner as in Example 1(3) except that the resin composition sheet (ex1-2) obtained in Example 1(2) was not pasted.

(4) Device Experiment

Measurement was performed in the same manner as in Example 1(4) except that the laminate (ex1-3) obtained in Example 1(3) was replaced with the laminate (re1-3) obtained in Comparative Example 1(3). The temperature of the heat-generating object 2, 3 minutes after the initiation of Step 3 is shown in Table 3.

Comparative Example 2

(1) Preparation of Resin Composition

A resin composition (re2-1) was prepared in the same manner as in Example 2(1) except that the crosslinked resin composition (cf2) obtained in Reference Example 2(1) was replaced with polypropylene (D-1) and the chamber temperature was changed from 180° C. to 200° C. The formulation for kneading is shown in Table 2.

(2) Preparation of Resin Composition Sheet

A resin composition sheet (re2-2) of 50 mm×50 mm was prepared in the same manner as in Example 1(2) except that the resin composition (ex1-1) obtained in Example 1(1) was replaced with the resin composition (re2-1) obtained in Comparative Example 2(1).

(3) Preparation of Laminate

A laminate (re2-3) of 50 mm×50 mm was prepared in the same manner as in Example 1(3) except that the resin composition sheet (ex1-2) obtained in Example 1(2) was replaced with the resin composition sheet (re2-2) obtained in Comparative Example 2(2).

(4) Device Experiment

Measurement was performed in the same manner as in Example 1(4) except that the laminate (ex1-3) obtained in Example 1(3) was replaced with the laminate (re2-3) obtained in Comparative Example 2(3). The temperature of the heat-generating object 2, 3 minutes after the initiation of Step 3 is shown in Table 3.

TABLE 1

|  |  | Polymer | | |
| --- | --- | --- | --- | --- |
|  |  | Reference Example 1 | Reference Example 3 | Reference Example 5 |
| Constitutional unit (A) | % | 87.1 | 84.6 | 0.0 |
| Constitutional unit (B) | % | 10.9 | 15.4 | 100.0 |
| Constitutional unit (C) | % | 2.0 | 0 | 0 |
| Content of unreacted compound including alkyl group having 14 or more and 30 or less carbon atoms | wt % | 1.2 | — | — |
| Melting peak temperature, $T_m$ | ° C. | 51 | 34 | 35 |
| Enthalpy of fusion, $\Delta H$ (10 to 60° C.) | J/g | 92 | 83 | 69 |
| Number-average molecular weight, Mn | g/mol | 45,000 | 214,000 | 209,000 |
| Weight-average molecular weight, Mw | g/mol | 302,000 | 387,000 | 2,154,000 |
| z-Average molecular weight, Mz | g/mol | 1,856,000 | 672,000 | 12,531,000 |
| Ratio defined by formula (I), A |  | 0.65 | 0.94 | 0.58 |

TABLE 2

|  | Example 1 (ex1-1) | Example 2 (ex2-1) | Example 3 (ex3-1) | Example 4 (ex4-1) | Example 5 (ex5-1) | Example 6 (ex6-1) | Comparative Example 2 (re2-1) |
| --- | --- | --- | --- | --- | --- | --- | --- |
| Reference Example 2 (cf2) | 80 | 80 | 80 | 60 |  |  |  |
| Reference Example 4 (cf4) |  |  |  |  | 80 |  |  |
| Reference Example 6 (ct6) |  |  |  |  |  | 80 |  |
| Polypropylene (D-1) |  |  |  |  |  |  | 80 |
| Thermally conductive material (I-1) | 20 |  |  |  |  |  |  |
| Thermally conductive material (I-2) |  | 20 |  | 40 | 20 | 20 | 20 |
| Thermally conductive material (I-3) |  |  | 20 |  |  |  |  |

TABLE 3

|  |  | Example 1 | Example 2 | Example 3 | Example 4 | Example 5 | Example 6 | Comparative Example 1 | Comparative Example 2 |
| --- | --- | --- | --- | --- | --- | --- | --- | --- | --- |
| Temperature of heat-generating object 2, 3 minutes after initiation of Step 3, $T_{180}$ | ° C. | 58 | 57 | 55 | 57 | 59 | 60 | 68 | 62 |

REFERENCE SIGNS LIST

1 test piece
2 heat-generating object
3a substrate (copper foil)
3b substrate (Bakelite)
4 housing base material
5 base

The invention claimed is:

1. A resin composition comprising:
   a crosslinked polymer (1) whose enthalpy of fusion observed within a temperature range of 10° C. or higher and lower than 60° C. in differential scanning calorimetry is 30 J/g or more;
   a polymer (2) whose melting peak temperature or glass transition temperature observed in differential scanning calorimetry is 50° C. or higher and 180° C. or lower, provided that the polymer (2) is different from the polymer (1), and
   a thermally conductive material (3) whose thermal conductivity is 1 W/(m·K) or higher, wherein
   a content of the crosslinked polymer (1) is 30 wt % or more and 99 wt % or less and a content of the polymer (2) is 1 wt % or more and 70 wt % or less, with respect to 100 wt % of the total amount of the crosslinked polymer (1) and the polymer (2) and a content of the thermally conductive material (3) is 5 parts by weight or more and 80 parts by weight or less, with respect to 100 parts by weight of the total amount of polymer components contained in the resin composition.

2. The resin composition according to claim 1, wherein the polymer (1) is a polymer comprising a constitutional unit (B) represented by the following formula (1):

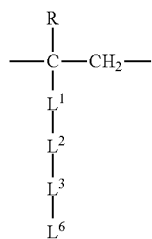

formula (1)

wherein

R represents a hydrogen atom or a methyl group;

$L^1$ represents a single bond, —CO—O—, —O—CO—, or —O—;

$L^2$ represents a single bond, —CH$_2$—, —CH$_2$—CH$_2$—, —CH$_2$—CH$_2$—CH$_2$—, —CH$_2$—CH(OH)—CH$_2$—, or —CH$_2$—CH(CH$_2$OH)—;

$L^3$ represents a single bond, —CO—O—, —O—CO—, —O—, —CO—NH—, —NH—CO—, —CO—NH—CO—, —NH—CO—NH—, —NH—, or —N(CH$_3$)—;

$L^6$ represents an alkyl group having 14 or more and 30 or less carbon atoms; and a left side and a right side of each of the horizontal chemical formulas for describing chemical structures of $L^1$, $L^2$, and $L^3$ correspond to an upper side of the formula (1) and a lower side of the formula (1), respectively.

3. The resin composition according to claim 1, wherein the polymer (1) comprises a constitutional unit (A) derived from ethylene and a constitutional unit (B) represented by the following formula (1), and optionally comprises at least one constitutional unit (C) selected from the group consisting of a constitutional unit represented by the following formula (2) and a constitutional unit represented by the following formula (3);

a proportion of the number of the constitutional unit (A) is 70% or more and 99% or less and a proportion of the number of the constitutional unit (B) and the constitutional unit (C) in total is 1% or more and 30% or less, with respect to 100% of the total number of the constitutional unit (A), the constitutional unit (B) and the constitutional unit (C); and a proportion of the number of the constitutional unit (B) is 1% or more and 100% or less and a proportion of the number of the constitutional unit (C) is 0% or more and 99% or less, with respect to 100% of the total number of the constitutional unit (B) and the constitutional unit (C):

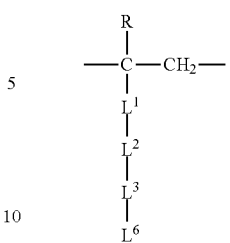

formula (1)

wherein

R represents a hydrogen atom or a methyl group;

$L^1$ represents a single bond, —CO—O—, —O—CO—, or —O—;

$L^2$ represents a single bond, —CH$_2$—, —CH$_2$—CH$_2$—, —CH$_2$—CH$_2$—CH$_2$—, —CH$_2$—CH(OH)—CH$_2$—, or —CH$_2$—CH(CH$_2$OH)—;

$L^3$ represents a single bond, —CO—O—, —O—CO—, —O—, —CO—NH—, —NH—CO—, —CO—NH—CO—, —NH—CO—NH—, —NH—, or —N(CH$_3$)—;

$L^6$ represents an alkyl group having 14 or more and 30 or less carbon atoms; and a left side and a right side of each of the horizontal chemical formulas for describing chemical structures of $L^1$, $L^2$, and $L^3$ correspond to an upper side of the formula (1) and a lower side of the formula (1), respectively,

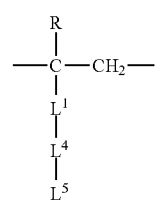

formula (2)

wherein

R represents a hydrogen atom or a methyl group;

$L^1$ represents a single bond, —CO—O—, —O—CO—, or —O—;

$L^4$ represents an alkylene group having one or more and eight or less carbon atoms;

$L^5$ represents a hydrogen atom, an epoxy group, —CH(OH)—CH$_2$OH, a carboxy group, a hydroxy group, an amino group, or an alkylamino group having one or more and four or less carbon atoms; and a left side and a right side of each of the horizontal chemical formulas for describing a chemical structure of $L^1$ correspond to an upper side of the formula (2) and a lower side of the formula (2), respectively,

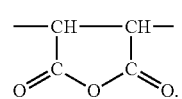

formula (3)

4. The resin composition according to claim 3, wherein a proportion of the number of the constitutional unit (A), the constitutional unit (B) and the constitutional unit (C) in total in the polymer is 90% or more, with respect to 100% of the total number of all constitutional units contained in the polymer (1).

5. The resin composition according to claim 1, wherein a ratio defined for the polymer (1) as the following formula (I), A, is 0.95 or lower:

$$A = \alpha_1 / \alpha_0 \quad (I)$$

wherein $\alpha_1$ represents a value obtained by using a method comprising: measuring an absolute molecular weight and an intrinsic viscosity of a polymer by using gel permeation chromatography with an apparatus equipped with a light scattering detector and a viscosity detector; plotting measurements in such a manner that logarithms of the absolute molecular weight are plotted on an abscissa and logarithms of the intrinsic viscosity are plotted on an ordinate; and performing least squares approximation for the logarithms of the absolute molecular weight and the logarithms of the intrinsic viscosity by using the formula (I-I) within a range of not less than a logarithm of a weight-average molecular weight of the polymer and not more than a logarithm of a z-average molecular weight of the polymer along the abscissa to derive a slope of a line representing the formula (I-I) as $\alpha_1$:

$$\log[\eta_1] = \alpha_1 \log M_1 + \log K_1 \quad (I\text{-}I)$$

wherein $[\eta_1]$ represents an intrinsic viscosity (unit: dl/g) of the polymer, $M_1$ represents an absolute molecular weight of the polymer, and $K_1$ represents a constant; and $\alpha_0$ represents a value obtained by using a method comprising: measuring an absolute molecular weight and an intrinsic viscosity of Polyethylene Standard Reference Material 1475a produced by National Institute of Standards and Technology by using gel permeation chromatography with an apparatus equipped with a light scattering detector and a viscosity detector; plotting measurements in such a manner that logarithms of the absolute molecular weight are plotted on an abscissa and logarithms of the intrinsic viscosity are plotted on an ordinate; and performing least squares approximation for the logarithms of the absolute molecular weight and the logarithms of the intrinsic viscosity by using the formula (I-II) within a range of not less than a logarithm of a weight-average molecular weight of the Polyethylene Standard Reference Material 1475a and not more than a logarithm of a z-average molecular weight of the Polyethylene Standard Reference Material 1475a along the abscissa to derive a slope of a line representing the formula (I-II) as $\alpha_0$:

$$\log[\eta_0] = \alpha_0 \log M_0 + \log K_0 \quad (I\text{-}II)$$

wherein $[\eta_0]$ represents an intrinsic viscosity (unit: dl/g) of the Polyethylene Standard Reference Material 1475a, $M_0$ represents an absolute molecular weight of the Polyethylene Standard Reference Material 1475a, and $K_0$ represents a constant, provided that in the measurement of the absolute molecular weight and the intrinsic viscosity of each of the polymer and the Polyethylene Standard Reference Material 1475a by using gel permeation chromatography, a mobile phase is ortho-dichlorobenzene and the measurement temperature is 155° C.

6. The resin composition according to claim 1, wherein a gel fraction is 20 wt % or more, with respect to 100 wt % of a weight of the resin composition.

7. The resin composition according to claim 1, wherein the thermally conductive material (3) is graphite.

8. A molded article comprising the resin composition according to claim 1.

9. A laminate comprising:
a heat storage layer (1) comprising the resin composition according to claim 1; and
a thermally conductive layer (2) containing a thermally conductive material (3) whose thermal conductivity is 1 W/(m·K) or higher in an amount of 90 wt % or more, with respect to 100 wt % of the total weight of the thermally conductive layer (2).

10. The resin composition according to claim 1, wherein the thermally conductive material (3) is at least one material selected from the group consisting of metals, low-melting point alloys, metal nitrides, metal carbides, metal carbonates, metal hydroxides, carbon materials, potassium titanate, talc, wollastonite, aluminum oxide, magnesium oxide, beryllium oxide, copper oxide, and copper suboxide.

* * * * *